US012765179B2

(12) United States Patent
Eguchi et al.

(10) Patent No.: US 12,765,179 B2
(45) Date of Patent: Oct. 13, 2026

(54) DISPLAY APPARATUS

(71) Applicant: Semiconductor Energy Laboratory Co., Ltd., Atsugi (JP)

(72) Inventors: Shingo Eguchi, Atsugi (JP); Kenichi Okazaki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 445 days.

(21) Appl. No.: 18/280,516

(22) PCT Filed: Mar. 9, 2022

(86) PCT No.: PCT/IB2022/052072
§ 371 (c)(1),
(2) Date: Sep. 6, 2023

(87) PCT Pub. No.: WO2022/200896
PCT Pub. Date: Sep. 29, 2022

(65) Prior Publication Data

US 2024/0155882 A1 May 9, 2024

(30) Foreign Application Priority Data

Mar. 25, 2021 (JP) ................................ 2021-051290

(51) Int. Cl.
*H10K 59/122* (2023.01)
*H10K 59/124* (2023.01)
*H10K 59/80* (2023.01)

(52) U.S. Cl.
CPC ......... *H10K 59/122* (2023.02); *H10K 59/124* (2023.02); *H10K 59/80524* (2023.02);
(Continued)

(58) Field of Classification Search
CPC ............... H10K 59/122; H10K 59/124; H10K 59/80524; H10K 59/8722; H10K 59/873; H10K 59/8051; H10K 59/871
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 102117825 A 7/2011
CN 103489890 A 1/2014
(Continued)

OTHER PUBLICATIONS

Taiwanese Office Action (Application No. 111108839), dated Nov. 20, 2025.

(Continued)

*Primary Examiner* — Fatima N Farokhrooz
(74) *Attorney, Agent, or Firm* — Eric J. Robinson; Robinson Intellectual Property Law Office, P.C.

(57) ABSTRACT

A display apparatus capable of see-through display is provided. The display apparatus includes a first region including a first light-emitting element, a second region including a second light-emitting element, and an insulating layer provided continuously across a third region that transmits external light. The first light-emitting element includes a first pixel electrode, a first organic layer, and a common electrode. The second light-emitting element includes a second pixel electrode, a second organic layer, and the common electrode. In each of the first organic layer and the second organic layer, an angle between a bottom surface and a side surface is greater than or equal to 60° and less than or equal to 120° in a cross sectional view. The insulating layer includes a portion overlapping with the first organic layer
(Continued)

with the common electrode therebetween, a portion overlapping with the second organic layer with the common electrode therebetween, a portion in the third region, and has a light-transmitting property.

16 Claims, 23 Drawing Sheets

(52) U.S. Cl.
CPC ....... *H10K 59/873* (2023.02); *H10K 59/8051* (2023.02); *H10K 59/871* (2023.02); *H10K 59/8722* (2023.02)

(56) References Cited

U.S. PATENT DOCUMENTS

| | | | | |
|---|---|---|---|---|
| 8,638,030 | B2 | 1/2014 | Lee et al. | |
| 8,994,010 | B2 | 3/2015 | Choi et al. | |
| 9,263,711 | B2 | 2/2016 | Choi et al. | |
| 9,865,668 | B2 | 1/2018 | Sato | |
| 10,566,404 | B2 | 2/2020 | Sato | |
| 10,651,259 | B2 | 5/2020 | Sato | |
| 11,031,440 | B2 | 6/2021 | Kim et al. | |
| 11,296,172 | B2 | 4/2022 | Sato | |
| 2002/0072139 | A1 | 6/2002 | Kashiwabara | |
| 2011/0148290 | A1 | 6/2011 | Oota | |
| 2011/0163661 | A1 | 7/2011 | Lee et al. | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2013/0328022 | A1 | 12/2013 | Choi et al. | |
| 2014/0004640 | A1 | 1/2014 | Hamaguchi et al. | |
| 2014/0004642 | A1 | 1/2014 | Otsuka et al. | |
| 2014/0183472 | A1* | 7/2014 | Kim | H10K 59/124 438/34 |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0111487 | A1 | 4/2016 | Jeong et al. | |
| 2016/0172595 | A1 | 6/2016 | Malinowski et al. | |
| 2016/0315133 | A1 | 10/2016 | Sato | |
| 2017/0125744 | A1 | 5/2017 | Kim et al. | |
| 2017/0141167 | A1 | 5/2017 | Naganuma | |
| 2017/0256754 | A1 | 9/2017 | Defranco et al. | |
| 2018/0190908 | A1 | 7/2018 | Ke et al. | |
| 2020/0057330 | A1 | 2/2020 | Yamazaki et al. | |
| 2020/0203662 | A1 | 6/2020 | Mollard et al. | |
| 2020/0273926 | A1 | 8/2020 | Lee | |
| 2021/0183971 | A1* | 6/2021 | Kim | H10K 59/122 |
| 2022/0130918 | A1 | 4/2022 | Yamazaki et al. | |
| 2022/0223667 | A1* | 7/2022 | Choi | H10K 59/122 |

FOREIGN PATENT DOCUMENTS

| | | | | | |
|---|---|---|---|---|---|
| CN | 104425559 | A | * | 3/2015 | H10K 59/1201 |
| CN | 104885250 | A | | 9/2015 | |
| CN | 105529351 | A | | 4/2016 | |
| CN | 106067473 | A | | 11/2016 | |
| CN | 107039597 | A | | 8/2017 | |
| CN | 111584542 | A | | 8/2020 | |
| CN | 211238258 | U | * | 8/2020 | |
| CN | 111613643 | A | | 9/2020 | |
| EP | 2341544 | A | | 7/2011 | |
| EP | 2674977 | A | | 12/2013 | |
| EP | 2939290 | A | | 11/2015 | |
| EP | 3163623 | A | | 5/2017 | |
| EP | 3916796 | A | | 12/2021 | |
| JP | 2000-036385 | A | | 2/2000 | |
| JP | 2003-059663 | A | | 2/2003 | |
| JP | 2008-098106 | A | | 4/2008 | |
| JP | 2008-147072 | A | | 6/2008 | |
| JP | 2008-251270 | A | | 10/2008 | |
| JP | 2011-142289 | A | | 7/2011 | |
| JP | 2013-258144 | A | | 12/2013 | |
| JP | 2014-120218 | A | | 6/2014 | |
| JP | 2014-135251 | A | | 7/2014 | |
| JP | 2014-232568 | A | | 12/2014 | |
| JP | 2015-115178 | A | | 6/2015 | |
| JP | 2016-197494 | A | | 11/2016 | |
| JP | 2016-207486 | A | | 12/2016 | |
| JP | 2018-189937 | A | | 11/2018 | |
| JP | 2019-179696 | A | | 10/2019 | |
| JP | 2020-160305 | A | | 10/2020 | |
| KR | 2006-0001749 | A | | 1/2006 | |
| KR | 2011-0080386 | A | | 7/2011 | |
| KR | 2013-0138883 | A | | 12/2013 | |
| KR | 2014-0085243 | A | | 7/2014 | |
| KR | 2016-0046152 | A | | 4/2016 | |
| KR | 2016-0126876 | A | | 11/2016 | |
| KR | 10-1702570 | | | 2/2017 | |
| KR | 2020-0103239 | A | | 9/2020 | |
| KR | 20220027448 | A | * | 3/2022 | H10K 59/131 |
| TW | 201621866 | | | 6/2016 | |
| WO | WO-2014/104707 | | | 7/2014 | |

OTHER PUBLICATIONS

International Search Report (Application No. PCT/IB2022/052072), dated May 17, 2022.
Written Opinion (Application No. PCT/IB2022/052072), dated May 17, 2022.
Zakhidov.A et al., "Orthogonal processing: A new strategy for organic electronics", Chem. Sci. (Chemical Science), Apr. 7, 2011, vol. 2, No. 6, pp. 1178-1182.
Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

FIG. 11A1
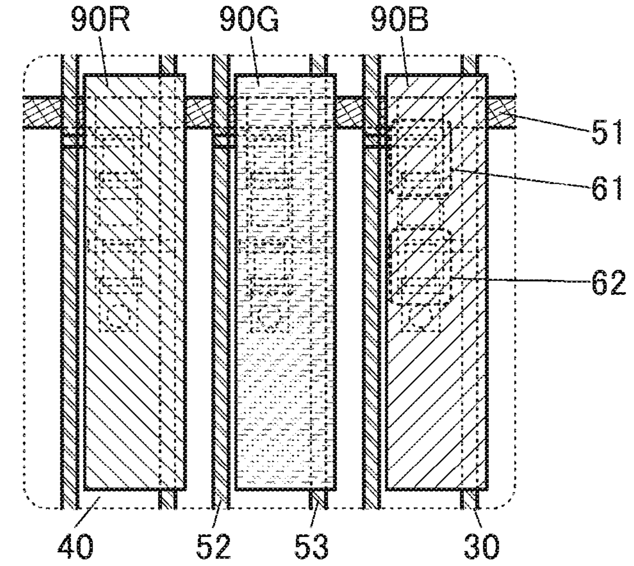
FIG. 11A2
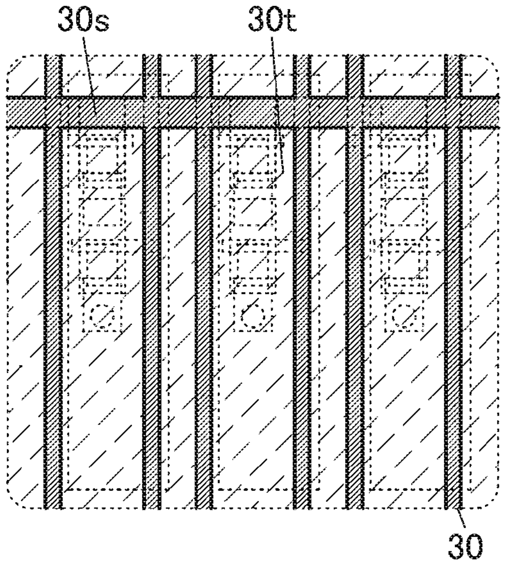
FIG. 11B1
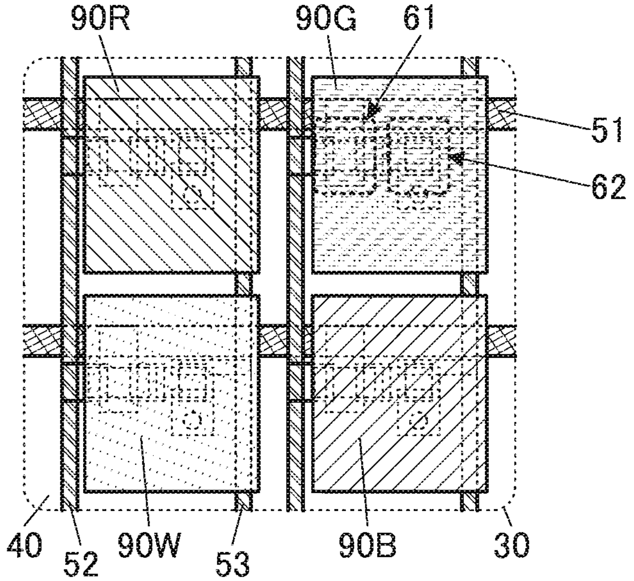
FIG. 11B2
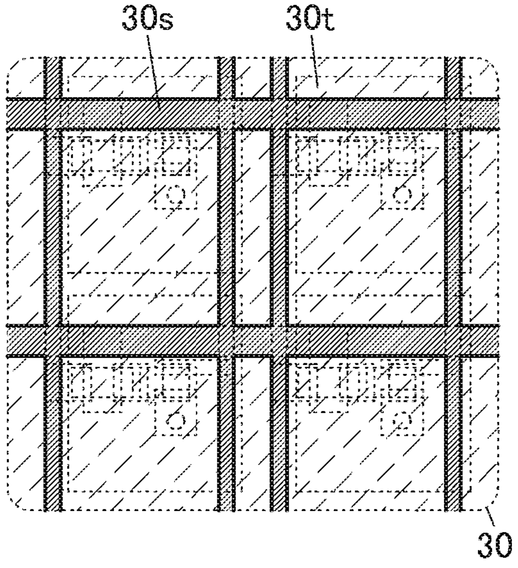

FIG. 12A1
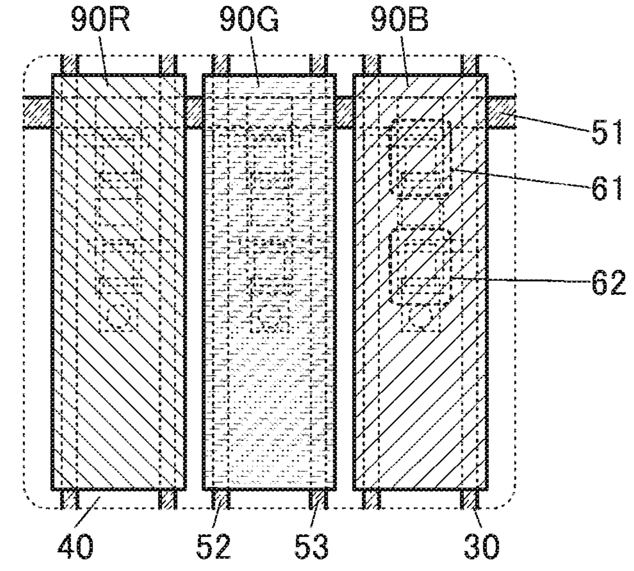
FIG. 12A2
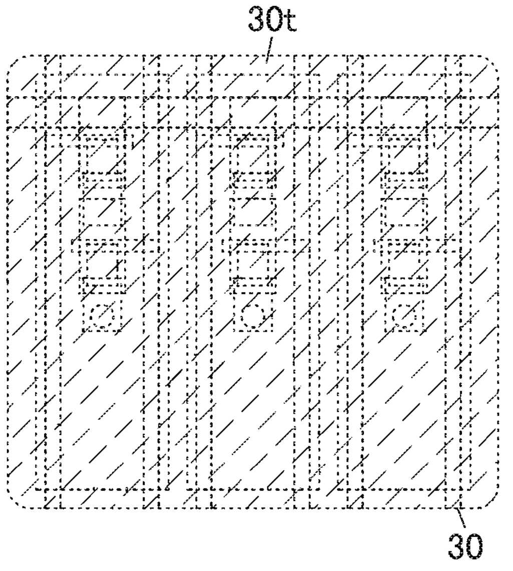
FIG. 12B1
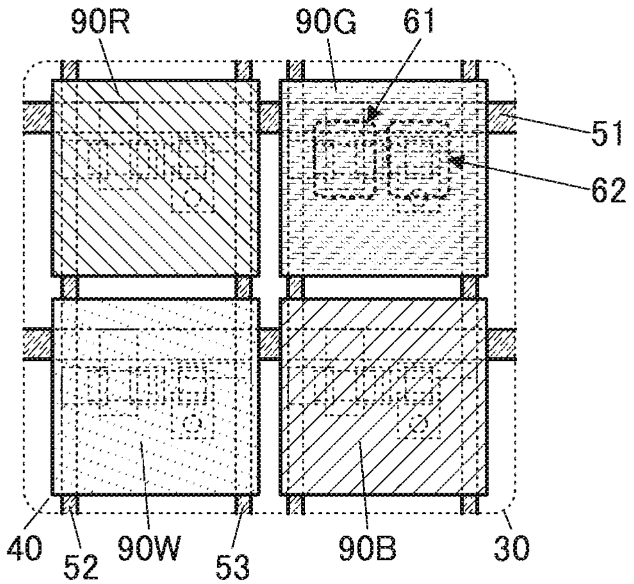
FIG. 12B2
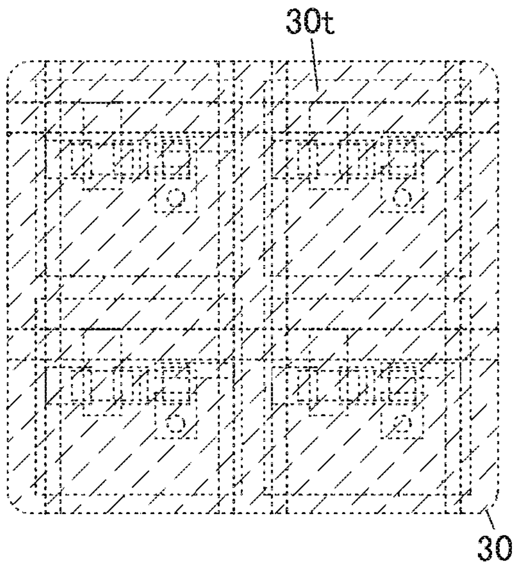

DISPLAY APPARATUS

TECHNICAL FIELD

One embodiment of the present invention relates to a display apparatus.

Note that one embodiment of the present invention is not limited to the above technical field. Examples of a technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, the diversification of display apparatuses has been required. One of them is a display apparatus having a light-transmitting display portion through which the background behind the display portion can be seen, i.e., having a see-through capability. Such a display apparatus having a see-through capability has been expected to be applied to a variety of uses such as a windshield of a vehicle, window glass of an architectural structure such as a house and a building, glass and a case of a window display of a store, and a head-up display used for a car, an airplane, or the like.

Patent Document 1 discloses a display apparatus that can switch between normal display and see-through display.

REFERENCE

Patent Document

[Patent Document 1] Japanese Published Patent Application No. 2018-189937

SUMMARY OF THE INVENTION

Problems to be Solved by the Invention

An object of one embodiment of the present invention is to provide a display apparatus that is capable of see-through display. An object of one embodiment of the present invention is to provide a high-resolution display apparatus. An object of one embodiment of the present invention is to provide a display apparatus with a high aperture ratio. An object of one embodiment of the present invention is to provide a display apparatus with high luminance. An object of one embodiment of the present invention is to provide a highly reliable display apparatus.

An object of one embodiment of the present invention is to provide a display apparatus having a novel structure. An object of one embodiment of the present invention is to provide a method for manufacturing the above-described display apparatus with high yield. An object of one embodiment of the present invention is to at least reduce at least one of problems of the conventional technique.

Note that the description of these objects does not preclude the existence of other objects. One embodiment of the present invention does not have to achieve all of these objects. Note that objects other than these can be derived from the description of the specification, the drawings, the claims, and the like.

Means for Solving the Problems

One embodiment of the present invention is a display apparatus that includes a first region including a first light-emitting element, a second region including a second light-emitting element, and a third region transmitting external light. Furthermore, the display apparatus includes an insulating layer provided continuously across the first region, the second region, and the third region. The first light-emitting element includes a first pixel electrode, a first organic layer, and a common electrode. The second light-emitting element includes a second pixel electrode, a second organic layer, and the common electrode. The first pixel electrode and the second pixel electrode are arranged side by side. The first organic layer is over the first pixel electrode. The second organic layer is over the second pixel electrode. In each of the first organic layer and the second organic layer, an angle between a bottom surface and a side surface is greater than or equal to 60° and less than or equal to 1200 in a cross sectional view. The insulating layer includes a portion overlapping with the first organic layer with the common electrode therebetween, a portion overlapping with the second organic layer with the common electrode therebetween, a portion in the third region, and has a light-transmitting property.

In the above, the first organic layer and the second organic layer preferably include different light-emitting compounds.

In the above, it is preferable that the first organic layer and the second organic layer include the same light-emitting compound and a coloring layer or a color conversion layer be at a position overlapping with the first light-emitting element.

In the above, it is preferable that the common electrode have a light-transmitting property and the common electrode include a portion in the third region.

In the above, it is preferable that the common electrode have a light-transmitting property and a reflective property and the common electrode include an opening overlapping with the third region.

In any of the above, a second insulating layer preferably covers an end portion of the first electrode and an end portion of the second electrode. At this time, the second insulating layer preferably includes a portion overlapping with the third region.

In any of the above, a second insulating layer preferably covers an end portion of the first electrode and an end portion of the second electrode. At this time, the second insulating layer preferably includes an opening in a portion overlapping with the third region.

In any of the above, a third insulating layer is preferably included. The third insulating layer includes an organic resin and a first portion between the first light-emitting element and the second light-emitting element. It is preferable that the first organic layer and the second organic layer face each other with the first portion of the third insulating layer therebetween and the third insulating layer include a second portion overlapping with the third region.

In any of the above, the third insulating layer includes an organic resin and a first portion between the first light-emitting element and the second light-emitting element. It is preferable that the first organic layer and the second organic layer face each other with the first portion of the third insulating layer therebetween and the third insulating layer include an opening in a portion overlapping with the third region.

In any of the above, a fourth insulating layer is preferably further included. It is preferable that the fourth insulating layer include an inorganic insulating film and a third portion between the first light-emitting element and the second light-emitting element, and be provided along a side surface and a bottom surface of the third insulating layer. Each of a side surface of the first organic layer and a side surface of the second organic layer is preferably in contact with the fourth insulating layer.

In the above, each of a side surface of the first pixel electrode and a side surface of the second pixel electrode is preferably in contact with the fourth insulating layer.

In any of the above, the first portion of the third insulating layer preferably includes a portion having a convex top surface. Alternatively, the first portion of the third insulating layer preferably includes a portion having a concave top surface.

Effect of the Invention

According to one embodiment of the present invention, a display apparatus that is capable of see-through display can be provided. Alternatively, a high-resolution display apparatus can be provided. Alternatively, a display apparatus with a high aperture ratio can be provided. Alternatively, a display apparatus with high luminance can be provided. Alternatively, a highly reliable display apparatus can be provided.

According to one embodiment of the present invention, a display apparatus having a novel structure can be provided. Alternatively, a method for manufacturing the above-described display apparatus with high yield can be provided. According to one embodiment of the present invention, at least one of problems of the conventional technique can be at least reduced.

Note that the description of these effects does not preclude the existence of other effects. One embodiment of the present invention does not need to have all of these effects. Note that effects other than these can be derived from the description of the specification, the drawings, the claims, and the like.

BRIEF DESCRIPTION OF THE DRAWINGS

FIG. 11A1, FIG. 11A2, FIG. 11B1, and FIG. 11B2 are diagrams illustrating structure examples of a display apparatus.

FIG. 12A1, FIG. 12A2, FIG. 12B1, and FIG. 12B2 are diagrams illustrating structure examples of a display apparatus.

MODE FOR CARRYING OUT THE INVENTION

Figure 1A:
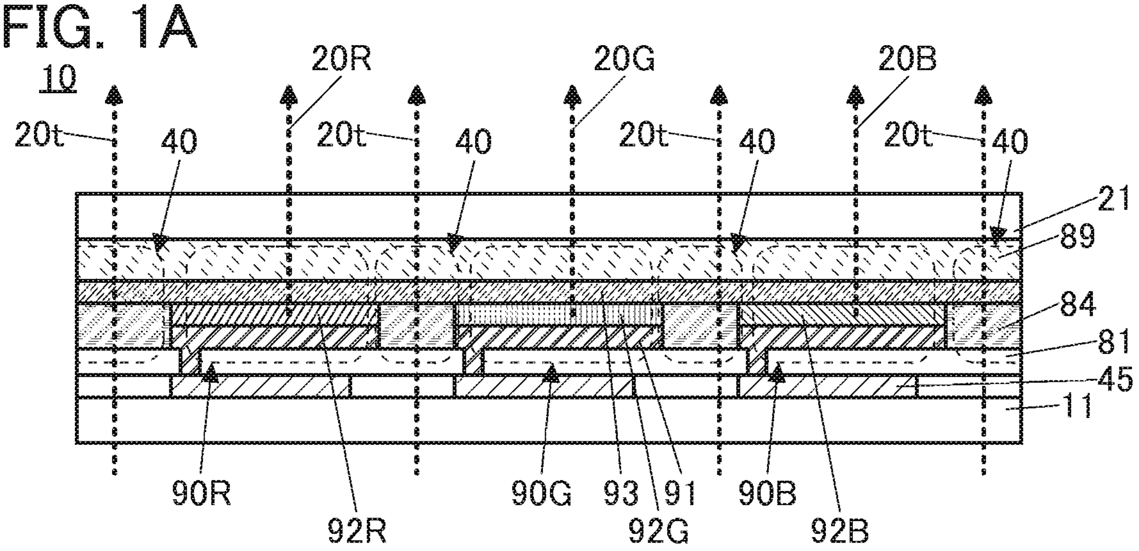
FIG. 1A and FIG. 1B are diagrams illustrating structure examples of a display apparatus.

Hereinafter, embodiments are described with reference to the drawings. Note that the embodiments can be implemented in many different modes, and it will be readily understood by those skilled in the art that modes and details thereof can be changed in various ways without departing from the spirit and scope thereof. Thus, the present invention should not be construed as being limited to the description of the following embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, ordinal numbers such as "first," "second," and the like are used in order to avoid confusion among components and do not limit the number.

In this specification and the like, the term "film" and the term "layer" can be interchanged with each other. For example, in some cases, the term "conductive layer" and the term "insulating layer" can be interchanged with the term "conductive film" and the term "insulating film", respectively.

Note that in this specification, an EL layer means a layer containing at least a light-emitting substance (also referred to as a light-emitting layer) or a stacked-layer body including the light-emitting layer provided between a pair of electrodes of a light-emitting element.

In this specification and the like, a display panel that is one embodiment of a display apparatus has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, structure examples of display apparatuses of one embodiment of the present invention are described.

One embodiment of the present invention is a display apparatus in which light-emitting elements emitting visible light are arranged in a matrix. An image can be displayed on the display surface side of the display apparatus by a plurality of light-emitting elements. The display apparatus includes, for example, a transmission region between two adjacent light-emitting elements. The transmission region is a region that transmits visible light. External light entering from the back side of the display apparatus transmits the transmission region. Thus, a user can see an image displayed by the light-emitting elements, which is superimposed on a transmission image made by the external light passing through the transmission region. Accordingly, the display apparatus is capable of see-through display.

The light-emitting element itself may transmit visible light. Specifically, each of the pair of electrodes included in the light-emitting element may have a light-transmitting property. Accordingly, the transmitting property of the display apparatus in see-through display can be improved.

The display apparatus includes at least two light-emitting elements of different emission colors. The light-emitting elements each include a pair of electrodes and an EL layer (also referred to as an organic layer) therebetween. The light-emitting elements are preferably organic EL elements (organic electroluminescent elements). The two or more light-emitting elements emitting different colors include respective EL layers containing different materials. For example, three kinds of light-emitting elements emitting red (R), green (G), and blue (B) light are included, whereby a full-color display apparatus can be obtained.

It is known that in the case where some or all of EL layers are separately formed for light-emitting elements of different colors, the EL layers are formed by an evaporation method using a shadow mask such as a fine metal mask (hereinafter, also referred to as an FMM). However, this method causes a deviation from the designed shape and position of an island-shaped organic film due to various influences such as the accuracy of the FMM, the positional deviation between the FMM and a substrate, a warp of the FMM, and the vapor-scattering-induced expansion of the outline of the deposited film; accordingly, it is difficult to achieve high resolution and a high aperture ratio of the display apparatus. Thus, a measure has been taken for pseudo improvement in resolution (also referred to as pixel density) by employing unique pixel arrangement such as PenTile arrangement, for example.

One embodiment of the present invention can employ a structure in which an EL layer is processed into a fine pattern without a shadow mask such as a metal mask. Thus, a display apparatus with high resolution and a high aperture ratio, which has been difficult to achieve, can be fabricated. Moreover, EL layers can be formed separately, enabling the display apparatus to display an image that is extremely clear, with a high contrast, and with high display quality.

It is difficult to set the distance between the EL layers for different emission colors to be less than 10 μm with a formation method using a metal mask, for example; however, with the use of the above method, the distance can be decreased to be less than or equal to 3 μm, less than or equal to 2 μm, or less than or equal to 1 μm. For example, with use of an exposure apparatus for LSI, the distance can be decreased to be less than or equal to 500 nm, less than or equal to 200 nm, less than or equal to 100 nm, or less than or equal to 50 nm. Such an extremely small distance between two adjacent light-emitting elements or between two EL layers is one of the features of one embodiment of the present invention. Accordingly, the area of a non-light-emitting region that may exist between two light-emitting elements can be significantly reduced, and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

In many cases, an organic film formed using an FMM has an extremely small taper angle (e.g., greater than 0° and less than 30°) so that the thickness of the film becomes smaller in a portion closer to an end portion. Therefore, it is difficult to clearly observe the side surface of an organic film formed using an FMM because the side surface and the top surface are continuously connected. By contrast, an EL layer included in one embodiment of the present invention is processed without using an FMM, and has a clear side surface. In particular, part of the taper angle of the EL layer included in one embodiment of the present invention is preferably greater than or equal to 30° and less than or equal to 120°, further preferably greater than or equal to 60° and less than or equal to 120°.

Note that in this specification and the like, an end portion of an object having a tapered shape indicates that the end portion has a cross-sectional shape in which the angle between the side surface (the surface) of the object and the bottom surface (the formation surface) of the object is greater than 0° and less than 90° in a region of the end portion, and the thickness continuously increases from the end portion. A taper angle refers to an angle between the bottom surface (the formation surface) and the side surface (the surface) at the end portion of the object.

As described above, in one embodiment of the present invention, an EL layer can be processed with high accuracy as compared with the case of using an FMM, and thus the transmission region provided between the light-emitting elements can also be formed with high accuracy. In addition, a display apparatus can have a structure with no EL layer in the transmission region even when having high resolution, leading to a high transmittance of the transmission region and a high visibility of the background, which is preferable.

In order to insulate two adjacent EL layers, an insulating layer is preferably provided therebetween. In that case, a space positioned between the two adjacent EL layers of two adjacent light-emitting elements is preferably filled with an insulating layer containing an organic resin. Alternatively, an insulating layer including an inorganic insulating film is preferably provided to be in contact with the side surface of each of the two adjacent EL layers. Further alternatively, both the insulating layer containing an organic resin and the insulating layer including an inorganic insulating film may be provided. By providing an insulating layer between two adjacent EL layers to surely insulate them, a leakage current between two light-emitting elements can be reduced effectively and a display apparatus with a high contrast can be fabricated.

The display apparatus may be configured to perform color display with use of a combination of a light-emitting element that exhibits white light emission and a coloring layer (a color filter). Alternatively, color display may be performed with use of a structure in which a light-emitting element that exhibits blue light emission and a color conversion layer are combined. In that case, the coloring layer or the color conversion layer is provided at a position overlapping with the light-emitting element and light from the light-emitting element passes through the coloring layer or the color conversion layer, whereby light of a desired color can be obtained. Since light-emitting elements of the same color can be used for the display apparatus, the EL layers of the light-emitting elements can contain the same light-emitting material (light-emitting compound). In that case, the EL layer is separated between two adjacent light-emitting elements without using an FMM; this structure can inhibit a leakage current through the EL layer between the light-emitting elements. Accordingly, the distance between the adjacent light-emitting elements can be extremely small. Thus, higher resolution and a higher aperture ratio can be achieved as compared with the case where an EL layer is not separated.

More specific structure examples are described below with reference to drawings.

Structure Example 1

FIG. 1A illustrates an example of a cross-sectional structure of a display apparatus.

A display apparatus 10 includes a functional layer 45, an insulating layer 81, a light-emitting element 90R, a light-emitting element 90G, a light-emitting element 90B, and the like between a substrate 11 and a substrate 21. Here, the substrate 21 side corresponds to the display surface side of the display apparatus 10.

A transmission region 40 is provided between two adjacent light-emitting elements 90.

Note that when a common part of the light-emitting element 90R, the light-emitting element 90G, the light-emitting element 90B, and the like is described, alphabets such as R, G, and B used to distinguish the light-emitting elements are omitted and the light-emitting element 90 or the like is used for description. The same applies to an organic layer 92R, an organic layer 92G, an organic layer 92B, and the like.

The light-emitting element 90R includes a conductive layer 91, a conductive layer 93, and the organic layer 92R sandwiched therebetween. The organic layer 92R is a layer that contains at least a light-emitting substance. Similarly, the light-emitting element 90G includes the organic layer 92G and the light-emitting element 90B includes the organic layer 92B. The conductive layer 91 is provided for each pixel (also referred to as each subpixel) and functions as a pixel electrode. The conductive layer 93 is provided continuously across a plurality of pixels. The conductive layer 93 is electrically connected to a wiring supplied with a constant potential in a region that is not illustrated and functions as a common electrode.

The conductive layer 91 reflects visible light, and the conductive layer 93 transmits visible light. Thus, the light-emitting element 90R or the like is a top-emission light-emitting element that emits light to the substrate 21 side by application of a voltage between the conductive layer 91 and the conductive layer 93. In a similar manner, the light-emitting element 90G emits light 20G and the light-emitting element 90B emits light 20B.

The functional layer 45 is a layer including a circuit for driving the light-emitting element 90R or the like. For example, the functional layer 45 includes a pixel circuit including a transistor, a capacitor, a wiring, an electrode, and the like.

The transistor included in the functional layer 45 includes a gate electrode layer, a semiconductor layer, a source electrode layer, a drain electrode layer, and the like. It is preferable that one or more of the layers included in the transistor have a light-transmitting property with respect to visible light. In particular, it is preferable that all of them have a light-transmitting property. In that case, part of a region that includes the transistor can serve as part of the transmission region 40.

The capacitor, the wiring, the electrode, and the like included in the functional layer 45 also preferably have a light-transmitting property. Thus, the area of the transmission region can be increased, so that visibility in see-through display can be improved.

Wirings connected to a plurality of functional layers 45 may include a non-light-transmitting conductive material with low electric resistance such as a metal. Thus, wiring resistance can be reduced. Alternatively, a light-transmitting conductive material may be used for the wiring. Thus, a portion where the wiring is provided can also be the transmission region.

The insulating layer 81 is provided between the functional layer 45 and the conductive layer 91. The conductive layer 91 and the functional layer 45 are electrically connected to each other in an opening provided in the insulating layer 81. In this way, the functional layer 45 and the light-emitting element 90 are electrically connected to each other.

An adhesive layer 89 is provided between the substrate 21 and the conductive layer 93. It can also be said that the substrate 21 and the substrate 11 are bonded to each other with the adhesive layer 89. The adhesive layer 89 also functions as a sealing layer that seals the light-emitting element 90.

The transmission region 40 includes the insulating layer 81, an insulating layer 84, the adhesive layer 89, and the like. The insulating layer 84 is provided between two adjacent organic layers 92. The insulating layer 84 is provided so as to fill a space positioned between the two adjacent organic layers 92. In addition, the two adjacent organic layers 92 are provided so that their side surfaces face each other with the insulating layer 84 provided therebetween.

In FIG. 1A, the insulating layer 84 is provided between the two adjacent light-emitting elements 90 so as to fill a space positioned between the conductive layers 91 that function as pixel electrodes. The two adjacent conductive layers 91 are provided so that their side surfaces face each other with the insulating layer 84 provided therebetween.

An inorganic insulating material or an organic insulating material can be used for the insulating layer 84. A material having low transmittance with respect to water or oxygen (also referred to as having a barrier property) is preferably used as the inorganic insulating material. At this time, the insulating layer 84 containing an inorganic insulating material is preferably provided in contact with the side surface of the organic layer. Alternatively, a stacked film in which two or more inorganic insulating films are stacked may be used as the insulating layer 84 containing an inorganic insulating material. In particular, when an organic resin is used for the organic insulating material, the planarity of the top surface can be improved; thus, the step coverage of a film that is formed over the insulating layer 84 can be improved. An insulating film containing an inorganic insulating material and an insulating film containing an organic insulating material may both be used for the insulating layer 84.

Any of a variety of optical members can be placed on the outer side of the substrate 21. Examples of the optical members include, in addition to a polarizing plate and a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, or the like may be arranged on the outer side of the substrate 21. In addition, a touch sensor may be provided between the substrate 21 and the substrate 11 or on the outer side of the substrate 21. Thus, a structure including the display apparatus 10 and the touch sensor can function as a touch panel.

FIG. 1A illustrates light 20R emitted by the light-emitting element 90R, the light 20G emitted by the light-emitting element 90G, the light 20B emitted by the light-emitting element 90B, and light 20*t* passing through the transmission region 40. Through the display apparatus 10, a user can see a background (a transmission image) behind the display apparatus 10 owing to the transmission region 40. In addition, a user can see an image displayed by the light-emitting elements 90, which is superimposed on a transmission image seen through the display apparatus 10. Thus, AR (Augmented Reality) display can be performed.

Figure 1B:
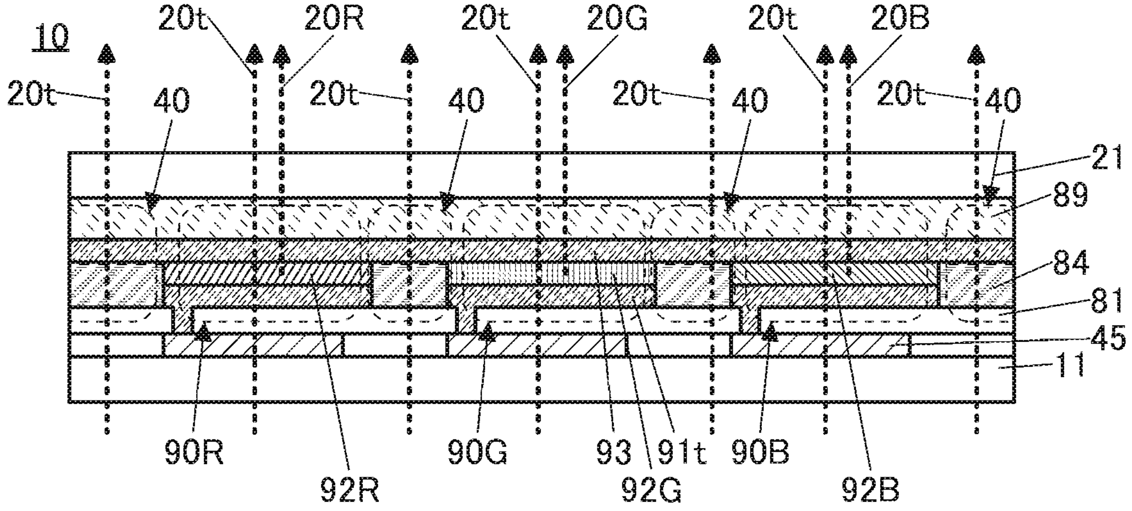

FIG. 1B illustrates an example in which a conductive layer 91*t* that transmits visible light is used as a pixel electrode. At this time, the light-emitting element 90R or the like is a dual-emission light-emitting element that emits light to both the substrate 21 side and the substrate 11 side.

Furthermore, the use of a film that transmits visible light as part of a layer included in the functional layer 45 allows the light 20*t* to pass through part of a region where the functional layer 45 and the conductive layer 91*t* overlap with each other. Thus, a user can see a transmission image owing to the light 20*t* that passes through the transmission region 40 and the light 20*t* that passes through the light-emitting element 90R or the like, as illustrated in FIG. 1B.

Note that although the example is illustrated here in which the light-emitting element 90R, the light-emitting element 90G, and the light-emitting element 90B include the organic layer 92R, the organic layer 92G, and the organic layer 92B, respectively, which contain different light-emitting materials (light-emitting compounds), the organic layers may include the same light-emitting materials. For example, for all the light-emitting elements, a material that exhibits white light emission may be used or a light-emitting material that exhibits red, green, or blue light emission may be used. Details of the structure of the light-emitting element are described in Embodiment 3.

For example, the display apparatus 10 may be configured to perform color display with use of a combination of a light-emitting element that exhibits white light emission and a coloring layer (a color filter). Alternatively, color display may be performed with use of a structure in which a light-emitting element that exhibits blue light emission and a color conversion layer are combined. In that case, the coloring layer or the color conversion layer is provided at a position overlapping with the light-emitting element and light from the light-emitting element passes through the coloring layer or the color conversion layer, whereby light of a desired color can be obtained. Since light-emitting elements of the same color can be used for the display apparatus, the EL layers of the light-emitting elements can contain the same light-emitting material (light-emitting compound). In that case, the EL layer is separated between two adjacent light-emitting elements without using an FMM; this structure can inhibit a leakage current through the EL layer between the light-emitting elements. Accordingly, the distance between the adjacent light-emitting elements can be extremely small. Thus, higher resolution and a higher aperture ratio can be achieved as compared with the case where an EL layer is not separated.

[Example of Pixel Arrangement Method]

Examples of a pixel arrangement method are described below. In each of the drawings exemplified below, arrows indicating the X direction and the Y direction that intersect with each other are illustrated. The X direction and the Y direction are referred to as a row direction and a column direction, respectively, in some cases below. In each of the drawings, a square that represents an arrangement pitch is denoted by a dashed-dotted line. The square corresponds to the range of one pixel; however, one embodiment of the present invention is not limited thereto.

Figure 2A:
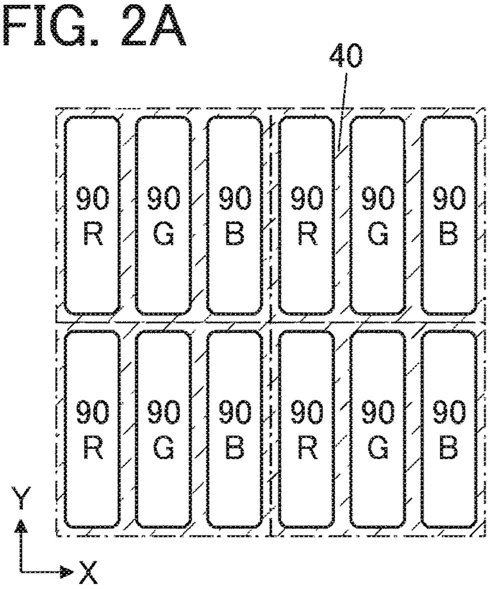
FIG. 2A to FIG. 2F are diagrams illustrating structure examples of a display apparatus.

FIG. 2A illustrates an example of stripe arrangement. The light-emitting element 90R, the light-emitting element 90G, and the light-emitting element 90B are arranged in this order in the X direction. The same light-emitting elements are arranged in the Y direction.

In FIG. 2A, a region surrounded by the solid line is a light-emitting region. In addition, a region that is positioned outside the light-emitting region (a region denoted by a hatching pattern) is a region including the transmission region 40. Note that although not clearly illustrated here, a region including a non-light-transmitting member, such as a wiring or an electrode that is positioned outside a light-emitting region, is a non-transmission region.

Figure 2B:
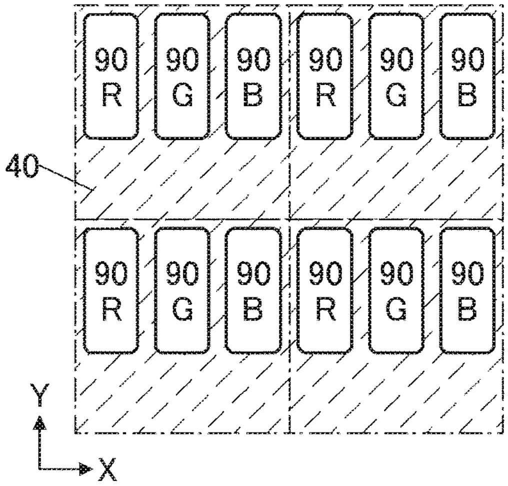

FIG. 2B is an example in which the width in the Y direction of each light-emitting element is made small and the area of the transmission region 40 is increased in FIG. 2A.

Figure 2C:
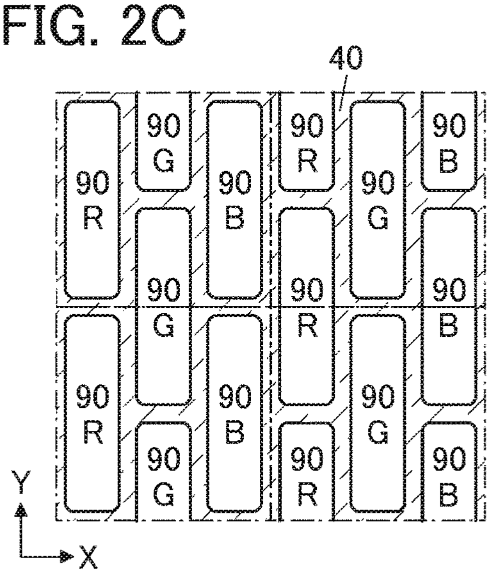
Figure 2D:
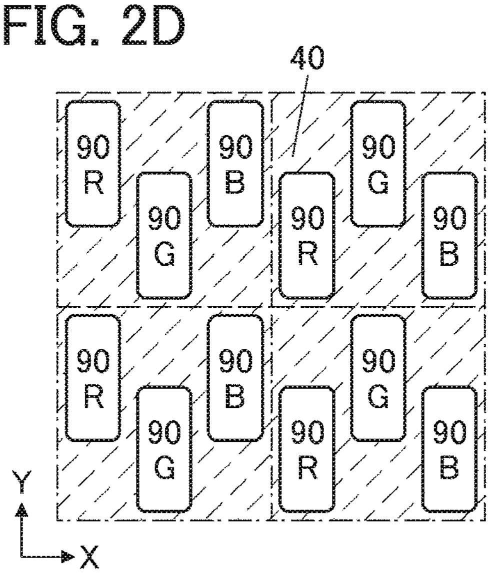

FIG. 2C is an example in which the even-numbered columns are arranged to be shifted from the odd-numbered columns by a half period in the Y direction in FIG. 2A. FIG. 2D is an example in which the width in the Y direction of the light-emitting elements is made small and the area of the transmission region 40 is increased in FIG. 2C.

Figure 2E:
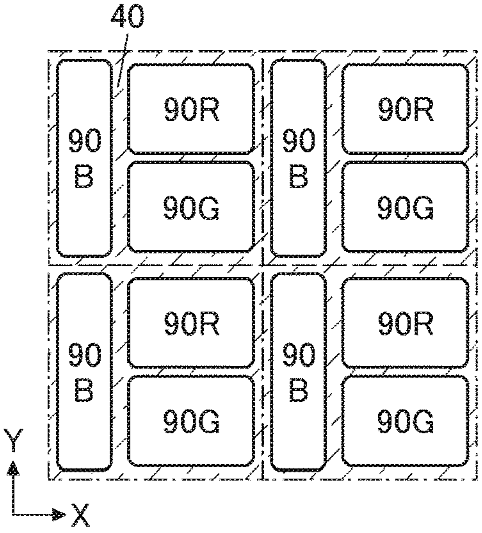
Figure 2F:
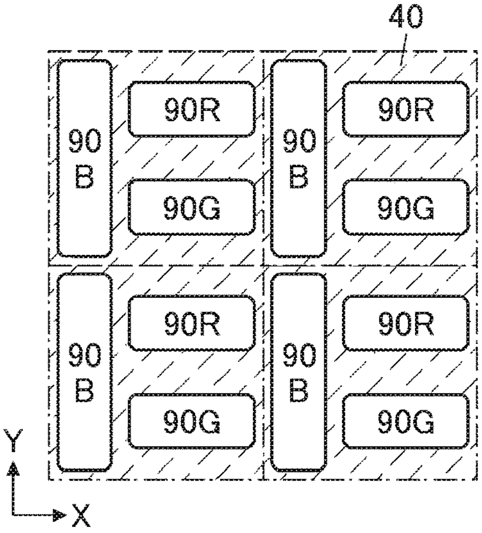

FIG. 2E illustrates an example of S stripe arrangement. The light-emitting elements 90B are arranged in the Y direction, and the light-emitting elements 90R and the light-emitting elements 90G are alternately arranged in the Y direction. FIG. 2F is an example in which the area of the light-emitting element 90R and the light-emitting element 90G is reduced and the area of the transmission region 40 is increased in FIG. 2E.

Figure 3A:
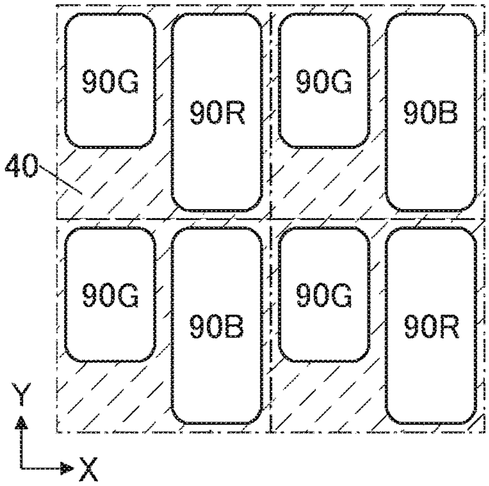
FIG. 3A to FIG. 3F are diagrams illustrating structure examples of a display apparatus.

FIG. 3A illustrates an example of what is called PenTile arrangement which is an arrangement method where two kinds of pixels enable pseudo higher resolution. In FIG. 3A, two kinds of pixels are alternately arranged in the X direction and the Y direction; one of the two kinds of the pixels is a pixel that includes the light-emitting element 90R and the light-emitting element 90G and the other is a pixel that includes the light-emitting element 90B and the light-emitting element 90G.

Figure 3B:
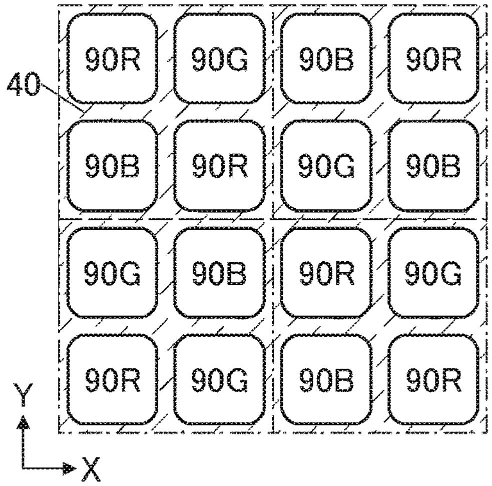

FIG. 3B illustrates an arrangement method in which light-emitting elements of the same color are arranged in an oblique direction. In this arrangement, 2×2 given light-emitting elements that are selected always include three light-emitting elements two of which are light-emitting elements of the same color.

Figure 3C:
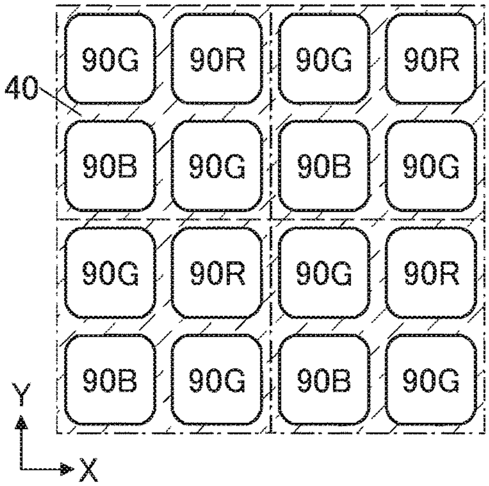
Figure 3D:
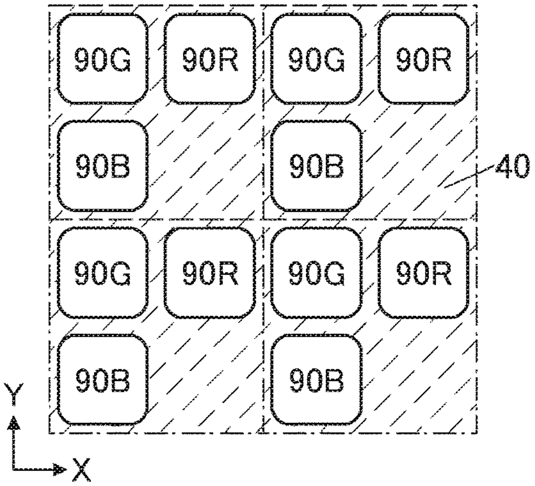

FIG. 3C is an example in which the light-emitting element 90R, the light-emitting element 90B, and the two light-emitting elements 90G are provided in one pixel. Here, in both the X direction and the Y direction, either the light-emitting elements 90R or the light-emitting elements 90B and the light-emitting elements 90G are alternately arranged. FIG. 3D is an example in which the area of the transmission region 40 is increased by eliminating one of the light-emitting elements 90G in FIG. 3C.

Figure 3E:
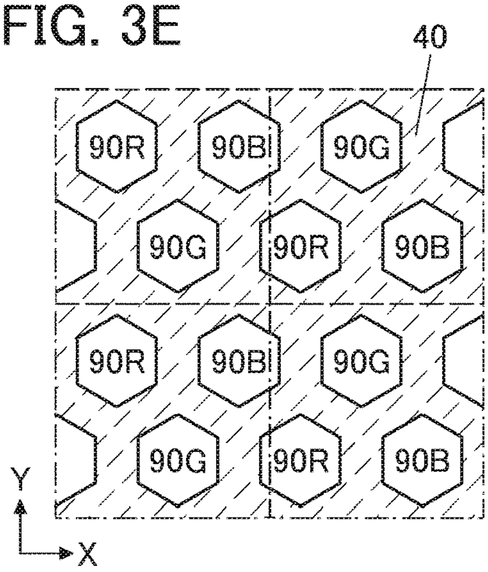
Figure 3F:
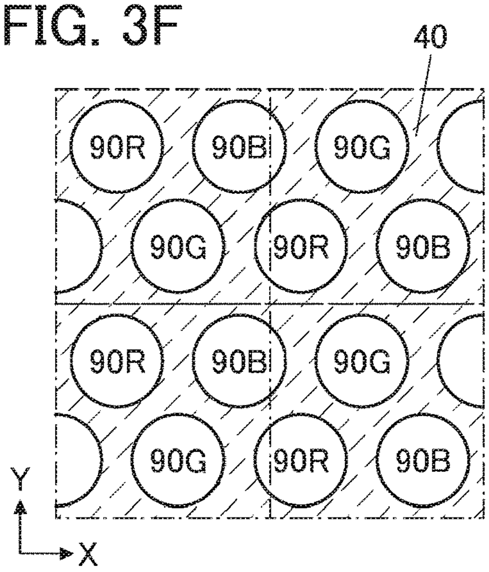

FIG. 3E and FIG. 3F are examples in which the odd-numbered rows are arranged to be shifted from the even-numbered rows by a half period in the X direction. Furthermore, the light-emitting elements are arranged in a substantially equal distance to one another. Each of the light-emitting elements has a hexagonal shape in FIG. 3E, and each of the light-emitting elements has an elliptical shape in FIG. 3F. In the structures illustrated in FIG. 3E and FIG. 3F, for example, when what is called close-packed arrangement in which one light-emitting element is placed on a vertex of a regular triangle is employed, the pixel pitches in the X direction and the Y direction do not match and thus an image might be distorted. Accordingly, it is preferable that one light-emitting element be placed on a vertex of not a regular triangle but an isosceles triangle.

Structure Example 2

More specific structure examples are described below with reference to drawings.

Figure 4A:
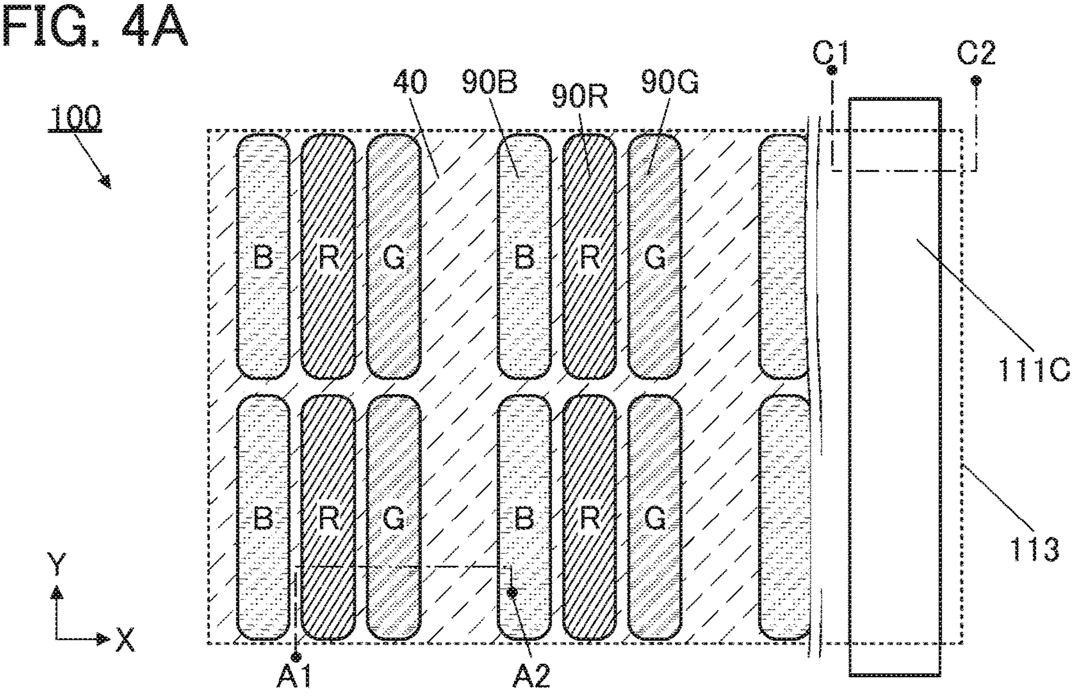
FIG. 4A and FIG. 4B are diagrams illustrating structure examples of a display apparatus.

FIG. 4A illustrates a schematic top view of a display apparatus 100. The display apparatus 100 includes a plurality of light-emitting elements 90R exhibiting red, a plurality of light-emitting elements 90G exhibiting green, and a plurality of light-emitting elements 90B exhibiting blue. In FIG. 4A, light-emitting regions of the light-emitting elements are denoted by R, G, and B to easily differentiate the light-emitting elements.

The light-emitting elements 90R, the light-emitting elements 90G, and the light-emitting elements 90B are arranged in a matrix. FIG. 1A illustrates what is called stripe arrangement, in which the light-emitting elements of the same color are arranged in one direction (in a longitudinal direction of the light-emitting element, i.e., in the Y direction). Note that the arrangement method of the light-emitting elements is not limited thereto; another arrangement method such as S stripe arrangement, delta arrangement, Bayer arrangement, or zigzag arrangement may be used, or PenTile arrangement, diamond arrangement, or the like may be used.

The light-emitting elements 90R, the light-emitting elements 90G, and the light-emitting elements 90B are arranged in the X direction. The light-emitting elements of the same color are arranged in the Y direction intersecting with the X direction.

The display apparatus 100 includes the transmission region 40. Here, a region where the light-emitting elements are not provided is the transmission region 40, as in FIG. 2A and the like. In FIG. 4A, the distance between the light-emitting element 90B and the light-emitting element 90G is made larger than the other distance. This can increase the area of the transmission region 40 and can increase the transmittance of the display apparatus 100. Note that although the distance between the light-emitting element 90B and the light-emitting element 90G is increased here, without limitation to this, the distance between a given two adjacent light-emitting elements may be increased or the light-emitting elements may be arranged at regular intervals.

As the light-emitting elements 90R, the light-emitting elements 90G, and the light-emitting element 90B, EL elements such as OLEDs (Organic Light Emitting Diodes) or QLEDs (Quantum-dot Light Emitting Diodes) are preferably used. Examples of a light-emitting substance contained in the EL element include a substance that emits fluorescent light (a fluorescent material), a substance that emits phosphorescent light (a phosphorescent material), a substance that exhibits thermally activated delayed fluorescence (a thermally activated delayed fluorescent (TADF) material), and an inorganic compound (a quantum dot material). As the light-emitting substance contained in the EL element, not only organic compounds but also inorganic compounds (e.g., quantum dot materials) can be used.

Note that although in the example illustrated here, the display apparatus includes three colors of light-emitting elements, which are the light-emitting element 90R, the light-emitting element 90G, and the light-emitting element 90B, without limitation to this, four or more colors of light-emitting elements may be provided. For example, a light-emitting element of yellow (Y) or white (W) may be provided in addition to red (R), green (G), and blue (B). Alternatively, light-emitting elements of three colors of cyan (C), magenta (M), and yellow (Y) may be provided.

FIG. 4A illustrates a connection electrode 111C that is electrically connected to a common electrode 113. The connection electrode 111C is supplied with a potential (e.g., an anode potential or a cathode potential) that is to be supplied to the common electrode 113. The connection electrode 111C is provided outside a display region where the light-emitting elements 90R and the like are arranged. In FIG. 4A, the common electrode 113 is denoted by a dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface shape, the top surface of the connection electrode 111C can have a band-like shape, an L-shape, a U-shape (square bracket shape), a quadrangular shape, or the like.

Figure 4B:
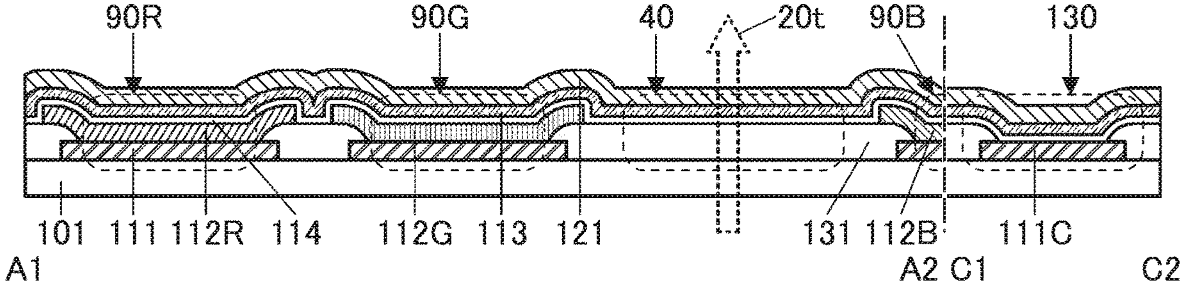

FIG. 4B is a cross-sectional schematic view taken along the dashed-dotted line A1-A2 and the dashed-dotted line C1-C2 in FIG. 1A.

FIG. 4B illustrates cross sections of part of the light-emitting element 90R, part of the light-emitting element 90G, part of the transmission region 40, and part of the light-emitting element 90B. The light-emitting element 90R includes a pixel electrode 111, an organic layer 112R, an organic layer 114, and the common electrode 113. The light-emitting element 90G includes the pixel electrode 111, an organic layer 112G, the organic layer 114, and the common electrode 113. The light-emitting element 90B includes the pixel electrode 111, an organic layer 112B, the organic layer 114, and the common electrode 113. The organic layer 114 and the common electrode 113 are shared by the light-emitting element 90R, the light-emitting element 90G, and the light-emitting element 90B. The organic layer 114 can also be referred to as a common layer.

The organic layer 112R included in the light-emitting element 90R contains at least a light-emitting organic compound that emits red light. The organic layer 112G included in the light-emitting element 90G contains at least a light-emitting organic compound that emits green light. The organic layer 112B included in the light-emitting element 90B contains at least a light-emitting organic compound that emits blue light. The organic layer 112R, the organic layer 112G, and the organic layer 112B can each be referred to as an EL layer.

The organic layer 112R, the organic layer 112G, and the organic layer 112B may each include one or more of an electron-injection layer, an electron-transport layer, a hole-injection layer, and a hole-transport layer in addition to the layer containing a light-emitting organic compound (a light-emitting layer). The organic layer 114 does not necessarily include the light-emitting layer. For example, the organic layer 114 includes one or more of an electron-injection layer, an electron-transport layer, a hole-injection layer, and a hole-transport layer.

Here, the uppermost layer in the stacked-layer structure of each of the organic layer 112R, the organic layer 112G, and the organic layer 112B, i.e., the layer in contact with the organic layer 114 is preferably a layer other than the light-emitting layer. For example, it is preferable that an electron-injection layer, an electron-transport layer, a hole-injection layer, a hole-transport layer, or a layer other than those layers be provided to cover the light-emitting layer so that the layer is in contact with the organic layer 114. When the top surface of the light-emitting layer is protected by another layer in this manner in manufacturing each light-emitting element, the reliability of the light-emitting element can be improved.

The pixel electrode 111 is provided in each of the light-emitting elements. The common electrode 113 and the organic layer 114 is provided as a continuous layer shared by the light-emitting elements. A conductive film that has a light-transmitting property with respect to visible light is used for either the pixel electrodes or the common electrode 113, and a reflective conductive film is used for the other. When the pixel electrodes are light-transmitting electrodes and the common electrode 113 is a reflective electrode, a bottom-emission display apparatus can be obtained; by contrast, when the respective pixel electrodes are reflective electrodes and the common electrode 113 is a light-transmitting electrode, a top-emission display apparatus can be obtained. Note that when both the pixel electrodes and the common electrode 113 transmit light, a dual-emission display apparatus can be obtained.

An insulating layer 131 is provided to cover end portions of the pixel electrode 111. End portions of the insulating layer 131 preferably have a tapered shape. Note that in this specification and the like, an end portion of an object having a tapered shape indicates that the end portion has a cross-sectional shape in which the angle between the surface of the object and the formation surface of the object is greater than 0° and less than 90°, and the thickness continuously increases from the end portion.

When an organic resin is used for the insulating layer 131, the surface of the insulating layer 131 can be moderately curved. Thus, coverage with a film formed over the insulating layer 131 can be improved.

Examples of materials that can be used for the insulating layer 131 include an acrylic resin, a polyimide resin, an epoxy resin, a polyamide resin, a polyimide-amide resin, a siloxane resin, a benzocyclobutene-based resin, a phenol resin, and precursors of these resins.

Note that for the insulating layer 131, an inorganic insulating material may be used. Examples of inorganic insulating materials that can be used for the insulating layer 131 include oxides and nitrides such as silicon oxide, silicon oxynitride, silicon nitride oxide, silicon nitride, aluminum oxide, aluminum oxynitride, and hafnium oxide. Yttrium oxide, zirconium oxide, gallium oxide, tantalum oxide, magnesium oxide, lanthanum oxide, cerium oxide, neodymium oxide, or the like may be used.

As illustrated in FIG. 4B, there is a gap between the two organic layers of light-emitting elements which emit light of different colors. In this manner, the organic layer 112R, the organic layer 112G, and the organic layer 112B are preferably provided so as not to be in contact with each other. This suitably prevents unintentional light emission due to a current flow through two adjacent organic layers. As a result, the contrast can be increased to achieve a display apparatus with high display quality.

The organic layer 112R, the organic layer 112G, and the organic layer 112B each preferably have a taper angle of greater than or equal to 30°. In an end portion of each of the organic layer 112R, the organic layer 112G, and the organic layer 112B, the angle between the side surface of the layer (the surface) and the bottom surface of the layer (the formation surface) is preferably greater than or equal to 30° and less than or equal to 120°, further preferably greater than or equal to 45° and less than or equal to 120°, still further preferably greater than or equal to 60° and less than or equal to 120°. Alternatively, the organic layer 112R, the organic layer 112G, and the organic layer 112B each preferably have a taper angle of 90° or a neighborhood thereof (greater than or equal to 80° and less than or equal to 100°, for example).

A protective layer 121 is provided over the common electrode 113 so as to cover the light-emitting element 90R, the light-emitting element 90G, and the light-emitting element 90B. The protective layer 121 has a function of preventing diffusion of impurities such as water into the light-emitting elements from above.

The protective layer 121 can have, for example, a single-layer structure or a stacked-layer structure including at least an inorganic insulating film. Examples of the inorganic insulating film include oxide films and nitride films such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as indium gallium oxide or indium gallium zinc oxide may be used for the protective layer 121.

As the protective layer 121, a stacked-layer film of an inorganic insulating film and an organic insulating film can be used. For example, a structure in which an organic insulating film is sandwiched between a pair of inorganic insulating films is preferable. Furthermore, the organic insulating film preferably functions as a planarization film. This structure enables the top surface of the organic insulating film to be flat, and accordingly, coverage with the inorganic insulating film thereover is improved, leading to an improvement in barrier properties. Moreover, the top surface of the protective layer 121 is flat; therefore, when a component (e.g., a color filter, an electrode of a touch sensor, a lens array, or the like) is provided above the protective layer 121, the component is less affected by an uneven shape caused by the lower structure.

In a connection portion 130, the common electrode 113 is provided over and in contact with the connection electrode 111C and the protective layer 121 is provided to cover the common electrode 113. The insulating layer 131 is provided to cover end portions of the connection electrode 111C.

In the structure illustrated in FIG. 4B, the insulating layer 131, the organic layer 114, the common electrode 113, the protective layer 121, and the like are provided in the transmission region 40. A light-transmitting material can be used for the layers that are provided in the transmission region 40. Thus, in the transmission region 40, the light 20*t* can pass through the display apparatus 100.

Structure examples of a display apparatus whose structure is partly different from that in FIG. 4B is described below.

Figure 5A:
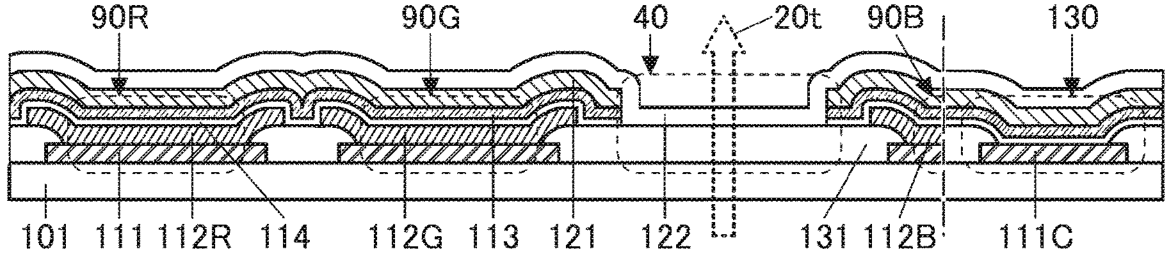
FIG. 5A to FIG. 5D are diagrams illustrating structure examples of a display apparatus.

FIG. 5A is an example in which the organic layer 114, the common electrode 113, and the protective layer 121 are not provided in the transmission region 40. With such a structure, the transmittance of the transmission region can be increased. In particular, when a film having a transmitting property and a reflective property is used for the common electrode 113, the common electrode 113 positioned in the transmission region 40 causes a decrease in the transmittance. Thus, an opening is preferably provided in the common electrode 113 in the transmission region 40 as illustrated in FIG. 5A.

The organic layer 114, the common electrode 113, and the protective layer 121 include an opening in the transmission region 40. A protective layer 122 is provided to cover the top surface and the side surface of the protective layer 121, the side surface of the common electrode 113, and the side surface of the organic layer 114. The protective layer 122 has a function of preventing diffusion of impurities such as water from the side surfaces of the common electrode 113 and the organic layer 114 to the light-emitting element 90G or the light-emitting element 90B.

For example, the structure illustrated in FIG. 5A can be manufactured in the following manner: a resist mask is formed over the protective layer 121; part of the protective layer 121, the common electrode 113, and the organic layer 114 are etched; and then the resist mask is removed; and the protective layer 122 is formed.

Figure 5B:
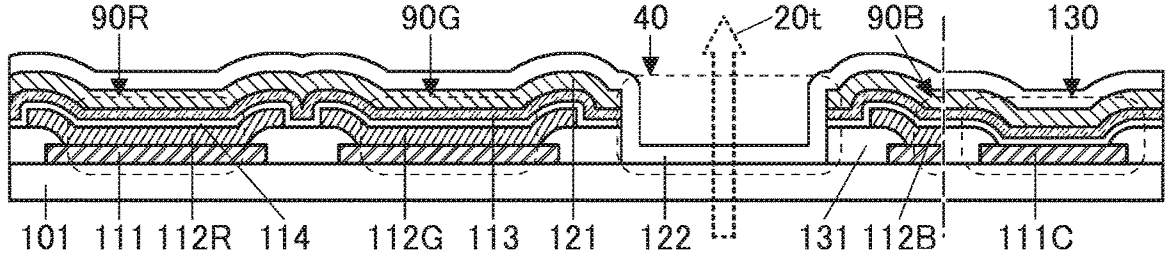
Figure 5C:
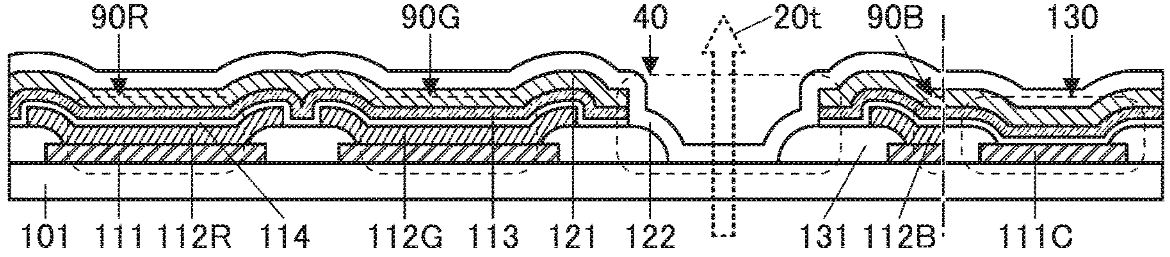
Figure 5D:
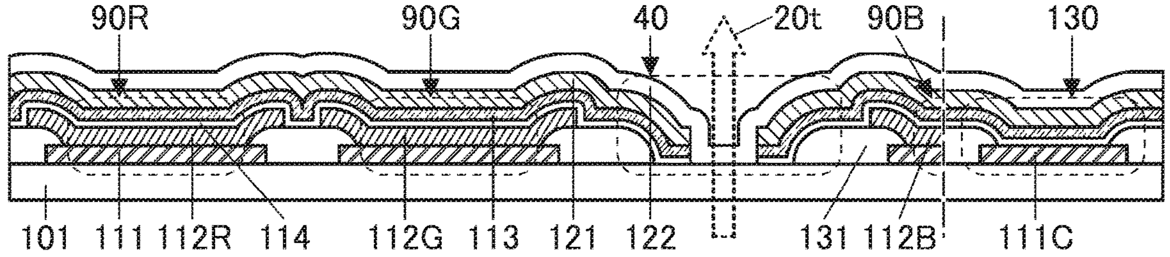

FIG. 5B, FIG. 5C, and FIG. 5D each illustrate an example in which an opening overlapping with the transmission region 40 is further provided in the insulating layer 131 in FIG. 5A.

FIG. 5B illustrates an example in which the side surface of the insulating layer 131 is substantially aligned with the side surfaces of the organic layer 114, the common electrode 113, and the protective layer 121. For example, the protective layer 121, the common electrode 113, the organic layer 114, and the insulating layer 131 can be manufactured by processing with use of the same resist mask.

FIG. 5C is an example in which the organic layer 114, the common electrode 113, and the protective layer 121 are processed such that their end portions overlap with the insulating layer 131.

FIG. 5D is an example in which each of the organic layer 114, the common electrode 113, and the protective layer 121 is processed to extend beyond the end portion of the insulating layer 131.

FIG. 6A to FIG. 8F illustrate examples in which the insulating layer 131 is not provided.

FIG. 6A to FIG. 6F illustrate examples in which the side surface of the pixel electrode 111 is substantially aligned with the side surface of the organic layer 112R, the side surface of the organic layer 112G, or the side surface of the organic layer 112B.

Figure 6A:
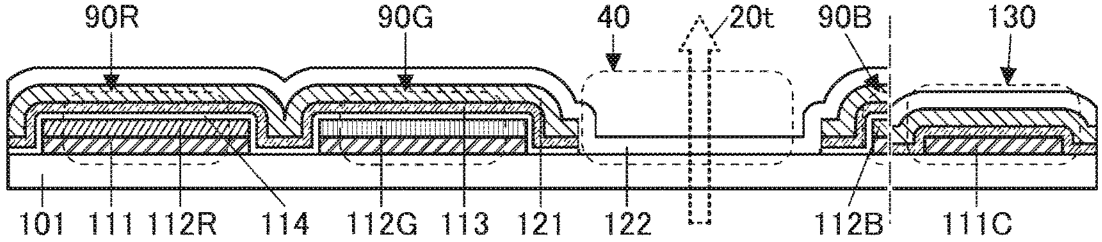
FIG. 6A to FIG. 6F are diagrams illustrating structure examples of a display apparatus.

In FIG. 6A, the organic layer 114 is provided to cover the top surfaces and the side surfaces of the organic layer 112R, the organic layer 112G, and the organic layer 112B. The organic layer 114 can prevent the pixel electrode 111 and the common electrode 113 from being in contact with each other and being electrically short-circuited.

In the example illustrated in FIG. 6A, the organic layer 114, the common electrode 113, and the protective layer 121 include an opening overlapping with the transmission region 40 and the transmission region 40 includes the protective layer 122.

Figure 6B:
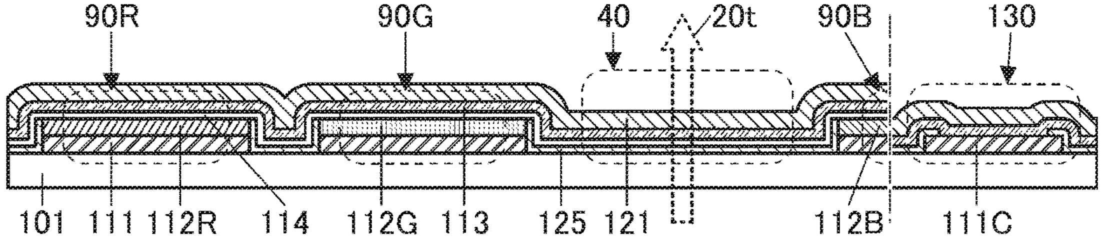

FIG. 6B illustrates an example in which an insulating layer 125 is provided to be in contact with the side surfaces of the organic layer 112R, the organic layer 112G, the organic layer 112B, and the pixel electrode 111. An electrical short circuit between the pixel electrode 111 and the common electrode 113 and a leakage current therebetween can be effectively inhibited by the insulating layer 125.

The insulating layer 125 can bean insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, when an inorganic insulating film such as an aluminum oxide film, a hafnium oxide film, or a silicon oxide film formed by an ALD method is used as the insulating layer 125, the insulating layer 125 has a small number of pinholes and excels in a function of protecting the organic layer.

Note that in this specification and the like, oxynitride refers to a material that contains more oxygen than nitrogen, and nitride oxide refers to a material that contains more nitrogen than oxygen. For example, in the case where silicon oxynitride is described, it refers to a material that contains more oxygen than nitrogen in its composition. In the case where silicon nitride oxide is described, it refers to a material that contains more nitrogen than oxygen in its composition.

The insulating layer 125 can be formed by a sputtering method, a CVD method, a PLD method, an ALD method, or the like. The insulating layer 125 is preferably formed by an ALD method with good coverage.

Note that although FIG. 6B and the like each illustrate an example in which the common electrode 113 and the like are provided in the transmission region 40, processing may be performed such that the common electrode 113 and the like are not provided in the transmission region 40.

Figure 6C:
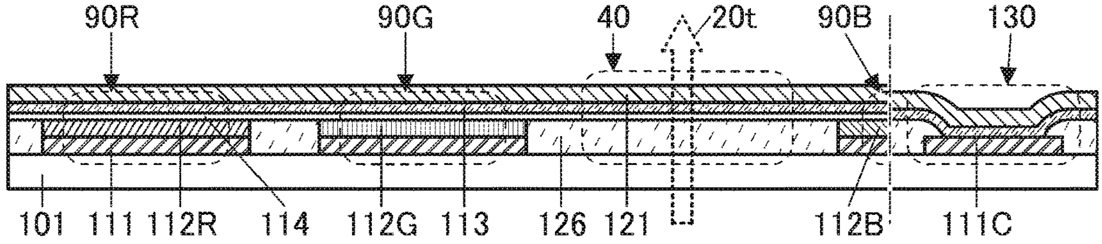
Figure 6D:
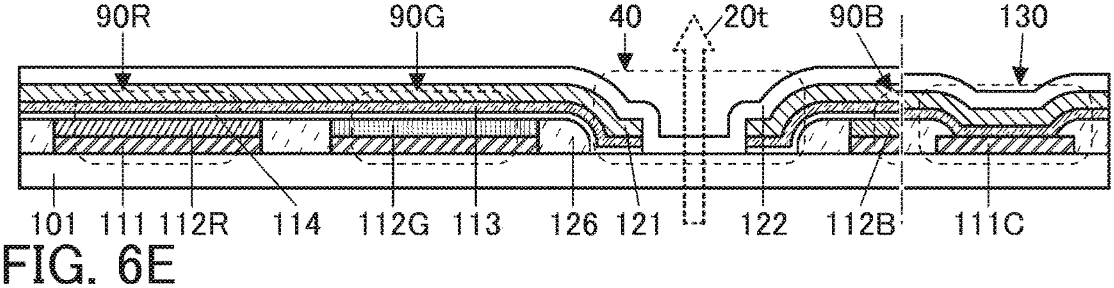

In FIG. 6C and FIG. 6D, a resin layer 126 are provided between two adjacent light-emitting elements so as to fill a space between two facing pixel electrodes and two facing organic layers. The resin layer 126 can planarize the formation surface of the organic layer 114, the common electrode 113, and the like, which can prevent disconnection of the common electrode 113 due to poor coverage in a step between the adjacent light-emitting elements.

An insulating layer containing an organic material can be suitably used for the resin layer 126. For the resin layer 126, an acrylic resin, a polyimide resin, an epoxy resin, an imide resin, a polyamide resin, a polyimide-amide resin, a silicone resin, a siloxane resin, a benzocyclobutene-based resin, a phenol resin, and a precursor of any of these resins can be used, for example. Moreover, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin may be used for the resin layer 126. Furthermore, a photosensitive resin can be used for the resin layer 126. A photoresist may be used for the photosensitive resin. As the photosensitive resin, a positive photosensitive material or a negative photosensitive material can be used.

A colored material (e.g., a material containing a black pigment) may be used for the resin layer 126 to add the function of blocking stray light from an adjacent pixel and inhibiting color mixture.

FIG. 6C illustrates an example in which the resin layer 126, the organic layer 114, the common electrode 113, the protective layer 121, and the like are provided in the transmission region 40. In this case, a material having a light-transmitting property as high as possible is preferably used for the resin layer 126.

FIG. 6D illustrates an example in which the resin layer 126 has an opening portion overlapping with the transmission region 40.

Figure 6E:
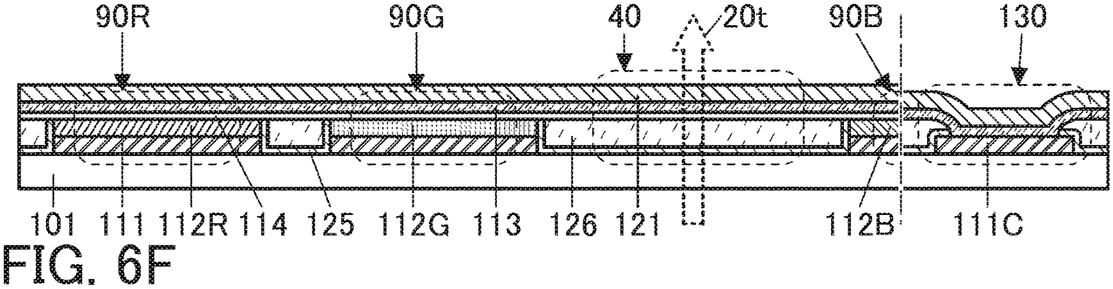
Figure 6F:
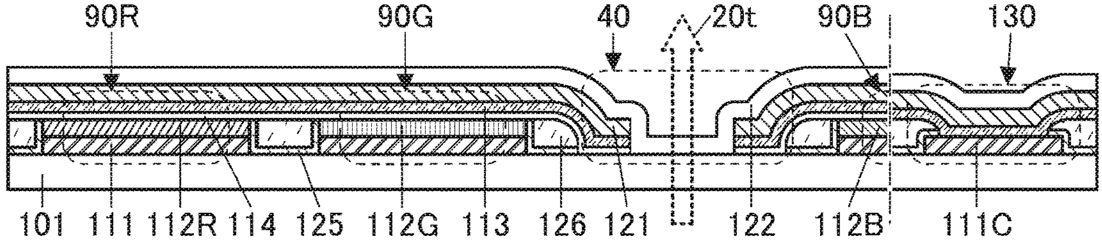

In FIG. 6E and FIG. 6F, the insulating layer 125 and the resin layer 126 over the insulating layer 125 are provided. Since the insulating layer 125 prevents the organic layer 112R or the like from being in contact with the resin layer 126, impurities such as water included in the resin layer 126 can be prevented from being diffused into the organic layer 112R or the like, whereby a highly reliable display apparatus can be provided.

A reflective film (e.g., a metal film containing one or more selected from silver, palladium, copper, titanium, and aluminum) may be provided between the insulating layer 125 and the resin layer 126 so that light emitted from the light-emitting layer is reflected by the reflective film; thus, the display apparatus 100 may be provided with a function of improving the light extraction efficiency.

FIG. 6E illustrates an example in which the insulating layer 125, the resin layer 126, the organic layer 114, the common electrode 113, the protective layer 121, and the like are provided in the transmission region 40. In this case, a material having a light-transmitting property as high as possible is preferably used for the insulating layer 125 and the resin layer 126.

FIG. 6F illustrates an example in which the insulating layer 125 and the resin layer 126 have an opening portion overlapping with the transmission region 40.

FIG. 7A to FIG. 7E illustrate examples in which the width of the pixel electrode 111 is larger than the width of the organic layer 112R, the organic layer 112G, or the organic layer 112B. The organic layer 112R or the like is positioned inward from the end portions of the pixel electrode 111.

Figure 7A:
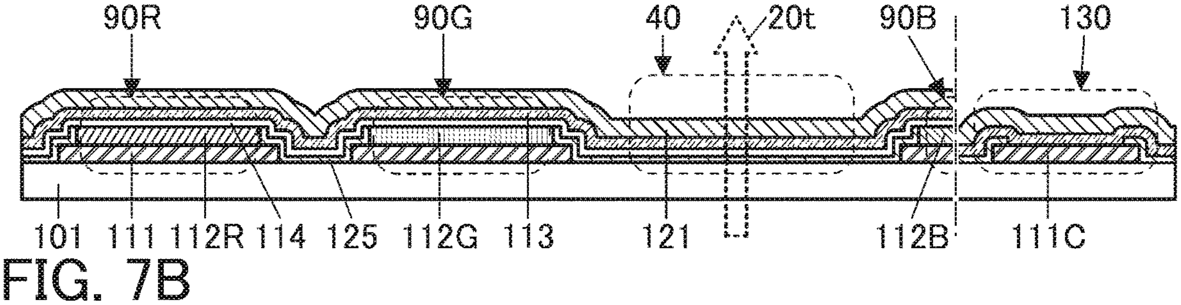
FIG. 7A to FIG. 7E are diagrams illustrating structure examples of a display apparatus.

FIG. 7A illustrates an example in which the insulating layer 125 is provided. The insulating layer 125 is provided to cover the side surfaces of the organic layers of two adjacent light-emitting elements and the side surface and part of the top surface of the pixel electrode 111.

Although FIG. 7A illustrates an example in which the insulating layer 125, the organic layer 114, the common electrode 113, the protective layer 121, and the like are provided in the transmission region 40, without limitation to this, one or more of them may include an opening overlapping with the transmission region 40.

Figure 7B:
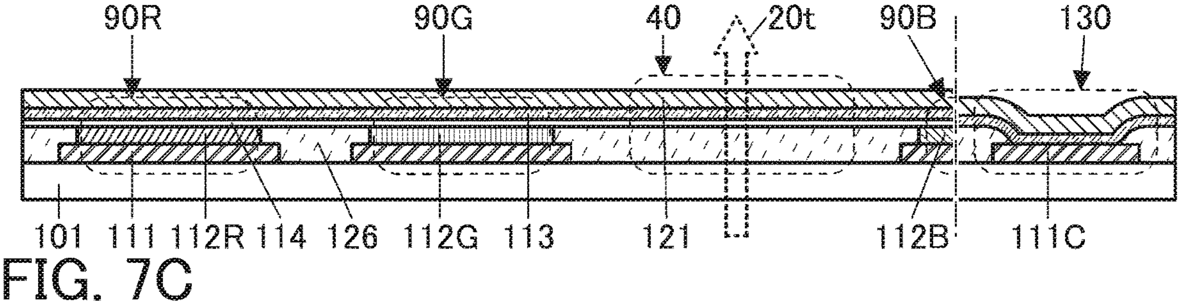
Figure 7C:
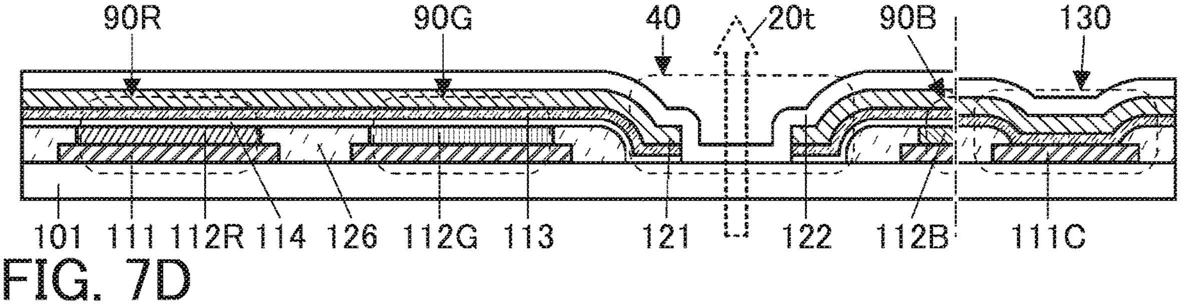

FIG. 7B and FIG. 7C illustrate examples in which the resin layer 126 is provided. The resin layer 126 is positioned between two adjacent light-emitting elements and covers the side surfaces of the organic layers and the top and side surfaces of the pixel electrode 111.

FIG. 7B illustrates an example in which the resin layer 126, the organic layer 114, the common electrode 113, the protective layer 121, and the like are provided in the transmission region 40. FIG. 7C illustrates an example in which the resin layer 126, the organic layer 114, the common electrode 113, and the protective layer 121 have an opening overlapping with the transmission region 40.

Figure 7D:
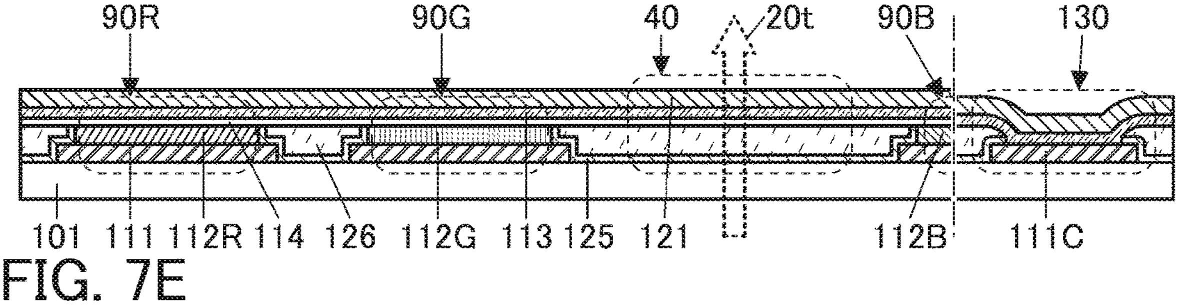
Figure 7E:
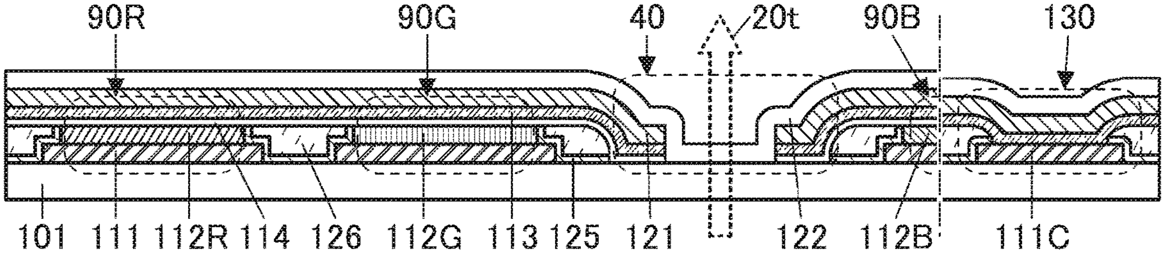

FIG. 7D and FIG. 7E illustrate examples in which both the insulating layer 125 and the resin layer 126 are provided. The insulating layer 125 is provided between the organic layer 112R or the like and the resin layer 126.

FIG. 7D illustrates an example in which the insulating layer 125, the resin layer 126, the organic layer 114, the common electrode 113, the protective layer 121, and the like are provided in the transmission region 40. FIG. 7E illustrates an example in which the insulating layer 125, the resin layer 126, the organic layer 114, the common electrode 113, and the protective layer 121 have an opening overlapping with the transmission region 40.

FIG. 8A to FIG. 8F illustrate examples in which the width of the pixel electrode 111 is smaller than the width of the organic layer 112R, the organic layer 112G, or the organic layer 112B. The organic layer 112R or the like extends to the outer side beyond the end portions of the pixel electrode 111.

Figure 8A:
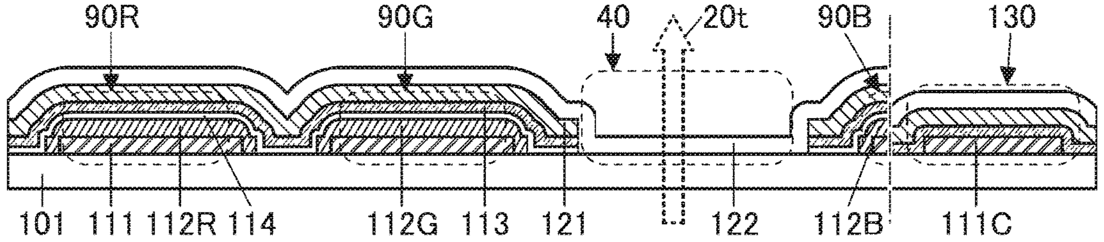
FIG. 8A to FIG. 8F are diagrams illustrating structure examples of a display apparatus.

FIG. 8A illustrates an example in which the organic layer 114, the common electrode 113, and the protective layer 121 have an opening overlapping with the transmission region 40.

Figure 8B:
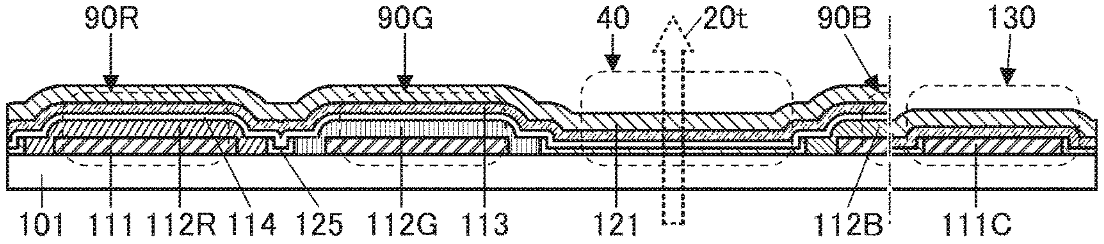

FIG. 8B illustrates an example in which the insulating layer 125 is provided. The insulating layer 125 is provided in contact with the side surfaces of the organic layers of two adjacent light-emitting elements. Note that the insulating layer 125 may be provided to cover not only the side surface but also part of the top surface of the organic layer 112R or the like.

Although FIG. 8B illustrates an example in which the insulating layer 125, the organic layer 114, the common electrode 113, the protective layer 121, and the like are provided in the transmission region 40, without limitation to this, one or more of them may include an opening overlapping with the transmission region 40.

Figure 8C:
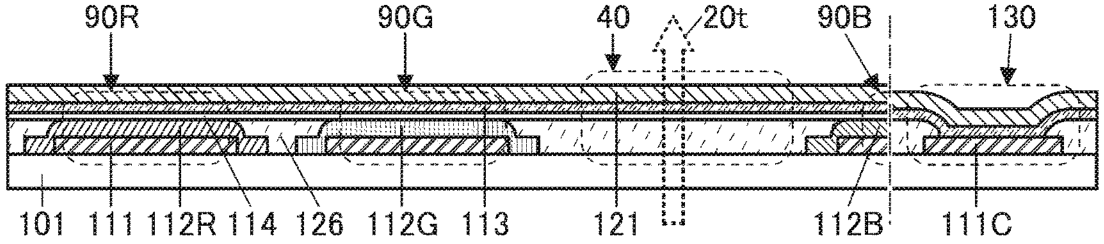
Figure 8D:
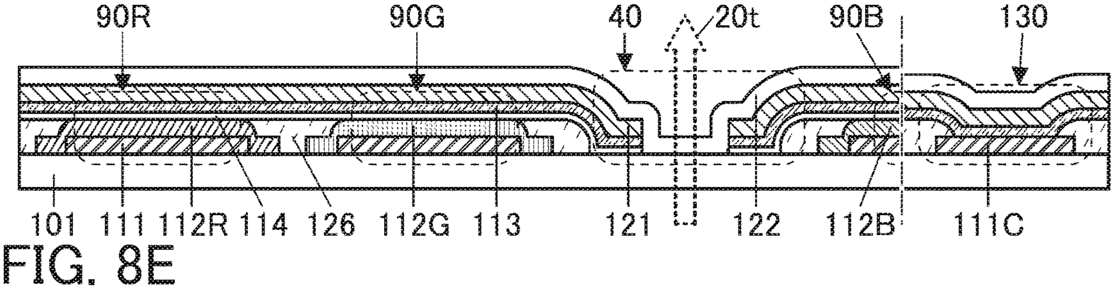

FIG. 8C and FIG. 8D illustrate examples in which the resin layer 126 is provided. The resin layer 126 is positioned between two adjacent light-emitting elements and covers the side surface and part of the top surface of the organic layer 112R or the like. Note that the resin layer 126 may be formed to be in contact with the side surface of the organic layer 112R or the like and not to cover the top surface thereof.

FIG. 8C illustrates an example in which the resin layer 126, the organic layer 114, the common electrode 113, the protective layer 121, and the like are provided in the transmission region 40. FIG. 8D illustrates an example in which the resin layer 126, the organic layer 114, the common electrode 113, and the protective layer 121 have an opening overlapping with the transmission region 40.

Figure 8E:
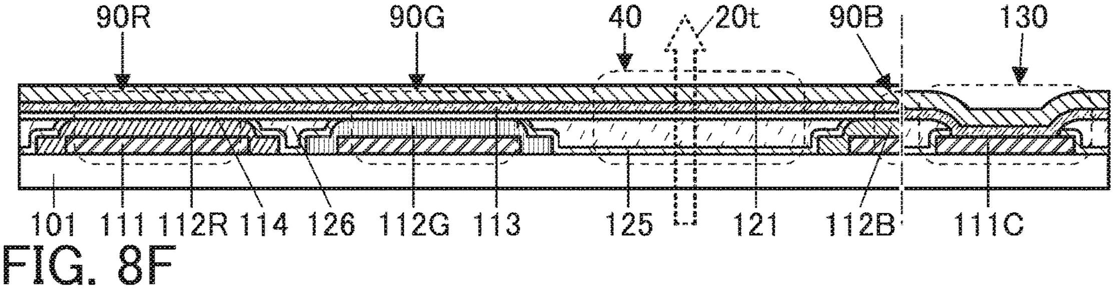
Figure 8F:
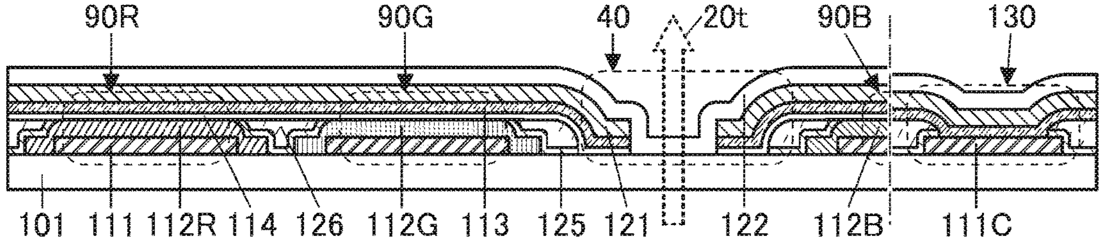

FIG. 8E and FIG. 8F illustrate examples in which both the insulating layer 125 and the resin layer 126 are provided. The insulating layer 125 is provided between the organic layer 112R or the like and the resin layer 126.

FIG. 8E illustrates an example in which the insulating layer 125, the resin layer 126, the organic layer 114, the common electrode 113, the protective layer 121, and the like are provided in the transmission region 40. FIG. 8F illustrates an example in which the insulating layer 125, the resin layer 126, the organic layer 114, the common electrode 113, and the protective layer 121 have an opening overlapping with the transmission region 40.

Here, a structure example of the resin layer 126 is described.

The top surface of the resin layer 126 is preferably as flat as possible; however, the surface of the resin layer 126 may be concave or convex depending on an uneven shape of the formation surface of the resin layer 126, the formation conditions of the resin layer 126, or the like.

Figure 9A:
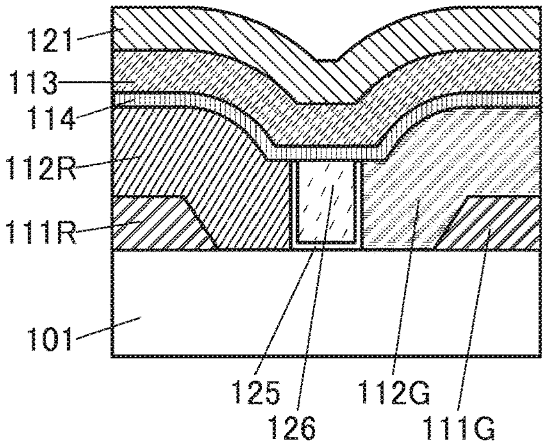
FIG. 9A to FIG. 9F are diagrams illustrating structure examples of a display apparatus.
Figure 9B:
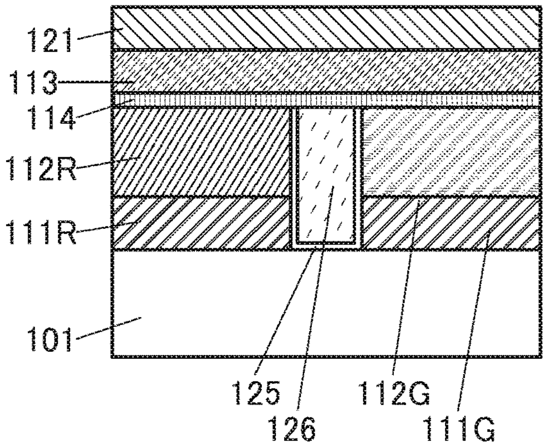
Figure 9C:
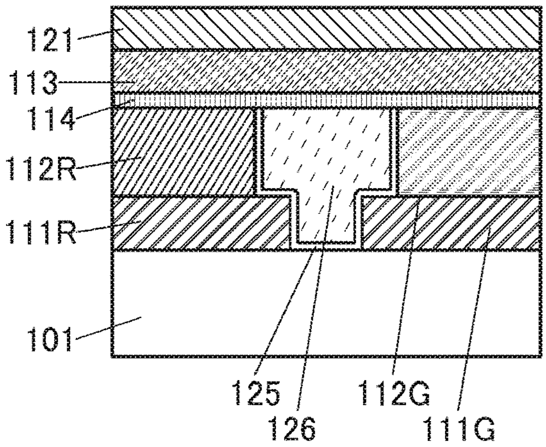

FIG. 9A, FIG. 9B, and FIG. 9C are each an enlarged view of the resin layer 126 and the vicinity thereof in the case where the top surface of the resin layer 126 is flat. FIG. 9A is an example in which the organic layer 112R or the like has a larger width than the pixel electrode 111. FIG. 9B is an example in which the width of the organic layer 112R or the like and the width of the pixel electrode 111 are substantially aligned. FIG. 9C is an example in which the organic layer 112R or the like has a smaller width than the pixel electrode 111.

The organic layer 112R is provided to cover the end portion of the pixel electrode 111 as illustrated in FIG. 9A, so that the end portion of the pixel electrode 111 is preferably tapered. Accordingly, the step coverage with the organic layer 112R is improved and a highly reliable display apparatus can be provided.

Figure 9D:
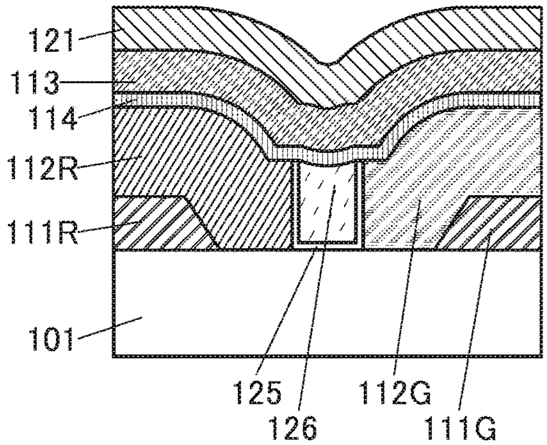
Figure 9E:
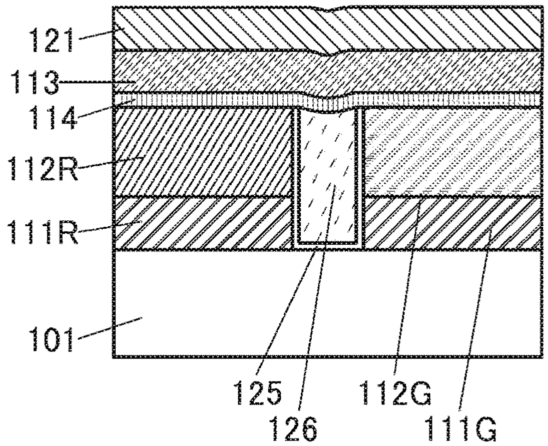
Figure 9F:
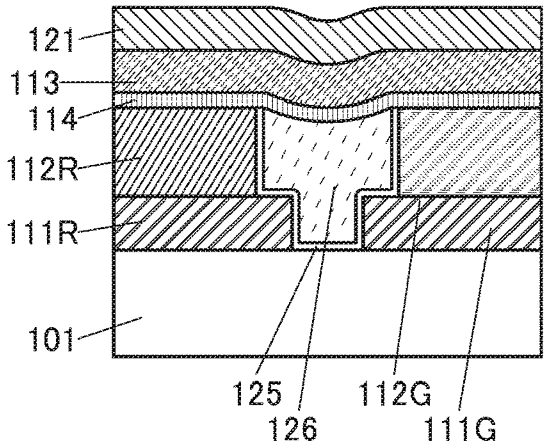

FIG. 9D, FIG. 9E, and FIG. 9F illustrate examples in which the top surface of the resin layer 126 is concave. In this case, a concave portion that reflects the concave top surface of the resin layer 126 is formed on each of the top surfaces of the organic layer 114, the common electrode 113, and the protective layer 121.

Figure 10A:
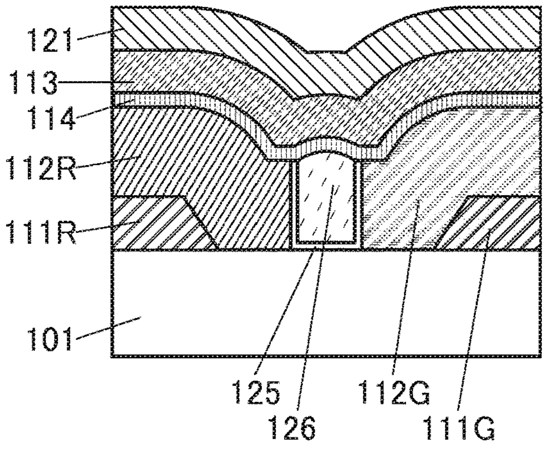
FIG. 10A to FIG. 10F are diagrams illustrating structure examples of a display apparatus.
Figure 10D:
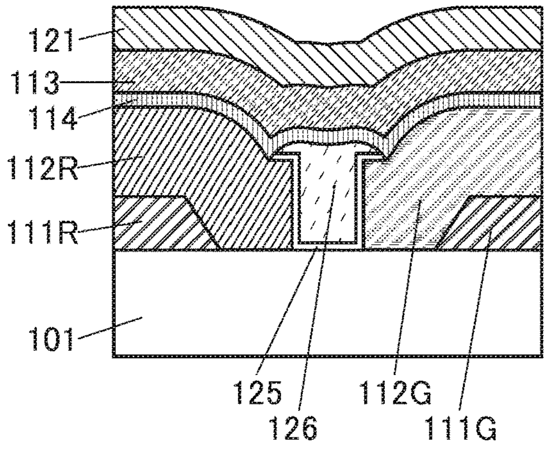
Figure 10B:
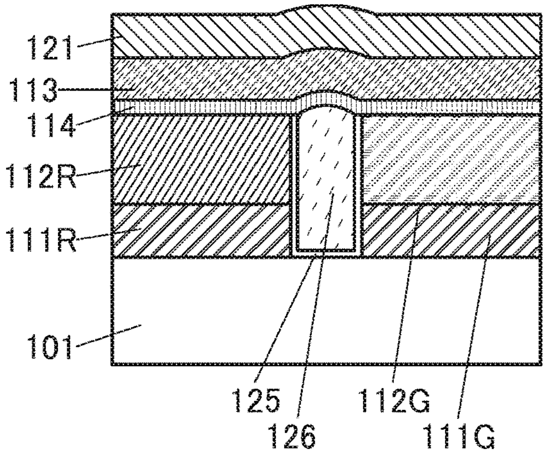
Figure 10E:
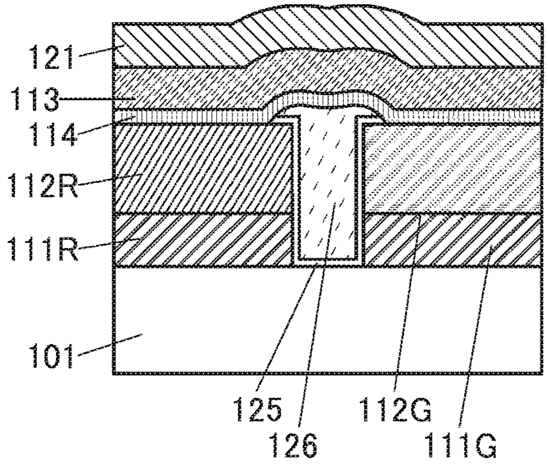
Figure 10C:
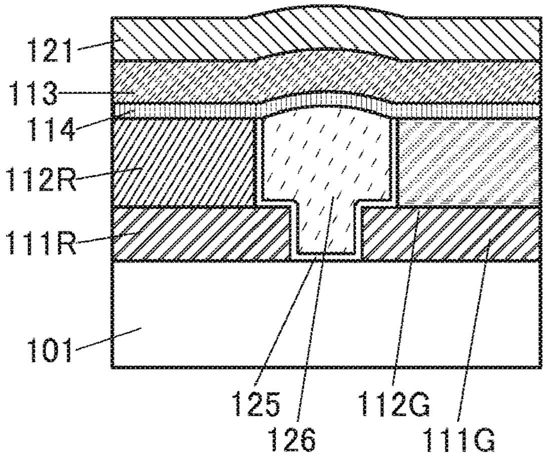

FIG. 10A, FIG. 10B, and FIG. 10C illustrate examples in which the top surface of the resin layer 126 is convex. In this case, a convex portion that reflects the convex top surface of the resin layer 126 is formed on each of the top surfaces of the organic layer 114, the common electrode 113, and the protective layer 121.

Figure 10F:
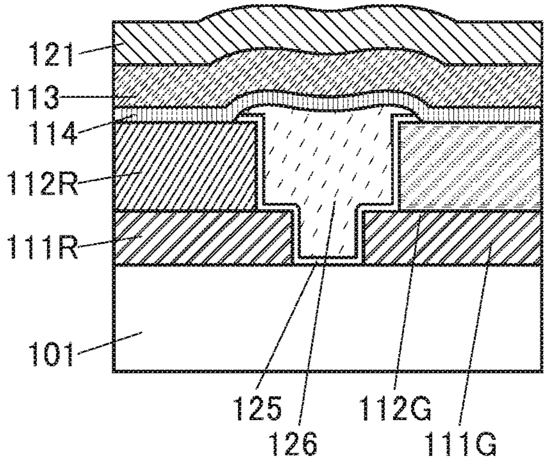

FIG. 10D, FIG. 10E, and FIG. 10F illustrate examples in which part of the resin layer 126 covers an upper end portion and part of the top surface of the organic layer 112R and an upper end portion and part of the top surface of the organic layer 112G. In this case, the insulating layer 125 is provided between the resin layer 126 and the top surface of the organic layer 112R or the organic layer 112G.

FIG. 10D, FIG. 10E, and FIG. 10F illustrate examples in which part of the top surface of the resin layer 126 is concave. In this case, unevenness that reflects the shape of the resin layer 126 is formed on each of the organic layer 114, the common electrode 113, and the protective layer 121.

[Pixel Structure Example]

Structure examples of a pixel are described below.

FIG. 11A1 is a schematic top view of one pixel 30 seen from the display surface side. The pixel 30 includes three subpixels each including the light-emitting element 90R, the light-emitting element 90G, or the light-emitting element 90B. Each subpixel includes a transistor 61 and a transistor 62. The pixel 30 includes a wiring 51, a wiring 52, a wiring 53, and the like.

The wiring 51 serves as a scan line, for example. The wiring 52 serves as a signal line, for example. The wiring 53 serves as a line for supplying a potential to the light-emitting element, for example. The wiring 51 and the wiring 52 have a portion where they intersect with each other. An example in which the wiring 53 is parallel to the wiring 52 is illustrated here. The wiring 53 may be parallel to the wiring 51.

The transistor 61 is a transistor serving as a selection transistor. A gate of the transistor 61 is electrically connected to the wiring 51, and one of a source and a drain thereof is electrically connected to the wiring 52. The transistor 62 is a transistor that controls a current flowing through the light-emitting element and can also be referred to as a driving transistor. One of a source and a drain of the transistor 62 is electrically connected to the wiring 53, and the other is electrically connected to the light-emitting element.

In FIG. 11A1, the light-emitting element 90R, the light-emitting element 90G, and the light-emitting element 90B have stripe shapes long in the vertical direction and are arranged in a stripe.

Here, the wiring 51, the wiring 52, and the wiring 53 have a light-blocking property. For other layers, i.e., layers constituting the transistor 61, the transistor 62, and the like, light-transmitting films are used. The pixel 30 illustrated in FIG. 11A1 is divided into a transmission region 30*t* that transmits visible light and a light-blocking region 30*s* that blocks visible light, which are illustrated in the example of FIG. 11A2. The entire portion except a portion including wirings is the transmission region 30*t* like this, whereby visibility in see-through display can be improved.

FIG. 11B1 and FIG. 11B2 illustrate an example in which the pixel 30 includes four subpixels including a light-emitting element 90W in addition to the light-emitting element 90R, the light-emitting element 90G, and the light-emitting element 90B. The light-emitting element 90W can be a light-emitting element that emits white light, for example. In the example illustrated in FIG. 11B1 and FIG. 11B2, the light-emitting elements are arranged in two columns and two rows in one pixel 30. In FIG. 11B1, the two wirings 51, the two wirings 52, and the two wirings 53 are provided in the pixel 30.

A region overlapping with the wirings is the light-blocking region 30*s*, and a region not overlapping with the wirings is the transmission region 30*t*, as illustrated in FIG. 11B2.

The higher the proportion of the area of the transmission region to the area of the display region is, the larger the amount of the transmission light can be. The proportion of the area of the transmission region to the area of the entire display region is, for example, higher than or equal to 1% and lower than or equal to 95%, preferably higher than or equal to 10% and lower than or equal to 90%, further preferably higher than or equal to 20% and lower than or equal to 80%. A particularly preferable proportion is higher than or equal to 40% or higher than or equal to 50%.

FIG. 12A1 and FIG. 12A2 illustrate an example in which the wiring 51, the wiring 52, and the wiring 53 of FIG. 11A1 and FIG. 12A2 have a light-transmitting property. FIG. 12B1 and FIG. 12B2 illustrate an example in which the wiring 51, the wiring 52, and the wiring 53 of FIG. 11B1 and FIG. 12B2 have a light-transmitting property. Thus, the entire region of the pixel 30 can be the transmission region 30*t*, as illustrated in FIG. 12A2 and FIG. 12B2.

Example 2 of Pixel Layout Method

An example of a pixel arrangement method suitable for a high-resolution display apparatus is described below.

In the structure described below, a display apparatus in which pixels including light-emitting elements provide resolution higher than or equal to 500 ppi, higher than or equal to 1000 ppi, higher than or equal to 2000 ppi, higher than or equal to 3000 ppi, or higher than or equal to 5000 ppi can be achieved, for example.

[Structure Example of Pixel Circuit]

Figure 13A:
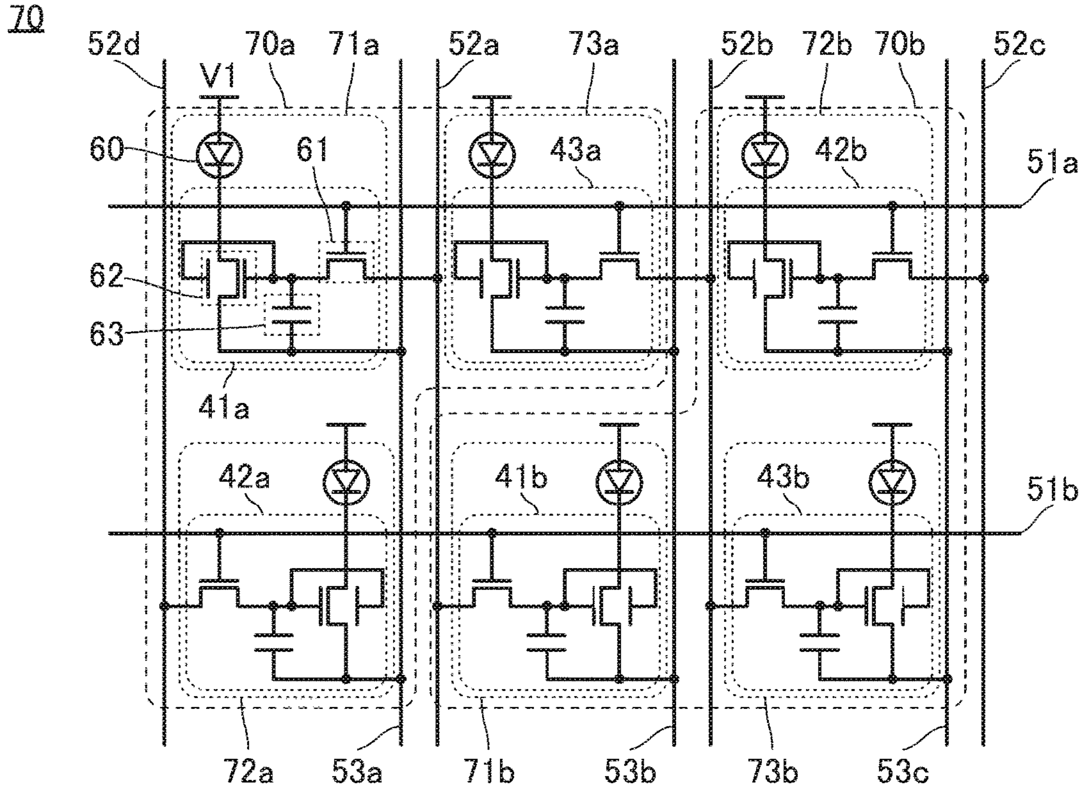
FIG. 13A and FIG. 13B are diagrams illustrating structure examples of a display apparatus.

FIG. 13A illustrates an example of a circuit diagram of a pixel unit 70. The pixel unit 70 is composed of two pixels (a pixel 70*a* and a pixel 70*b*). In addition, the pixel unit 70 is connected to a wiring 51*a*, a wiring 51*b*, a wiring 52*a*, a wiring 52*b*, a wiring 52*c*, a wiring 52*d*, a wiring 53*a*, a wiring 53*b*, and a wiring 53*c* and the like.

The pixel 70*a* includes a subpixel 71*a*, a subpixel 72*a*, and a subpixel 73*a*. The pixel 70*b* includes a subpixel 71*b*, a subpixel 72*b*, and a subpixel 73*b*. The subpixel 71*a*, the subpixel 72*a*, and the subpixel 73*a* include a pixel circuit 41*a*, a pixel circuit 42*a*, and a pixel circuit 43*a*, respectively. The subpixel 71*b*, the subpixel 72*b*, and the subpixel 73*b* include a pixel circuit 41*b*, a pixel circuit 42*b*, and a pixel circuit 43*b*, respectively.

Each subpixel includes the pixel circuit and a display element 60. For example, the subpixel 71*a* includes the pixel circuit 41*a* and the display element 60. A light-emitting element such as an organic EL element is used here as the display element 60.

The wiring 51*a* and the wiring 51*b* each have a function as a scan line (also referred to as a gate line). The wiring 52*a*, the wiring 52*b*, the wiring 52*c*, and the wiring 52*d* each have a function as a signal line (also referred to as a source line or a data line). The wiring 53*a*, the wiring 53*b*, and the wiring 53*c* each have a function of a power supply line for supplying a potential to the display element 60.

The pixel circuit 41*a* is electrically connected to the wiring 51*a*, the wiring 52*a*, and the wiring 53*a*. The pixel circuit 42*a* is electrically connected to the wiring 51*b*, the wiring 52*d*, and the wiring 53*a*. The pixel circuit 43*a* is electrically connected to the wiring 51*a*, the wiring 52*b*, and the wiring 53*b*. The pixel circuit 41*b* is electrically connected to the wiring 51*b*, the wiring 52*a*, and the wiring 53*b*. The pixel circuit 42*b* is electrically connected to the wiring 51*a*, the wiring 52*c*, and the wiring 53*c*. The pixel circuit 43*b* is electrically connected to the wiring 51*b*, the wiring 52*b*, and the wiring 53*c*.

With the structure illustrated in FIG. 13A in which two gate lines are connected to one pixel, the number of source lines can be conversely reduced by half as compared with that in stripe arrangement. As a result, the number of ICs used as source driver circuits can be reduced by half and the number of components can be reduced.

One wiring functioning as a signal line is preferably connected to pixel circuits corresponding to the same color. For example, when a signal with an adjusted potential is supplied to the wiring to correct for variation in luminance between pixels, the correction value may greatly vary between colors. Thus, when pixel circuits connected to one signal line are pixel circuits corresponding to the same color, the correction can be performed easily.

In addition, each pixel circuit includes the transistor 61, the transistor 62, and a capacitor 63. In the pixel circuit 41*a*, for example, a gate of the transistor 61 is electrically connected to the wiring 51*a*, one of a source and a drain of the transistor 61 is electrically connected to the wiring 52*a*, and the other of the source and the drain is electrically connected to a gate of the transistor 62 and one electrode of the capacitor 63. One of a source and a drain of the transistor 62 is electrically connected to one electrode of the display element 60, and the other of the source and the drain is electrically connected to the other electrode of the capacitor 63 and the wiring 53*a*. The other electrode of the display element 60 is electrically connected to a wiring to which a potential V1 is applied.

Note that, as illustrated in FIG. 13A, the other pixel circuits are similar to the pixel circuit 41*a* except for the wiring to which the gate of the transistor 61 is connected, the wiring to which one of the source and the drain of the transistor 61 is connected, and the wiring to which the other electrode of the capacitor 63 is connected.

In FIG. 13A, the transistor 61 functions as a selection transistor. The transistor 62 is in a series connection with the display element 60 and has a function of controlling a current flowing into the display element 60. The capacitor 63 has a function of holding the potential of a node connected to the gate of the transistor 62. Note that the capacitor 63 does not have to be intentionally provided in the case where an off-state leakage current of the transistor 61, a leakage current through the gate of the transistor 62, and the like are extremely small.

The transistor 62 preferably includes a first gate and a second gate electrically connected to each other as illustrated in FIG. 13A. This structure with the two gates can increase the amount of current that the transistor 62 can carry. Such a structure is particularly preferable for a high-resolution display apparatus because the amount of current can be increased without increasing the size, the channel width in particular, of the transistor 62.

Note that the transistor 62 may have one gate. This structure eliminates the need for forming the second gate and thus can simplify the process as compared with the above structure. The transistor 61 may have two gates. This structure enables a reduction in size of each transistor. A first gate and a second gate of each transistor can be electrically connected to each other. Alternatively, one gate may be electrically connected not to the other gate but to another wiring. In this case, threshold voltages of the transistors can be controlled by varying potentials that are applied to the two gates.

One of a pair of electrodes of the display element 60 that is electrically connected to the transistor 62 corresponds to a pixel electrode (e.g., the conductive layer 91). FIG. 13A illustrates a structure where an electrode of the display element 60 that is electrically connected to the transistor 62 is a cathode and the opposite electrode is an anode. This structure is particularly effective when the transistor 62 is an n-channel transistor. That is, when the transistor 62 is on, the potential applied through the wiring 53*a* is a source potential; accordingly, the amount of current flowing into the transistor 62 can be constant regardless of variation and change in resistance of the display element 60. Alternatively, a p-channel transistor may be used as a transistor of the pixel circuit.

Note that although a pixel circuit having a simple structure including two transistors and one capacitor is described as an example, the structure of the pixel circuit is not limited thereto; a variety of structures that include a selection transistor and a driving transistor can be employed.

[Example of Pixel Electrode Layout Method]

Figure 13B:
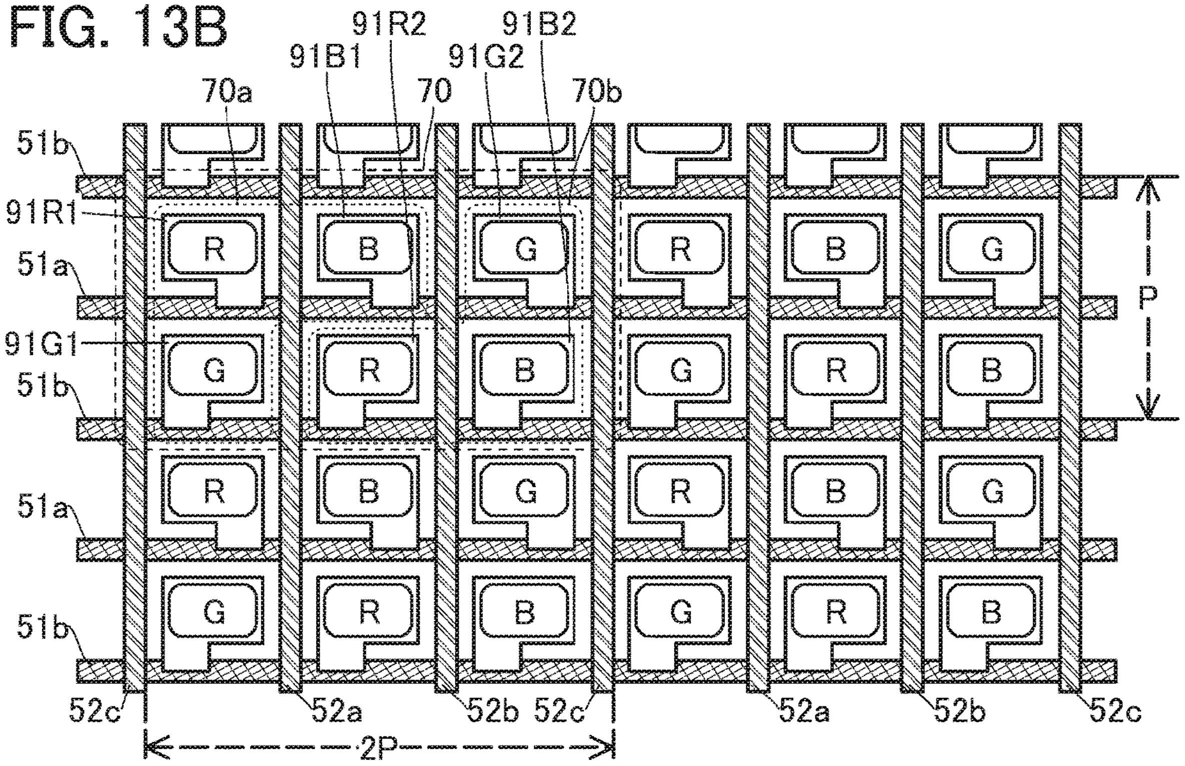

FIG. 13B is a schematic top view illustrating an example of a layout method of pixel electrodes and wirings in the display region. The wirings 51*a* and the wirings 51*b* are alternately arranged. The wiring 52*a*, the wiring 52*b*, and the wiring 52*c*, which intersect with the wirings 51*a* and the wirings 51*b*, are arranged in this order. The pixel electrodes are arranged in a matrix in the extending direction of the wirings 51*a* and wirings 51*b*.

The pixel unit 70 includes the pixel 70*a* and the pixel 70*b*. The pixel 70*a* includes a pixel electrode 91R1, a pixel electrode 91G1, and a pixel electrode 91B1. The pixel 70*b* includes a pixel electrode 91R2, a pixel electrode 91G2, and a pixel electrode 91B2. A display region of a subpixel is inside the pixel electrode of the subpixel.

As illustrated in FIG. 13B, when a pitch of the pixel units 70 arranged in the extending direction of the wiring 52*a* or the like (also referred to as the first direction) is denoted as P, a pitch of the pixel units 70 arranged in the extending direction of the wiring 51*a* or the like (also referred to as the second direction) is preferably twice the pitch (the pitch 2P). In that case, distortion-free images can be displayed. The pitch P can be longer than or equal to 1 μm and shorter than or equal to 150 μm, preferably longer than or equal to 2 μm and shorter than or equal to 120 μm, further preferably longer than or equal to 3 μm and shorter than or equal to 100 μm, and still further preferably longer than or equal to 4 μm and shorter than or equal to 60 μm. In that case, the display apparatus with extremely high resolution can be obtained.

It is preferable that the pixel electrode 91R1 or the like should not overlap with the wiring 52*a* or the like serving as a signal line, for example. This can inhibit change in luminance of the display element, which is caused by change in potential of the pixel electrode 91R1 and the like due to transmission of electrical noise through capacitance between, for example, the wiring 52*a* and the pixel electrode 91R1.

The pixel electrode 91R1 or the like may overlap with the wiring 51*a* or the like serving as a scan line. This can increase the area of the pixel electrode 91R1 and thus increase the aperture ratio. FIG. 13B illustrates an example where part of the pixel electrode 91R1 overlaps with the wiring 51*a*.

When the pixel electrode 91R1 or the like of a subpixel overlaps with the wiring 51*a* or the like serving as a scan line, the wiring is preferably connected to a pixel circuit of the subpixel. For example, a period in which a signal for changing the potential of the wiring 51*a* or the like is input corresponds to a period in which data of the subpixel is rewritten. Thus, if electrical noise is transmitted from the wiring 51*a* or the like to the pixel electrode via capacitance, luminance of the subpixel does not change.

Example 1 of Pixel Layout

A layout example of the pixel unit 70 is described below.

Figure 14A:
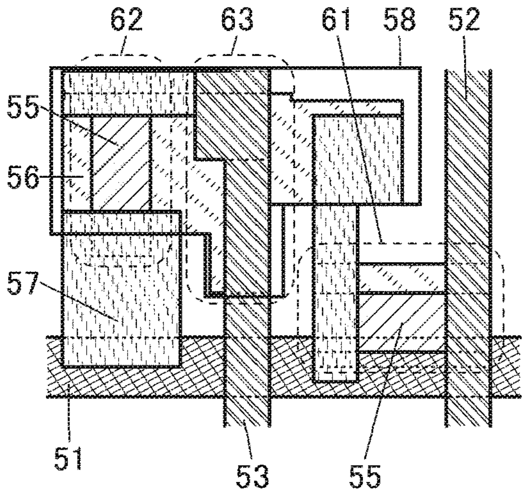
FIG. 14A to FIG. 14D are diagrams illustrating structure examples of a display apparatus.

FIG. 14A is a layout example of a subpixel. The example shows, for easy viewing, a state before a pixel electrode is formed. The subpixel illustrated in FIG. 14A includes the transistor 61, the transistor 62, and the capacitor 63. The transistor 61 is a bottom-gate channel-etched transistor. The transistor 62 includes two gates with a semiconductor layer therebetween.

A conductive layer 56 at a lower position forms lower gate electrodes of the transistor 61 and the transistor 62, one electrode of the capacitor 63, and the like. A conductive layer formed after the conductive layer 56 forms the wiring 51. A conductive layer 57 formed thereafter forms one of a source electrode and a drain electrode of the transistor 61, a source electrode and a drain electrode of the transistor 62, and the like. A conductive layer formed after the conductive layer 57 forms the wiring 52, the wiring 53, and the like. A conductive layer 58 formed thereafter forms an upper gate electrode of the transistor 62. Part of the wiring 52 serves as the other of the source electrode and the drain electrode of the transistor 61. Part of the wiring 53 serves as the other electrode of the capacitor 63. Note that for easy viewing, the conductive layer 58 is shown just with its outline without a hatching pattern.

A semiconductor layer 55, the conductive layer 56, the conductive layer 57, and the conductive layer 58 that are included in the transistors each have a light-transmitting property. By contrast, the wiring 51, the wiring 52, and the wiring 53 each have a light-blocking property.

Figure 14B:
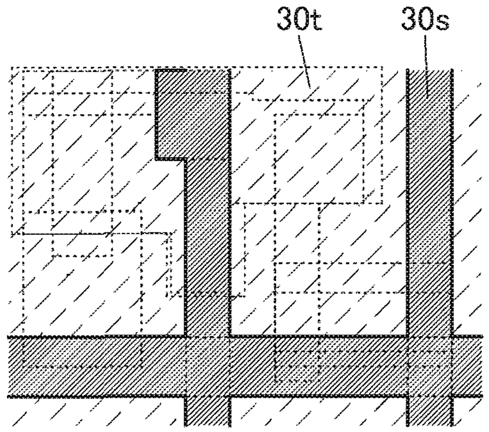

In FIG. 14B, the transmission region 30*t* and the light-blocking region 30*s* in the subpixel illustrated in FIG. 14A are separately illustrated. In this manner, the transistor 61, the transistor 62, and the like have a light-transmitting property; accordingly, visibility in see-through display can be improved.

For example, such a structure allows the proportion of the area of the transmission region 30*t* (also referred to as a transmission area ratio) to be higher than or equal to 50%. The structures illustrated in FIG. 14A and FIG. 14B achieve a transmission area ratio higher than or equal to approximately 66.1%.

Figure 14C:
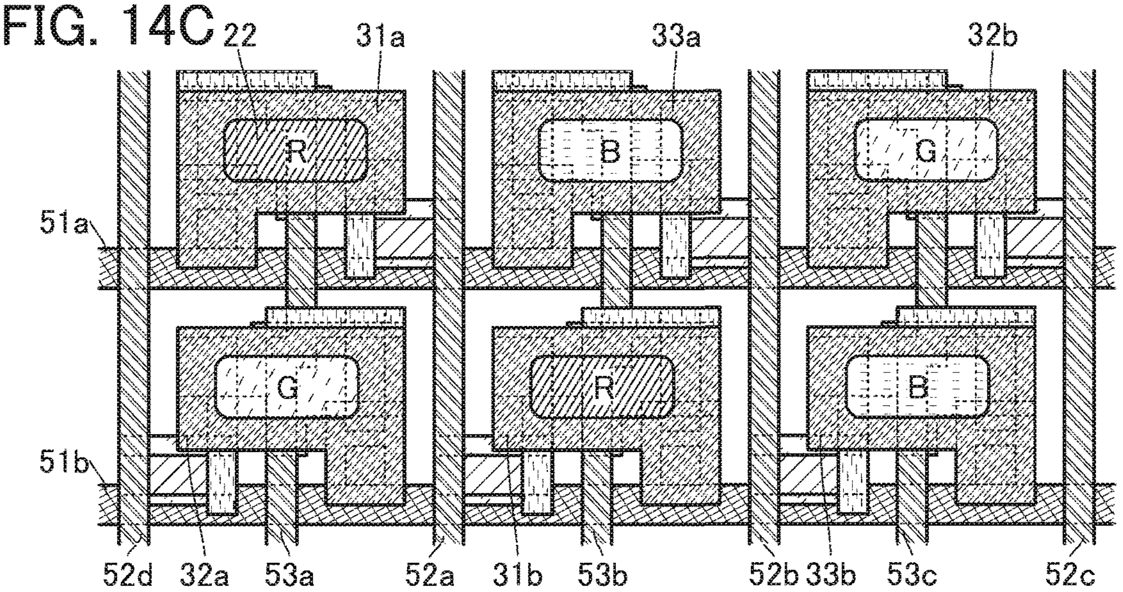
Figure 14D:
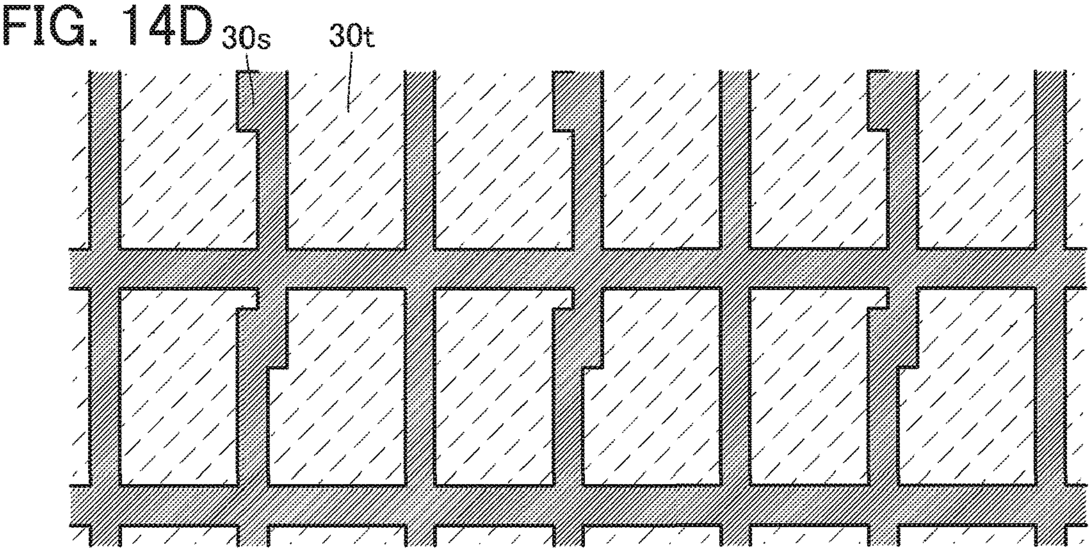

FIG. 14C is a layout example of the pixel unit 70 including the subpixel illustrated in FIG. 14A. FIG. 14C also illustrates pixel electrodes and display regions 22. In this example, a dual-emission light-emitting element is used as the light-emitting element, and FIG. 14C is a schematic top view seen from the display surface side. In FIG. 14D, the transmission region 30*t* and the light-blocking region 30*s* in FIG. 14C are separately illustrated.

In this example, three subpixels electrically connected to the wiring 51*a* and three subpixels electrically connected to the wiring 51*b* are each laterally inverted. Therefore, in the structure in which same-color subpixels are arranged in a zigzag pattern in the extending direction of the wiring 52*a* or the like and are connected to one wiring serving as a signal line, wirings in the subpixels can have uniform length, so that variation in luminance between the subpixels can be inhibited.

With use of such a pixel layout, a display apparatus with extremely high resolution can be fabricated even in a production line in which the minimum feature size is greater than or equal to 0.5 μm and smaller than or equal to 6 μm, typically greater than or equal to 1.5 μm and smaller than or equal to 4 μm, for example.

Example 2 of Pixel Layout

Figure 15A:
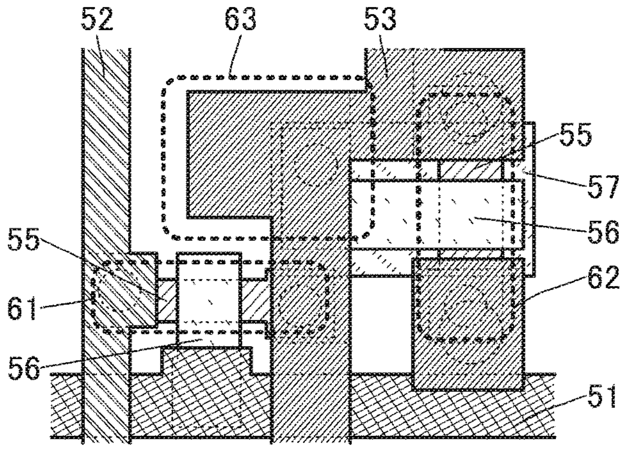
FIG. 15A to FIG. 15D are diagrams illustrating structure examples of a display apparatus.
Figure 15B:
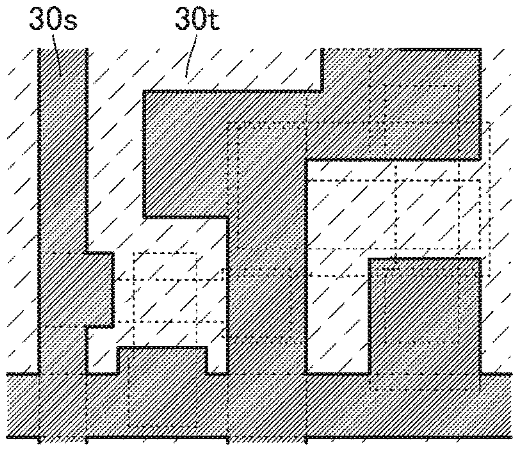

FIG. 15A and FIG. 15B illustrate layout examples that are different from those in FIG. 14A and FIG. 14B.

The transistor 61 is a top-gate transistor. The transistor 62 is a transistor having the two gates with the semiconductor layer therebetween.

In FIG. 15A, the conductive layer 57 positioned on the lower side forms one gate electrode of the transistor 62, and the semiconductor layer 55 is formed after the conductive layer 57. The conductive layer 56 formed after the conductive layer 57 and the semiconductor layer 55 forms a gate electrode of the transistor 61 and the other gate electrode of the transistor 62. A conductive layer formed after the conductive layer 56 forms the wiring 51 and the like. A conductive layer formed thereafter forms the wiring 52, one electrode of the capacitor 63, and the like. A conductive layer formed thereafter forms the wiring 53 and the like.

The semiconductor layer 55, the conductive layer 56, and the conductive layer 57 have a light-transmitting property. The structures illustrated in FIG. 15A and FIG. 15B achieve a transmission area ratio higher than or equal to approximately 37.1%.

The transistor 61 includes the semiconductor layer 55 provided over the wiring 51, part of the wiring 52, and the like. The transistor 62 includes the conductive layer 57, the semiconductor layer 55 over the conductive layer 57, the wiring 53, and the like. The capacitor 63 includes part of the wiring 53 and a conductive layer that is formed on the same plane as the wiring 52.

Figure 15C:
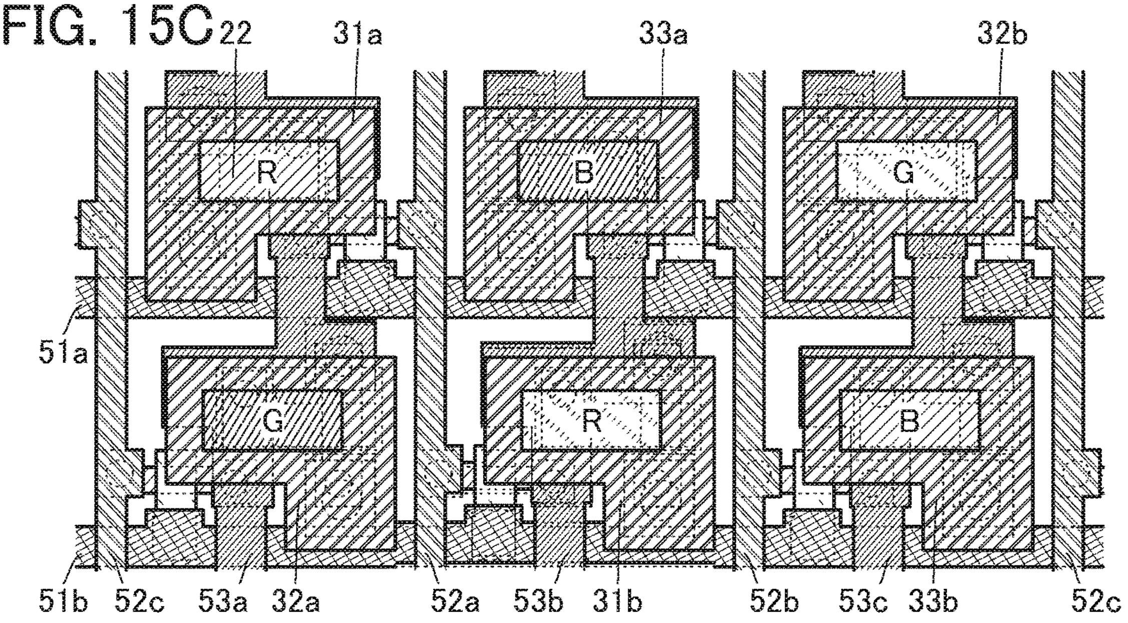
Figure 15D:
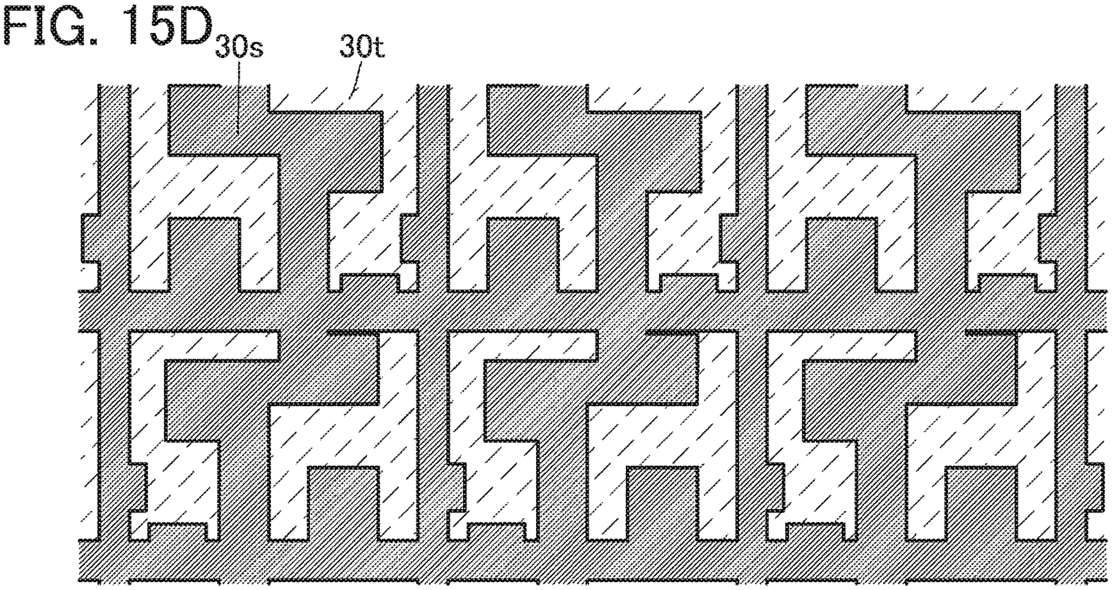

FIG. 15C and FIG. 15D illustrate a structure example of a pixel unit using the subpixel illustrated in FIG. 15A.

Example 3 of Pixel Layout

Figure 16A:
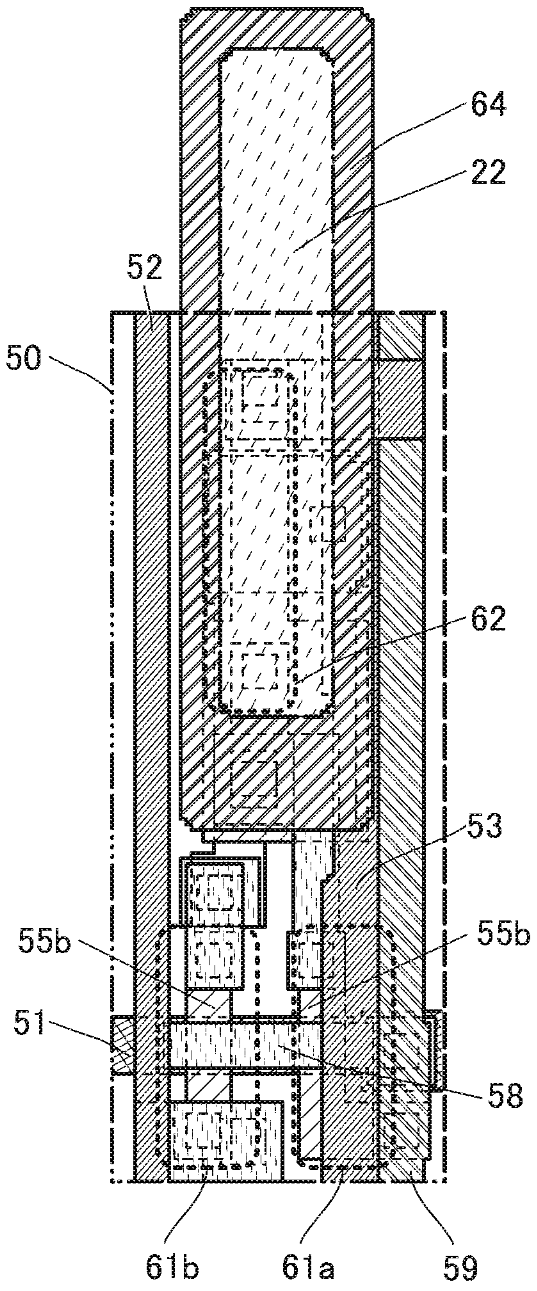
FIG. 16A and FIG. 16B are diagrams illustrating a structure example of a display apparatus.
Figure 16B:
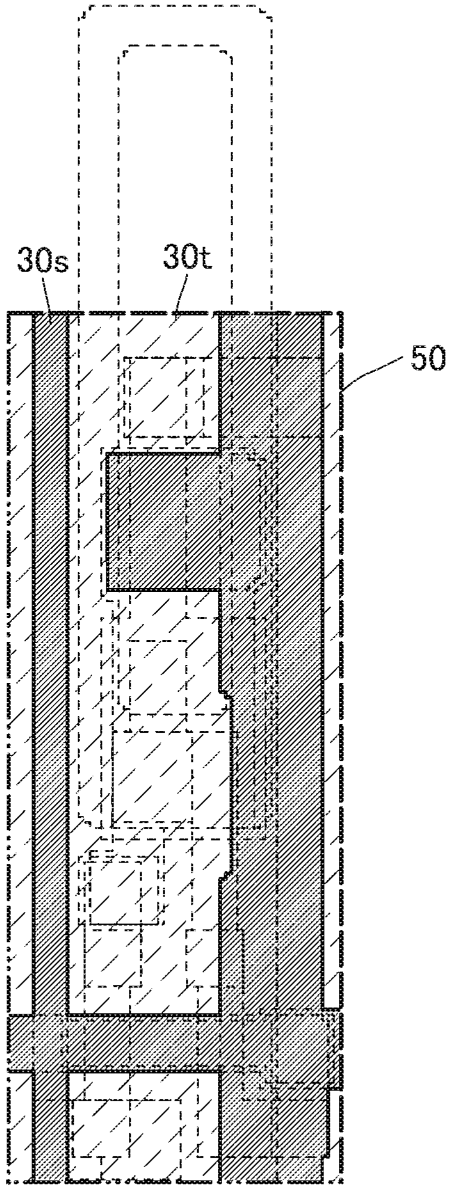

FIG. 16A and FIG. 16B illustrate layout examples of a subpixel 50 that are different from those in FIG. 14A, FIG. 14B, FIG. 15A and FIG. 15B.

The subpixel 50 includes transistors 61*a*, 61*b*, and 62. The transistors 61*a*, 61*b*, and 62 are each a transistor having two gates with a semiconductor layer therebetween. FIG. 16A also illustrates a pixel electrode 64 and the display region 22. The pixel electrode 64 extends to an adjacent pixel (not illustrated).

The transistor 62 in FIG. 16A has a stacked-layer structure similar to that of the transistor 62 illustrated in FIG. 15A.

The transistor 61*a* includes the semiconductor layer 55 provided over the wiring 51, the conductive layer 58 over the semiconductor layer 55, a conductive layer connected to a wiring 59 supplied with a constant potential, and the like. The transistor 61*b* includes the semiconductor layer 55 provided over the wiring 51, the conductive layer 58 over the semiconductor layer 55, a conductive layer connected to the wiring 52, and the like. The conductive layer 58 is connected to the wiring 59. The wiring 51 and the conductive layer 58 serve as gate electrodes.

The wiring 51, the wiring 52, the wiring 53, and the wiring 59 have a light-blocking property. For other layers, i.e., layers constituting the transistors 61*a* and 61*b*, the transistor 62, and the like, light-transmitting films are used. The subpixel 50 illustrated in FIG. 16A is divided into the transmission region 30*t* that transmits visible light and the light-blocking region 30*s* that blocks visible light, which are illustrated in the example of FIG. 16B. A region that does not overlap with any wiring is the transmission region 30*t*, as illustrated in FIG. 16B.

Figure 17A:
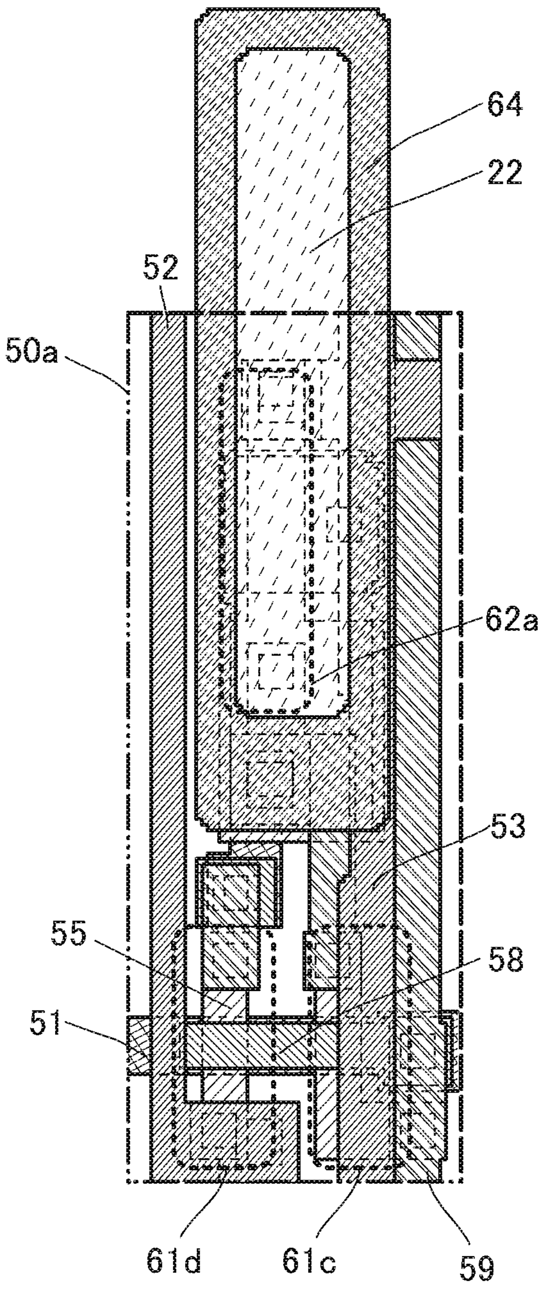
FIG. 17A and FIG. 17B are diagrams illustrating a structure example of a display apparatus.
Figure 17B:
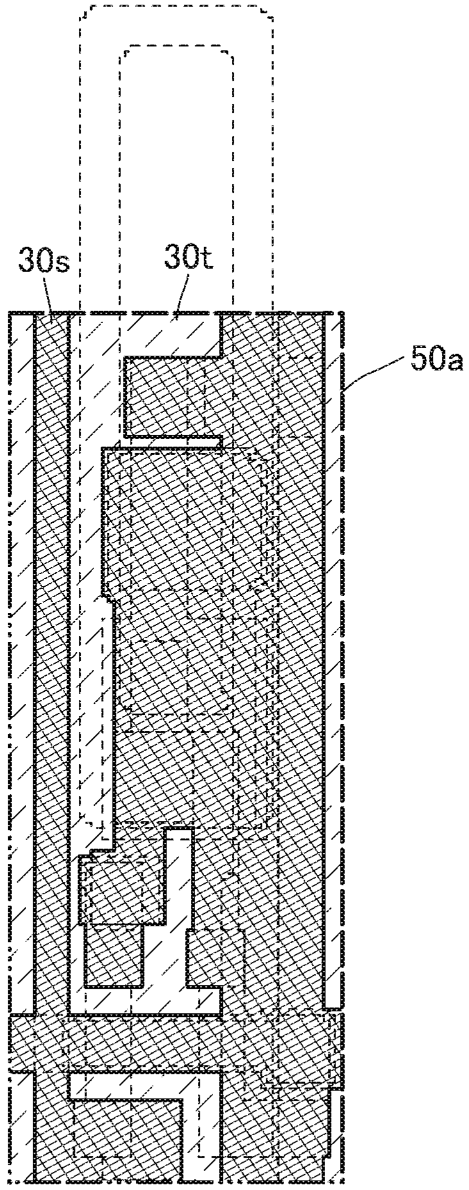

As a comparative example, a subpixel 50*a* with a transistor having part of the wiring 51, the wiring 52, and the wiring 59 is illustrated in FIG. 17A and FIG. 17B.

The subpixel 50*a* includes transistors 61*c*, 61*d*, and 62*a*. The transistors 61*c*, 61*d*, and 62*a* are each a transistor having two gates with a semiconductor layer therebetween. FIG. 17A also illustrates the pixel electrode 64 and the display region 22.

The transistor 62*a* in FIG. 17A has a stacked-layer structure similar to that of the transistor 62 illustrated in FIG. 15A.

The transistor 61*c* includes the semiconductor layer 55 provided over the wiring 51, the conductive layer 58 over the semiconductor layer 55, part of the wiring 59, and the like. The transistor 61*d* includes the semiconductor layer 55 provided over the wiring 51, the conductive layer 58 over the semiconductor layer 55, part of the wiring 52, and the like.

In the transistor 62*a*, conductive layers, which are not illustrated, serving as a gate electrode, a source electrode, and a drain electrode have a light-blocking property. The subpixel 50*a* illustrated in FIG. 17A is divided into the transmission region 30*t* that transmits visible light and the light-blocking region 30*s* that blocks visible light, which are illustrated in the example of FIG. 17B. A region that does not overlap with any wiring is the transmission region 30*t*, as illustrated in FIG. 17B.

When the structure of the subpixel 50*a* in FIG. 17 is employed in a display panel having a top-emission light-emitting element with a pixel size of 12.75 μm×38.25 μm, a display region diagonal dimension of 13.3 inches, and a definition of 8K, the proportion of the display region 22 in the pixel is 30.1% and the transmission area ratio of the pixel is 11.5%; by contrast, when the structure of the subpixel 50 in FIG. 16 is employed, the proportion of the display region 22 is 30.1% and the transmission area ratio is 57.6%. The use of the pixel layout illustrated in FIG. 16 can improve the light transmittance.

The above is the description of the pixel layout method.

In the display apparatus of one embodiment of the present invention, the proportion of the area of the transmission region per unit area (the transmission area ratio) in the display region can be increased, so that the transmission image can be bright and see-through display without any unnaturalness can be provided to a user. Furthermore, since the light-emitting elements are formed separately without the use of an FMM, a display apparatus having both a high transmission area ratio and a high effective light-emitting area ratio (also referred to as a proportion of the area of the light-emitting region per unit area in the display region or an aperture ratio) can be fabricated.

Embodiment 2

In this embodiment, structure examples of a display apparatus of one embodiment of the present invention are described.

The display apparatus of this embodiment can be a high-definition display apparatus or a large-sized display apparatus. Accordingly, the display apparatus of this embodiment can be used for display portions of electronic devices such as a digital camera, a digital video camera, a digital photo frame, a mobile phone, a portable game console, a smart phone, a wristwatch terminal, a tablet terminal, a portable information terminal, and an audio reproducing device, in addition to display portions of electronic devices with a relatively large screen, such as a television device, a desktop or notebook personal computer, a monitor of a computer or the like, digital signage, and a large game machine such as a pachinko machine.

[Display Apparatus 400]

Figure 18:
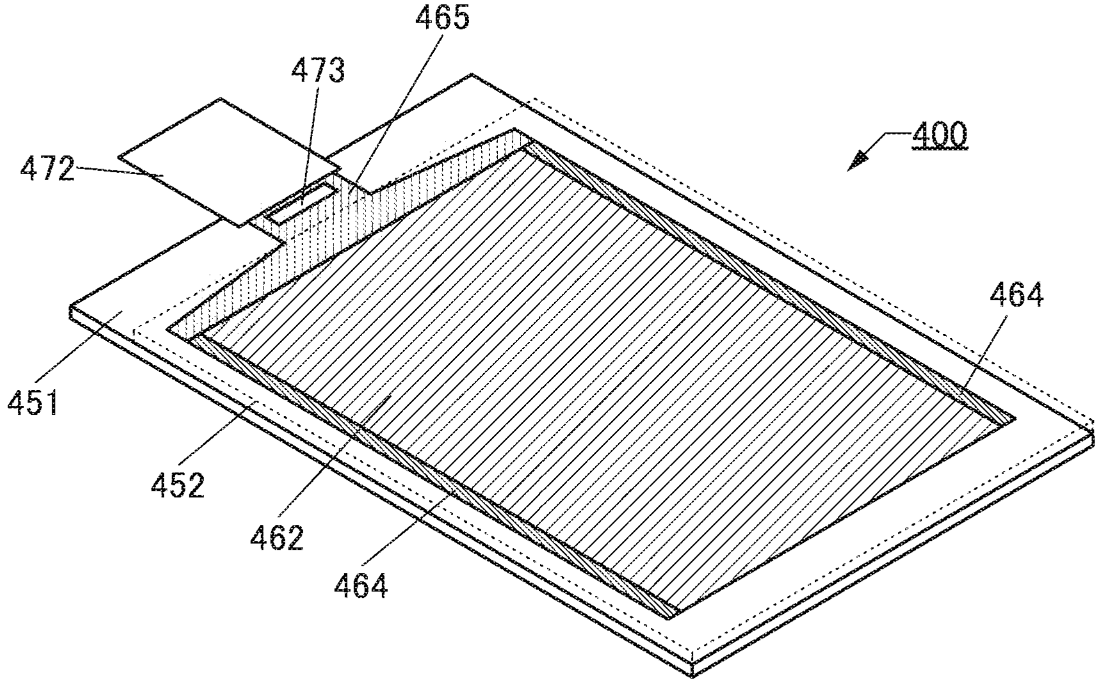
FIG. 18 is a diagram illustrating a structure example of a display apparatus.
Figure 19A:
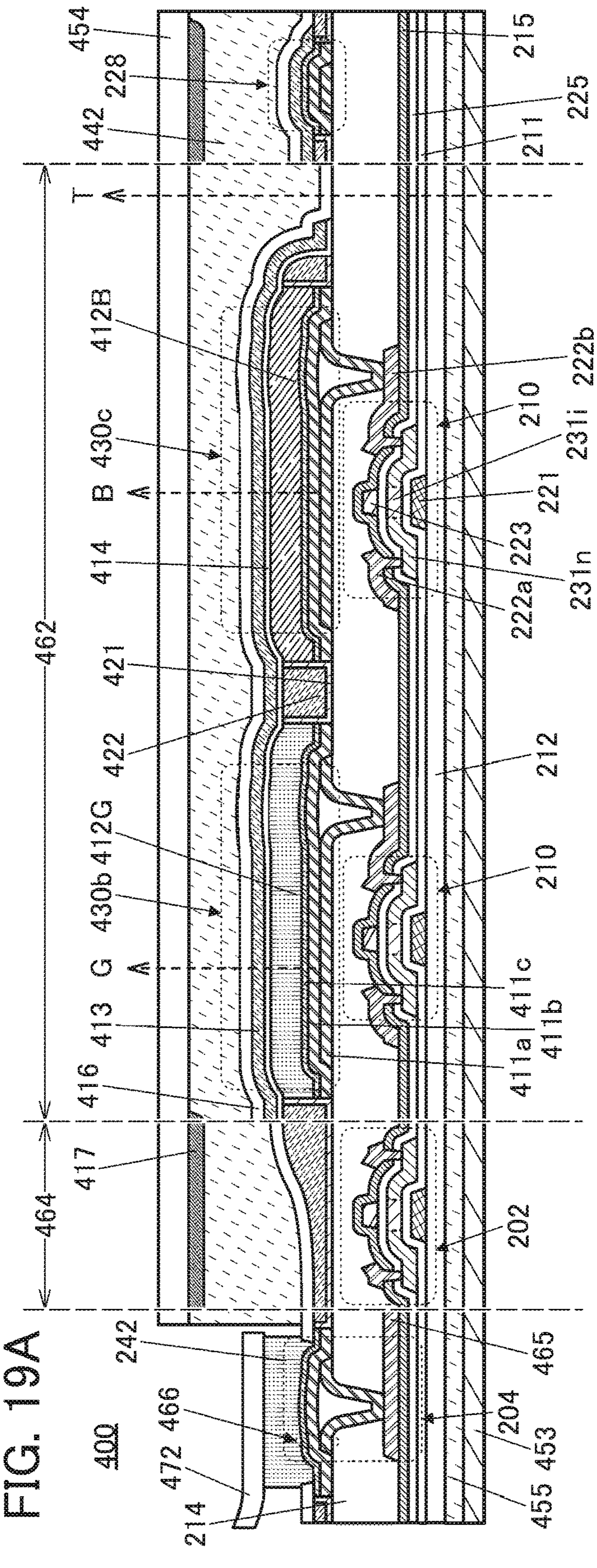
FIG. 19A is a cross-sectional view illustrating an example of a display apparatus.

FIG. 18 is a perspective view of a display apparatus 400, and FIG. 19A is a cross-sectional view of the display apparatus 400.

The display apparatus 400 has a structure in which a substrate 452 and a substrate 451 are bonded to each other. In FIG. 18, the substrate 452 is denoted by a dashed line.

The display apparatus 400 includes a display portion 462, a circuit 464, a wiring 465, and the like. FIG. 13 illustrates an example in which an IC 473 and an FPC 472 are mounted on the display apparatus 400. Thus, the structure illustrated in FIG. 13 can be regarded as a display module including the display apparatus 400, the IC (integrated circuit), and the FPC.

For the circuit 464, for example, a scan line driver circuit can be used.

The wiring 465 has a function of supplying a signal and power to the display portion 462 and the circuit 464. The signal and power are input to the wiring 465 from the outside through the FPC 472 or input to the wiring 465 from the IC 473.

FIG. 18 illustrates an example in which the IC 473 is provided over the substrate 451 by a COG (Chip On Glass) method, a COF (Chip on Film) method, or the like. An IC including a scan line driver circuit, a signal line driver circuit, or the like can be used as the IC 473, for example. Note that the display apparatus 400 and the display module are not necessarily provided with an IC. The IC may be mounted on the FPC by a COF method or the like.

FIG. 19A illustrates an example of cross sections of part of a region including the FPC 472, part of the circuit 464, part of the display portion 462, and part of a region including a connection portion in the display apparatus 400. FIG. 19A specifically illustrates an example of a cross section of a region including a light-emitting element 430*b* emitting green light and a light-emitting element 430*c* emitting blue light in the display portion 462.

The display apparatus 400 illustrated in FIG. 19A includes a transistor 202, a transistor 210, the light-emitting element 430*b*, the light-emitting element 430*c*, and the like between a substrate 453 and a substrate 454.

The light-emitting element described in Embodiment 1 can be used for the light-emitting element 430*b* and the light-emitting element 430*c*.

Here, in the case where the pixel of the display apparatus includes three kinds of subpixels including light-emitting elements that emit different colors, as the three subpixels, subpixels of three colors of red (R), green (G), and blue (B), subpixels of three colors of yellow (Y), cyan (C), and magenta (M), and the like can be given. In the case where the pixel includes four subpixels each including a light-emitting element, as the four subpixels, subpixels of four colors of R, G, B, and white (W), subpixels of four colors of R, G, B, and Y, and the like can be given.

The substrate 454 and a protective layer 416 are bonded to each other with an adhesive layer 442. The adhesive layer 442 is provided to overlap with the light-emitting element 430*b* and the light-emitting element 430*c*; that is, the display apparatus 400 employs a solid sealing structure. The substrate 454 is provided with a light-blocking layer 417.

The light-emitting element 430*b* and the light-emitting element 430*c* each include a conductive layer 411*a*, a conductive layer 411*b*, and a conductive layer 411*c* as a pixel electrode. The conductive layer 411*b* has a reflective property with respect to visible light and functions as a reflective electrode. The conductive layer 411*c* has a transmitting property with respect to visible light and functions as an optical adjustment layer.

The conductive layer 411*a* is connected to a conductive layer 222*b* included in the transistor 210 through an opening provided in an insulating layer 214. The transistor 210 has a function of controlling driving of the light-emitting element.

An EL layer 412G or an EL layer 412B is provided to cover the pixel electrode. An insulating layer 421 is provided in contact with the side surface of the EL layer 412G and the side surface of the EL layer 412B, and a resin layer 422 is provided to fill a depressed portion of the insulating layer 421. An organic layer 414, a common electrode 413, and the protective layer 416 are provided to cover the EL layer 412G and the EL layer 412B. With provision of the protective layer 416 that covers the light-emitting element, entry of impurities such as water into the light-emitting element can be inhibited, leading to an increase in the reliability of the light-emitting element.

Light emitted from the light-emitting element is emitted toward the substrate 454 side. For the substrate 454, a material having a high transmitting property with respect to visible light is preferably used.

A transmission region that transmits transmission light T is illustrated on the right side of the light-emitting element 430*c*. Here, an example in which the insulating layer 421, the resin layer 422, the organic layer 414, and the common electrode 413 have an opening overlapping with the transmission region is illustrated. Furthermore, the protective layer 416 covers the side surfaces of the organic layer 414 and the common electrode 413 in FIG. 19A.

The transistor 202 and the transistor 210 are formed over the substrate 451. These transistors can be manufactured using the same materials in the same steps.

The substrate 453 and an insulating layer 212 are bonded to each other with an adhesive layer 455.

In a manufacturing method of the display apparatus 400, first, a formation substrate provided with the insulating layer 212, the transistors, the light-emitting elements, and the like is bonded to the substrate 454 provided with the light-blocking layer 417 with the adhesive layer 442. Then, the substrate 453 is attached to the surface exposed by separation of the formation substrate, whereby the components formed over the formation substrate are transferred onto the substrate 453. The substrate 453 and the substrate 454 preferably have flexibility. This can increase the flexibility of the display apparatus 400.

A connection portion 204 is provided in a region of the substrate 453 that does not overlap with the substrate 454. In the connection portion 204, the wiring 465 is electrically connected to the FPC 472 through a conductive layer 466 and a connection layer 242. The conductive layer 466 can be obtained by processing the same conductive film as the pixel electrode. Thus, the connection portion 204 and the FPC 472 can be electrically connected to each other through the connection layer 242.

Each of the transistor 202 and the transistor 210 includes a conductive layer 221 functioning as a gate, an insulating layer 211 functioning as a gate insulating layer, a semiconductor layer 231 including a channel formation region 231*i* and a pair of low-resistance regions 231*n*, a conductive layer 222*a* connected to one of the pair of low-resistance regions 231*n*, the conductive layer 222*b* connected to the other of the pair of low-resistance regions 231*n*, an insulating layer 225 functioning as a gate insulating layer, a conductive layer 223 functioning as a gate, and an insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the corresponding low-resistance regions 231*n* through openings provided in the insulating layer 215. One of the conductive layer 222*a* and the conductive layer 222*b* functions as a source, and the other functions as a drain.

FIG. 19A illustrates an example in which the insulating layer 225 covers the top surface and the side surface of the semiconductor layer. The conductive layer 222*a* and the conductive layer 222*b* are connected to the corresponding low-resistance regions 231*n* through openings provided in the insulating layer 225 and the insulating layer 215.

Figure 19B:
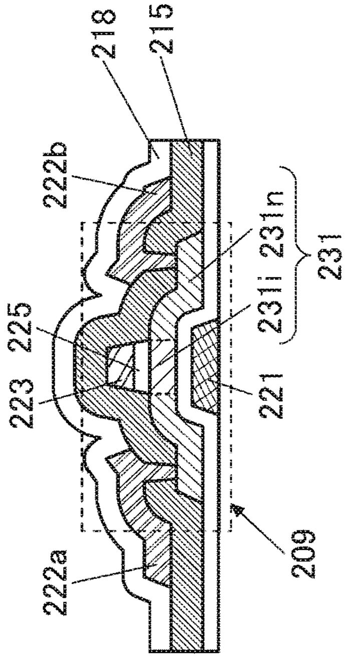
FIG. 19B is a cross-sectional view illustrating an example of a transistor.

Meanwhile, in a transistor 209 illustrated in FIG. 19B, the insulating layer 225 overlaps with the channel formation region 231*i* of the semiconductor layer 231 and does not overlap with the low-resistance regions 231*n*. The structure illustrated in FIG. 19B can be manufactured by processing the insulating layer 225 using the conductive layer 223 as a mask, for example. In FIG. 19B, the insulating layer 215 is provided to cover the insulating layer 225 and the conductive layer 223, and the conductive layer 222*a* and the conductive layer 222*b* are connected to the low-resistance regions 231_n_ through the openings in the insulating layer 215. Furthermore, an insulating layer 218 covering the transistor may be provided.

There is no particular limitation on the structure of the transistors included in the display apparatus of this embodiment. For example, a planar transistor, a staggered transistor, an inverted staggered transistor, or the like can be used. A top-gate or a bottom-gate transistor structure may be employed. Alternatively, gates may be provided above and below the semiconductor layer in which a channel is formed.

The structure in which the semiconductor layer where a channel is formed is sandwiched between two gates is used for the transistor 202 and the transistor 210. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the semiconductor layer of the transistor, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display apparatus of this embodiment.

The band gap of a metal oxide used for the semiconductor layer of the transistor is preferably 2 eV or more, further preferably 2.5 eV or more. With the use of a metal oxide having a wide bandgap, the off-state current of the OS transistor can be reduced.

A metal oxide preferably contains at least indium or zinc and further preferably contains indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and M is further preferably gallium. Hereinafter, a metal oxide containing indium, M, and zinc is referred to as In-M-Zn oxide in some cases.

When a metal oxide is an In-M-Zn oxide, the atomic ratio of In is preferably higher than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio. By increasing the proportion of the number of indium atoms in the metal oxide, the on-state current, field-effect mobility, or the like of the transistor can be improved.

For example, when the atomic ratio is described as In:Ga:Zn=4:2:3 or a composition in the vicinity thereof, the case is included where the atomic proportion of Ga is greater than or equal to 1 and less than or equal to 3 and the atomic proportion of Zn is greater than or equal to 2 and less than or equal to 4 with the atomic proportion of In being 4. In addition, when the atomic ratio is described as In:Ga:Zn=5:1:6 or a composition in the vicinity thereof, the case is included where the atomic proportion of Ga is greater than 0.1 and less than or equal to 2 and the atomic proportion of Zn is greater than or equal to 5 and less than or equal to 7 with the atomic proportion of In being 5. Furthermore, when the atomic ratio is described as In:Ga:Zn=1:1:1 or a composition in the vicinity thereof, the case is included where the atomic proportion of Ga is greater than 0.1 and less than or equal to 2 and the atomic proportion of Zn is greater than 0.1 and less than or equal to 2 with the atomic proportion of In being 1.

The atomic ratio of In may be less than the atomic ratio of M in the In-M-Zn oxide. Examples of the atomic ratio of the metal elements in such an In-M-Zn oxide include In:M:Zn=1:3:2 or a composition in the neighborhood thereof, In:M:Zn=1:3:3 or a composition in the neighborhood thereof, In:M:Zn=1:3:4 or a composition in the neighborhood thereof. By increasing the proportion of the number of M atoms in the metal oxide, the band gap of the In-M-Zn oxide is further increased; thus, the resistance to a negative bias stress test with light irradiation can be improved. Specifically, the amount of change in the threshold voltage or the amount of change in the shift voltage (Vsh) measured in a NBTIS (Negative Bias Temperature Illumination Stress) test of the transistor can be decreased. Note that the shift voltage (Vsh) is defined as Vg at which, in a drain current (Id)-gate voltage (Vg) curve of a transistor, the tangent at a point where the slope of the curve is the steepest intersects the straight line of Id=1 pA.

Alternatively, the semiconductor layer of the transistor may contain silicon. Examples of silicon include amorphous silicon and crystalline silicon (e.g., low-temperature polysilicon or single crystal silicon).

Alternatively, a semiconductor layer of a transistor may contain a layered material that functions as a semiconductor. The layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, a transistor having a high on-state current can be provided.

Examples of the layered materials include graphene, silicene, and chalcogenide. Chalcogenide is a compound containing chalcogen (an element belonging to Group 16). Examples of chalcogenide include transition metal chalcogenide and chalcogenide of Group 13 elements. Specific examples of the transition metal chalcogenide which can be used for a semiconductor layer of a transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A material through which impurities such as water and hydrogen do not easily diffuse is preferably used for at least one of the insulating layers that cover the transistors. This allows the insulating layer to function as a barrier layer. Such a structure can effectively inhibit diffusion of impurities into the transistors from the outside and increase the reliability of the display apparatus.

An inorganic insulating film is preferably used as each of the insulating layer 211, the insulating layer 212, the insulating layer 215, the insulating layer 218, and the insulating layer 225. For the inorganic insulating film, a silicon nitride film, a silicon oxynitride film, a silicon oxide film, a silicon nitride oxide film, an aluminum oxide film, an aluminum nitride film, or the like can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above inorganic insulating films may also be used.

Here, an organic insulating film often has a lower barrier property than an inorganic insulating film. Therefore, the organic insulating film preferably has an opening in the vicinity of an end portion of the display apparatus 400. This can inhibit entry of impurities from the end portion of the display apparatus 400 through the organic insulating film. Alternatively, the organic insulating film may be formed so that an end portion of the organic insulating film is positioned inward from the end portion of the display apparatus 400, to prevent the organic insulating film from being exposed at the end portion of the display apparatus 400.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

The light-blocking layer 417 is preferably provided on the surface of the substrate 454 on the substrate 453 side. A variety of optical members can be arranged on the outer side of the substrate 454. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorption layer, or the like may be provided on the outer side of the substrate 454.

FIG. 19A illustrates a connection portion 228. In the connection portion 228, the common electrode 413 is electrically connected to a wiring. FIG. 19A illustrates an example in which the wiring has the same stacked-layer structure as the pixel electrode.

For each of the substrate 453 and the substrate 454, glass, quartz, ceramic, sapphire, a resin, a metal, an alloy, a semiconductor, or the like can be used. The substrate on the side where light from the light-emitting element is extracted is formed using a material that transmits the light. When a flexible material is used for the substrate 453 and the substrate 454, the flexibility of the display apparatus can be increased. Furthermore, a polarizing plate may be used as the substrate 453 or the substrate 454.

For each of the substrate 453 and the substrate 454, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 453 and the substrate 454.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the films having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of a display panel might be changed, e.g., creases are generated. Thus, for the substrate, a film with a low water absorption rate is preferably used. For example, the water absorption rate of the film is preferably lower than or equal to 1%, further preferably lower than or equal to 0.1%, still further preferably lower than or equal to 0.01%.

For the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

For the connection layer 242, an anisotropic conductive film (ACF), an anisotropic conductive paste (ACP), or the like can be used.

Examples of materials that can be used for a gate, a source, and a drain of a transistor and conductive layers such as a variety of wirings and electrodes included in a display apparatus include metals such as aluminum, titanium, chromium, nickel, copper, yttrium, zirconium, molybdenum, silver, tantalum, or tungsten, and an alloy containing any of these metals as its main component. A film containing any of these materials can be used in a single layer or as a stacked-layer structure.

For a conductive material having a light-transmitting property, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked film of any of the above materials can be used as a conductive layer. For example, a stacked film of indium tin oxide and an alloy of silver and magnesium, or the like is preferably used for increased conductivity. These materials can also be used, for example, for the conductive layers such as a variety of wirings and electrodes included in a display apparatus, and conductive layers (conductive layers functioning as a pixel electrode or a common electrode) included in the light-emitting element.

For an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

At least part of the structure examples, the drawings corresponding thereto, and the like described in this embodiment can be combined with the other structure examples, the other drawings, and the like as appropriate.

At least part of this embodiment can be implemented in combination with the other embodiments described in this specification as appropriate.

Embodiment 3

In this embodiment, light-emitting elements (also referred to as light-emitting devices) that can be used in a display apparatus of one embodiment of the present invention are described.

In this specification and the like, a device manufactured using a metal mask or an FMM (fine metal mask) is sometimes referred to as a device having an MM (metal mask) structure. In this specification and the like, a device manufactured without using a metal mask or an FMM is sometimes referred to as a device having an MML (metal maskless) structure.

In this specification and the like, a structure in which light-emitting layers in light-emitting devices of different colors (here, blue (B), green (G), and red (R)) are separately formed or separately patterned is sometimes referred to as an SBS (Side By Side) structure. In this specification and the like, a light-emitting device capable of emitting white light is sometimes referred to as a white-light-emitting device. Note that a combination of white-light-emitting devices with coloring layers (e.g., color filters) enables a full-color display apparatus.

Structures of light-emitting devices can be classified roughly into a single structure and a tandem structure. A device with a single structure includes one light-emitting unit between a pair of electrodes, and the light-emitting unit preferably includes one or more light-emitting layers. To obtain white light emission in a single structure, two or more light-emitting layers are selected such that emission colors of the light-emitting layers are complementary colors. For example, when emission colors of a first light-emitting layer and a second light-emitting layer are complementary colors, the light-emitting device can be configured to emit white light as a whole. The same applies to a light-emitting device including three or more light-emitting layers.

A device with a tandem structure includes two or more light-emitting units between a pair of electrodes, and each light-emitting unit preferably includes one or more light-emitting layers. When light-emitting layers that emit light of the same color are used in each light-emitting unit, luminance per predetermined current can be increased, and the light-emitting device can have higher reliability than that with a single structure. To obtain white light emission in a tandem structure, the structure is made so that light from light-emitting layers of the plurality of light-emitting units can be combined to be white light. Note that a combination of emission colors for obtaining white light emission is similar to a structure in the case of a single structure. In the device with a tandem structure, an intermediate layer such as a charge-generation layer is suitably provided between the plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

<Structure Examples of Light-Emitting Device>

Figure 20A:
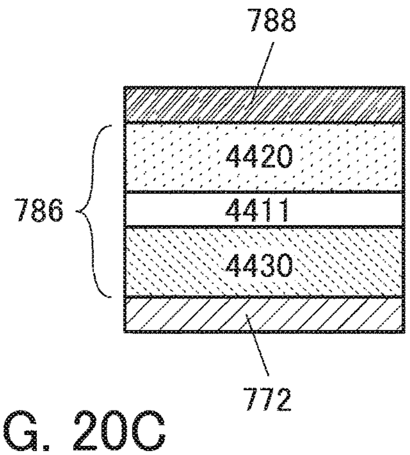
FIG. 20A to FIG. 20F are diagrams illustrating structure examples of a light-emitting device.

As illustrated in FIG. 20A, the light-emitting device includes an EL layer 786 between a pair of electrodes (a lower electrode 772 and an upper electrode 788). The EL layer 786 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can serve as a single light-emitting unit, and the structure in FIG. 20A is referred to as a single structure in this specification.

Figure 20B:
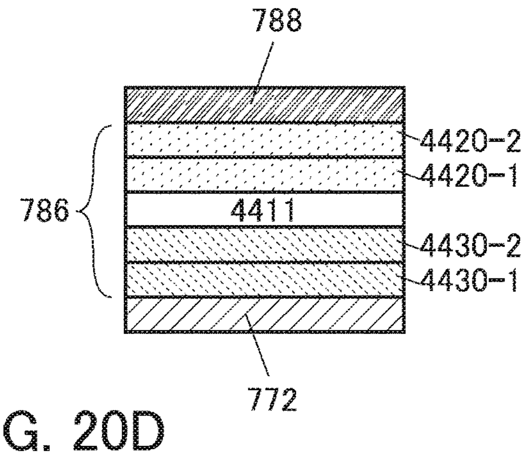

FIG. 20B is a variation example of the EL layer 786 included in the light-emitting device illustrated in FIG. 20A. Specifically, the light-emitting device illustrated in FIG. 20B includes a layer 4430-1 over the lower electrode 772, a layer 4430-2 over the layer 4430-1, the light-emitting layer 4411 over the layer 4430-2, a layer 4420-1 over the light-emitting layer 4411, a layer 4420-2 over the layer 4420-1, and the upper electrode 788 over the layer 4420-2. For example, when the lower electrode 772 functions as an anode and the upper electrode 788 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the lower electrode 772 functions as a cathode and the upper electrode 788 functions as an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layered structure, carriers can be efficiently injected to the light-emitting layer 4411, and the efficiency of the recombination of carriers in the light-emitting layer 4411 can be enhanced.

Figure 20C:
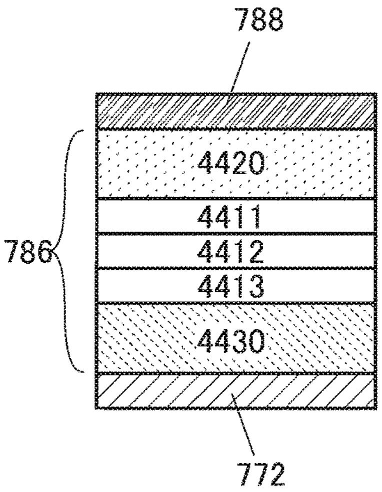
Figure 20D:
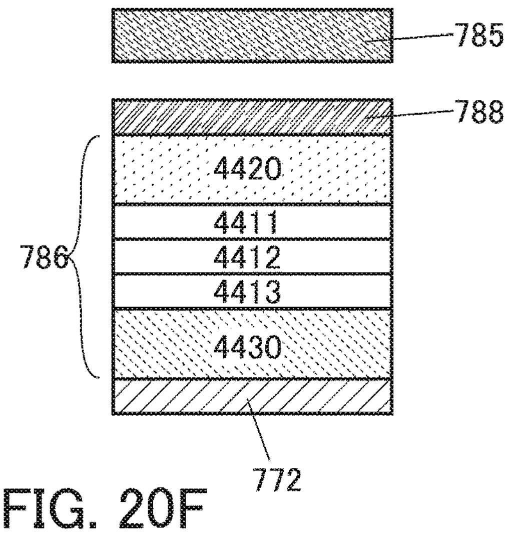

Note that the structure in which a plurality of light-emitting layers (light-emitting layers 4411, 4412, and 4413) are provided between the layer 4420 and the layer 4430 as illustrated in FIG. 20C and FIG. 20D is a variation of the single structure.

Figure 20E:
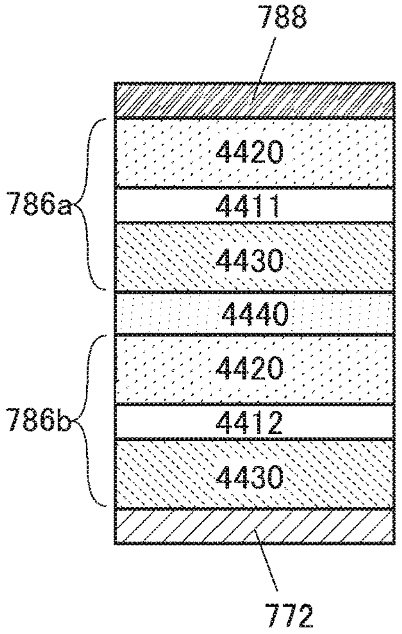
Figure 20F:
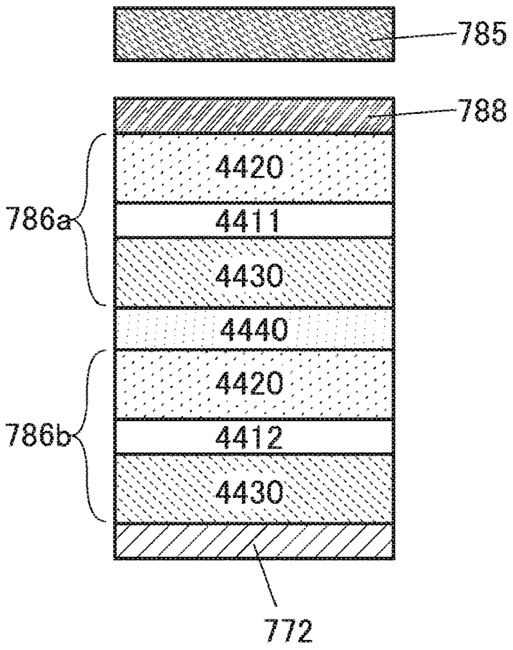

The structure in which a plurality of light-emitting units (an EL layer 786*a* and an EL layer 786*b*) are connected in series with an intermediate layer (charge-generation layer) 4440 therebetween as illustrated in FIG. 20E and FIG. 20F is referred to as a tandem structure in this specification. In this specification and the like, the structure illustrated in FIG. 20E and FIG. 20F is referred to as a tandem structure; however, without being limited to this, a tandem structure may be referred to as a stack structure, for example. The tandem structure enables a light-emitting device capable of high luminance light emission.

In FIG. 20C, light-emitting materials that emit light of the same color may be used for the light-emitting layer 4411, the light-emitting layer 4412, and the light-emitting layer 4413.

Alternatively, different light-emitting materials may be used for the light-emitting layer 4411, the light-emitting layer 4412, and the light-emitting layer 4413. White light can be obtained when the light-emitting layer 4411, the light-emitting layer 4412, and the light-emitting layer 4413 emit light of complementary colors. FIG. 20D illustrates an example in which a coloring layer 785 functioning as a color filter is provided. When white light passes through a color filter, light of a desired color can be obtained.

In FIG. 20E, the same light-emitting material may be used for the light-emitting layer 4411 and the light-emitting layer 4412. Alternatively, light-emitting materials that emit light of different colors may be used for the light-emitting layer 4411 and the light-emitting layer 4412. White light can be obtained when the light-emitting layer 4411 and the light-emitting layer 4412 emit light of complementary colors. FIG. 20F illustrates an example in which the coloring layer 785 is further provided.

Also in the structures illustrated in FIG. 20C, FIG. 20D, FIG. 20E, and FIG. 20F, the layers 4420 and the layers 4430 may each have a stacked-layer structure of two or more layers as illustrated in FIG. 20B.

In FIG. 20D, the same light-emitting material may be used for the light-emitting layer 4411, the light-emitting layer 4412, and the light-emitting layer 4413. Similarly, in FIG. 20F, the same light-emitting material may be used for the light-emitting layer 4411 and the light-emitting layer 4412. Here, when a color conversion layer is used instead of the coloring layer 785, light of a desired color different from the color of the light-emitting material can be obtained. For example, a blue-light-emitting material is used for each light-emitting layer and blue light passes through the color conversion layer, whereby light with a wavelength longer than that of blue light (e.g., red light or green light) can be obtained. For the color conversion layer, a fluorescent material, a phosphorescent material, quantum dots, or the like can be used.

A structure in which light-emitting layers in light-emitting devices (here, light-emitting layers for blue (B), green (G), and red (R)) are separately formed is referred to as an SBS (Side By Side) structure in some cases.

The emission color of the light-emitting device can be red, green, blue, cyan, magenta, yellow, white, or the like depending on the material contained in the EL layer 786. Furthermore, the color purity can be further increased when the light-emitting device has a microcavity structure.

The light-emitting device that emits white light preferably contains two or more kinds of light-emitting substances in the light-emitting layer. To obtain white light emission, two or more kinds of light-emitting substances are selected such that their emission colors are complementary. For example, when emission colors of a first light-emitting layer and a second light-emitting layer are complementary colors, the light-emitting device can be configured to emit white light as a whole. The same applies to a light-emitting device including three or more light-emitting layers.

The light-emitting layer preferably contains two or more selected from light-emitting substances that emit light of red (R), green (G), blue (B), yellow (Y), orange (O), and the like. Alternatively, the light-emitting layer preferably contains two or more light-emitting substances that emit light containing two or more of spectral components of R, G, and B.

Here, a specific structure example of a light-emitting device is described.

The light-emitting device includes at least the light-emitting layer. The light-emitting device may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like.

Either a low molecular compound or a high molecular compound can be used for the light-emitting device, and an inorganic compound may also be included. Each layer included in the light-emitting device can be formed by an evaporation method (including a vacuum evaporation method), a transfer method, a printing method, an inkjet method, a coating method, or the like.

For example, the light-emitting device can include one or more of a hole-injection layer, a hole-transport layer, a hole-blocking layer, an electron-blocking layer, an electron-transport layer, and an electron-injection layer in addition to the light-emitting layer.

The hole-injection layer is a layer injecting holes from an anode to the hole-transport layer, and a layer containing a material with a high hole-injection property. For the material with a high hole-injection property, an aromatic amine compound and a composite material containing a hole-transport material and an acceptor material (electron-accepting material), and the like can be given.

The hole-transport layer is a layer transporting holes, which are injected from the anode by the hole-injection layer, to the light-emitting layer. The hole-transport layer is a layer containing a hole-transport material. For the hole-transport material, a substance having a hole mobility greater than or equal to $1\times10^{-6}$ $cm^2/Vs$ is preferable. Note that other substances can also be used as long as they have a property of transporting more holes than electrons. For the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-transport layer is a layer that transports electrons, which are injected from a cathode by the electron-injection layer, to the light-emitting layer. The electron-transport layer is a layer containing an electron-transport material. For the electron-transport material, a substance having an electron mobility greater than or equal to $1\times10^{-6}$ $cm^2/Vs$ is preferable. Note that other substances can also be used as long as they have a property of transporting more electrons than holes. For the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from the cathode to the electron-transport layer, and a layer containing a material with a high electron-injection property. For the material with a high electron-injection property, an alkali metal, an alkaline earth metal, or a compound thereof can be used. For the material with a high electron-injection property, a composite material containing an electron-transport material and a donor material (electron-donating material) can also be used.

For the electron-injection layer, for example, an alkali metal, an alkaline earth metal, or a compound thereof, such as lithium, cesium, ytterbium, lithium fluoride (LiF), cesium fluoride (CsF), calcium fluoride ($CaF_2$), 8-(quinolinolato) lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate can be used. In addition, the electron-injection layer may have a stacked-layer structure of two or more layers. In the stacked-layer structure, for example, lithium fluoride can be used for the first layer and ytterbium can be used for the second layer.

Alternatively, for the electron-injection layer, an electron-transport material may be used. For example, a compound having an unshared electron pair and having an electron deficient heteroaromatic ring can be used as the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably higher than or equal to −3.6 eV and lower than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino [2,3-a:2',3'-c]phenazine (abbreviation: HATNA), 2,4,6-tris [3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

The light-emitting layer is a layer containing a light-emitting substance. The light-emitting layer can contain one or more kinds of light-emitting substances. For the light-emitting substance, a substance that exhibits an emission color of blue, violet, bluish violet, green, yellowish green, yellow, orange, red, or the like is appropriately used. For the light-emitting substance, a substance that emits near-infrared light can also be used.

Examples of the light-emitting substances include a fluorescent material, a phosphorescent material, a TADF material, and a quantum dot material.

Examples of the fluorescent materials include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). For one or more kinds of organic compounds, one or both of the hole-transport material and the electron-transport material can be used. Alternatively, as one or more kinds of organic compounds, a bipolar material or a TADF material may be used.

The light-emitting layer preferably contains, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

At least part of the structure examples, the drawings corresponding thereto, and the like described in this embodiment can be combined with the other structure examples, the other drawings, and the like as appropriate.

At least part of this embodiment can be implemented in combination with the other embodiments described in this specification as appropriate.

Embodiment 4

In this embodiment, examples where a display apparatus of one embodiment of the present invention includes a light-receiving device or the like are described.

In the display apparatus of this embodiment, a pixel can include a plurality of types of subpixels including light-emitting devices that emit light of different colors. For example, a pixel can include three types of subpixels. As the three subpixels, subpixels of three colors of red (R), green (G), and blue (B) and subpixels of three colors of yellow (Y), cyan (C), and magenta (M) can be given. Alternatively, a pixel can include four types of subpixels. As the four subpixels, subpixels of four colors of R, G, B, and white (W) and subpixels of four colors of R, G, B, and Y can be given.

There is no particular limitation on the arrangement of subpixels, and a variety of methods can be employed. Examples of the arrangement of subpixels include stripe arrangement, S stripe arrangement, matrix arrangement, delta arrangement, Bayer arrangement, and PenTile arrangement.

The top surfaces of the subpixels may have a triangular shape, a quadrangular shape (including a rectangular shape and a square shape), a polygonal shape such as a pentagonal shape, a polygonal shape with rounded corners, an elliptical shape, or a circular shape, for example. Here, the top surface shape of the subpixel corresponds to the top surface shape of a light-emitting region of the light-emitting device.

The display apparatus of one embodiment of the present invention may include a light-receiving device in the pixel.

In the display apparatus including the light-emitting device and the light-receiving device in the pixel, the pixel has a light-receiving function, which enables detection of a touch or approach of an object while an image is displayed. For example, all the subpixels included in the display apparatus can display an image; alternatively, some subpixels can emit light as a light source and the other subpixels can display an image.

In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by detecting light with the display portion, an image can be captured or an approach or touch of an object (e.g., a finger, a hand, or a pen) can be detected. Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted from the light-emitting device included in the display portion, the light-receiving device can detect reflected light (or scattered light); thus, image capturing or touch detection is possible even in a dark place.

In the case where the light-receiving devices are used as the image sensor, the display apparatus can capture an image with the use of the light-receiving devices. For example, the display apparatus of this embodiment can be used as a scanner.

For example, data on biological information such as a fingerprint or a palm print can be obtained with the use of the image sensor. That is, a biometric authentication sensor can be incorporated in the display apparatus. When the display apparatus incorporates a biometric authentication sensor, the number of components of an electronic device can be reduced as compared to the case where a biometric authentication sensor is provided separately from the display apparatus; thus, the size and weight of the electronic device can be reduced.

In the case where the light-receiving devices are used as the touch sensor, the display apparatus can detect an approach or touch of an object with the use of the light-receiving devices.

For example, a pn or pin photodiode can be used as the light-receiving device. The light-receiving devices function as photoelectric conversion devices (also referred to as photoelectric conversion elements) that detect light entering the light-receiving devices and generate electric charge. The amount of electric charge generated from the light-receiving devices depends on the amount of light entering the light-receiving devices.

As the light-receiving device, it is particularly preferable to use an organic photodiode including a layer containing an organic compound. An organic photodiode, which is easily made thin, lightweight, and large in area and has a high degree of freedom for shape and design, can be used in a variety of display apparatuses.

In one embodiment of the present invention, organic EL devices are used as the light-emitting devices, and organic photodiodes are used as the light-receiving devices. The organic EL device and the organic photodiode can be formed over the same substrate. Thus, the organic photodiode can be incorporated in the display apparatus including the organic EL device.

Figure 21A:
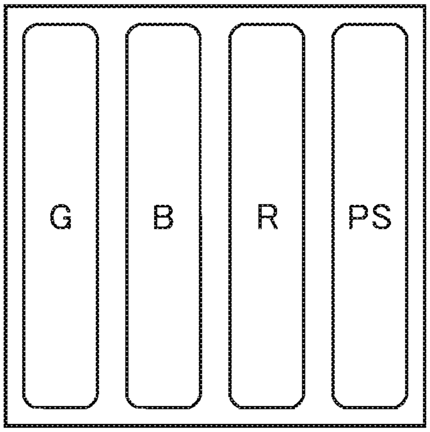
FIG. 21A to FIG. 21D are diagrams illustrating examples of pixels of a display apparatus.
Figure 21B:
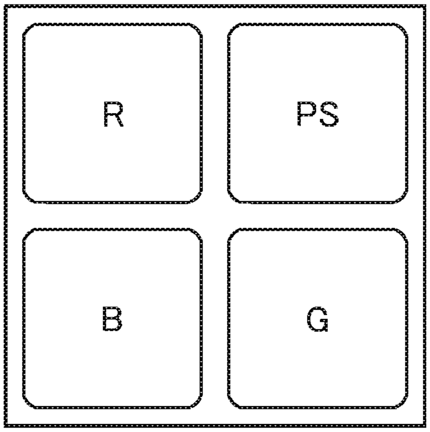
Figure 21C:
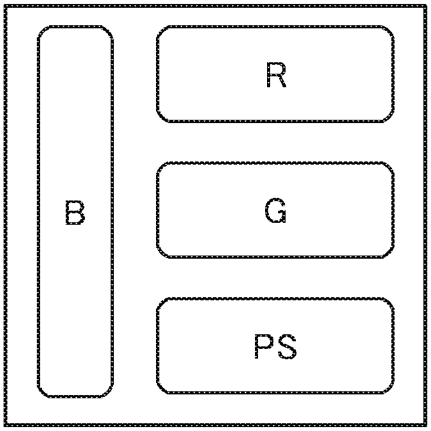

Pixels illustrated in FIG. 21A, FIG. 21B, and FIG. 21C each include a subpixel G, a subpixel B, a subpixel R, and a subpixel PS.

The pixel illustrated in FIG. 21A employs stripe arrangement. The pixel illustrated in FIG. 21B employs matrix arrangement.

The pixel arrangement illustrated in FIG. 21C has a structure in which three subpixels (the subpixel R, the subpixel G, and a subpixel S) are vertically arranged next to one subpixel (the subpixel B).

Figure 21D:
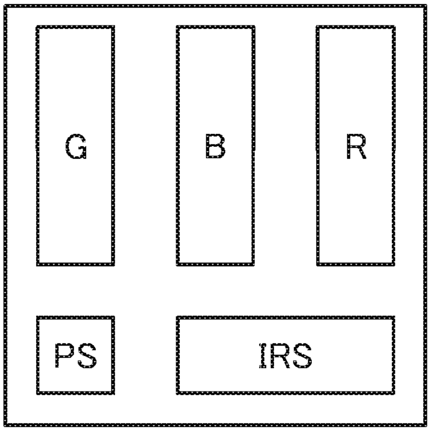

Pixels illustrated in FIG. 21D each include the subpixel G, the subpixel B, the subpixel R, the subpixel PS, and a subpixel IRS.

FIG. 21D illustrates an example where one pixel is provided in two rows. Three subpixels (the subpixel G, the subpixel B, and the subpixel R) are provided in the upper row (first row), and two subpixels (one subpixel PS and one subpixel IRS) are provided in the lower row (second row).

Note that the layout of the subpixels is not limited to the structures illustrated in FIG. 21A to FIG. 21D.

The subpixel R includes a light-emitting device that emits red light. The subpixel G includes a light-emitting device that emits green light. The subpixel B includes a light-emitting device that emits blue light. The subpixel PS and the subpixel IRS each include a light-receiving device. The wavelength of light detected by the subpixel PS and the subpixel IRS is not particularly limited.

The light-receiving area of the subpixel PS is smaller than the light-receiving area of the subpixel IRS. A smaller light-receiving area leads to a narrower image-capturing range, inhibits a blur in a captured image, and improves the definition. Thus, the use of the subpixel PS enables higher-resolution or higher-definition image capturing than the use of the subpixel IRS. For example, image capturing for personal authentication with the use of a fingerprint, a palm print, the iris, the shape of a blood vessel (including the shape of a vein and the shape of an artery), a face, or the like is possible by using the subpixel PS.

The light-receiving device included in the subpixel PS preferably detects visible light, and preferably detects one or more of blue light, violet light, bluish violet light, green light, yellowish green light, yellow light, orange light, red light, and the like. The light-receiving device included in the subpixel PS may detect infrared light.

The subpixel IRS can be used in a touch sensor (also referred to as a direct touch sensor), a near touch sensor (also referred to as a hover sensor, a hover touch sensor, a contactless sensor, or a touchless sensor), or the like. The wavelength of light detected by the subpixel IRS can be determined depending on the application purpose. For example, the subpixel IRS preferably detects infrared light. Thus, a touch can be detected even in a dark place.

Here, the touch sensor or the near touch sensor can detect an approach or contact of an object (e.g., a finger, a hand, or a pen). The touch sensor can detect the object when the display apparatus and the object come in direct contact with each other. Furthermore, even when an object is not in contact with the display apparatus, the near touch sensor can detect the object. For example, the display apparatus is preferably capable of detecting an object when the distance between the display apparatus and the object is greater than or equal to 0.1 mm and less than or equal to 300 mm, preferably greater than or equal to 3 mm and less than or equal to 50 mm. This structure enables the display apparatus to be operated without direct contact of an object, that is, enables the display apparatus to be operated in a contactless (touchless) manner. With the above-described structure, the display apparatus can have a reduced risk of being dirty or damaged, or can be operated without the object directly touching a dirt (e.g., dust or a virus) attached to the display apparatus.

When one pixel includes two kinds of light-receiving devices, the display apparatus can have two additional functions as well as a display function, enabling a multi-functional display apparatus.

For high-resolution image capturing, the subpixel PS is preferably provided in all pixels included in the display apparatus. By contrast, the subpixel IRS used for a touch sensor, a near touch sensor, or the like only needs to be provided in some pixels included in the display apparatus because high detection accuracy is not required as compared to the subpixel PS. When the number of subpixels IRS included in the display apparatus is smaller than the number of subpixels PS, higher detection speed can be achieved.

Here, a structure of the light-receiving device that can be used for the subpixel PS and the subpixel IRS will be described.

The light-receiving device includes at least an active layer functioning as a photoelectric conversion layer between a pair of electrodes. In this specification and the like, one of the pair of electrodes may be referred to as a pixel electrode and the other may be referred to as a common electrode.

One of the pair of electrodes of the light-receiving device functions as an anode, and the other electrode functions as a cathode. The case where the pixel electrode functions as an anode and the common electrode functions as a cathode is described below as an example. In other words, when the light-receiving device is driven by application of reverse bias between the pixel electrode and the common electrode, light entering the light-receiving device can be detected and electric charge can be generated and extracted as current.

A fabrication method similar to that of the light-emitting device can be employed for the light-receiving device. An island-shaped active layer (also referred to as a photoelectric conversion layer) included in the light-receiving device is formed by processing a film that is to be the active layer and formed on the entire surface, not by using a pattern of a metal mask; thus, the island-shaped active layer with a uniform thickness can be formed. In addition, a sacrificial layer provided over the active layer can reduce damage to the active layer in the fabrication process of the display apparatus, increasing the reliability of the light-receiving device.

Here, a layer shared by the light-receiving device and the light-emitting device sometimes have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device sometimes have the same function in both the light-emitting device and the light-receiving device. For example, the hole-transport layer functions as a hole-transport layer in both the light-emitting device and the light-receiving device, and the electron-transport layer functions as an electron-transport layer in both the light-emitting device and the light-receiving device.

The active layer included in the light-receiving device includes a semiconductor. Examples of the semiconductor include an inorganic semiconductor such as silicon and an organic semiconductor including an organic compound. This embodiment illustrates an example where an organic semiconductor is used as the semiconductor included in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads on a plane as in benzene, an electron-donating property (donor property) usually increases; however, fullerene has a spherical shape, and thus has a high electron-accepting property although π-electron conjugation widely spread therein. The high electron-accepting property efficiently causes rapid charge separation and is useful for the light-receiving device. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-phenyl-$C_{71}$-butyric acid methyl ester (abbreviation: PC71BM), [6,6]-phenyl-$C_{61}$-butyric acid methyl ester (abbreviation: PC61BM), and 1',1'',4',4''-tetrahydro-di[1,4]methanonaphthaleno[1,2:2',3',56,60:2'',3''][5,6]fullerene-$C_{60}$ (abbreviation: ICBA).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of the same kind, which have molecular orbital energy levels close to each other, can improve a carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the light-receiving device may further include a layer containing any of a substance with a high hole-transport property, a substance with a high electron-transport property, a substance with a bipolar property (a substance with a high electron-transport property and a high hole-transport property), and the like. Without limitation to the above, the light-receiving device may further include a layer containing a substance with a high hole-injection property, a hole-blocking material, a material with a high electron-injection property, an electron-blocking material, or the like.

Either a low molecular compound or a high molecular compound can be used in the light-receiving device, and an inorganic compound may also be included. Each layer included in the light-receiving device can be formed by an evaporation method (including a vacuum evaporation method), a transfer method, a printing method, an inkjet method, a coating method, or the like.

As the hole-transport material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material, an inorganic compound such as zinc oxide (ZnO) can be used.

For the active layer, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to extend the wavelength range. The third material may be a low molecular compound or a high molecular compound.

The above is the description of the light-receiving device.

Figure 21E:
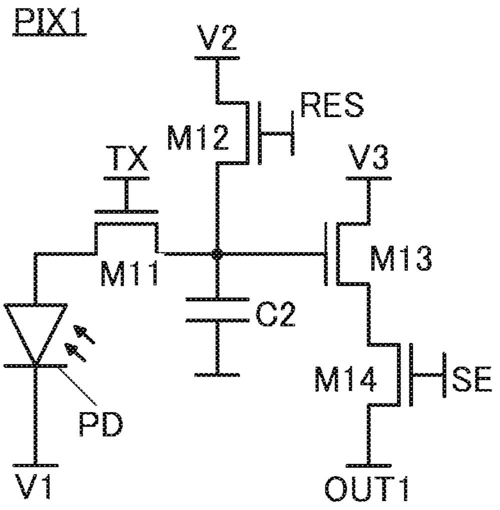
FIG. 21E and FIG. 21F are diagrams showing examples of pixel circuits of a display apparatus.
Figure 21F:
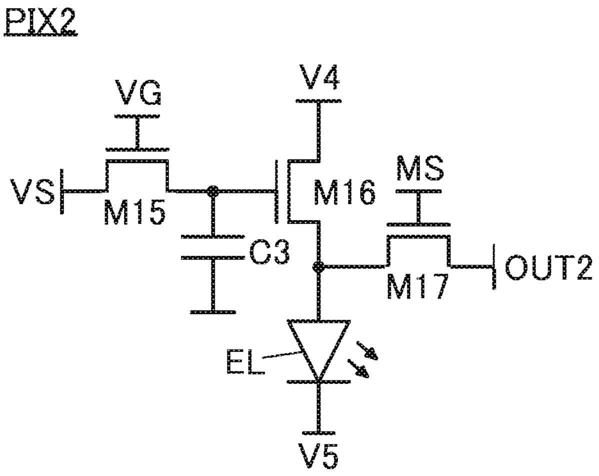

FIG. 21E shows an example of a pixel circuit of a subpixel including a light-receiving device, and FIG. 21F shows an example of a pixel circuit of a subpixel including a light-emitting device.

A pixel circuit PIX1 shown in FIG. 21E includes a light-receiving device PD, a transistor M11, a transistor M12, a transistor M13, a transistor M14, and a capacitor C2. Here, an example where a photodiode is used as the light-receiving device PD is illustrated.

A cathode of the light-receiving device PD is electrically connected to a wiring V1, and an anode thereof is electrically connected to one of a source and a drain of the transistor M11. A gate of the transistor M11 is electrically connected to a wiring TX, and the other of the source and the drain thereof is electrically connected to one electrode of the capacitor C2, one of a source and a drain of the transistor M12, and a gate of the transistor M13. A gate of the transistor M12 is electrically connected to a wiring RES, and the other of the source and the drain thereof is electrically connected to a wiring V2. One of a source and a drain of the transistor M13 is electrically connected to a wiring V3, and the other of the source and the drain thereof is electrically connected to one of a source and a drain of the transistor M14. Agate of the transistor M14 is electrically connected to a wiring SE, and the other of the source and the drain thereof is electrically connected to a wiring OUT1.

A constant potential is supplied to the wiring V1, the wiring V2, and the wiring V3. When the light-receiving device PD is driven with a reverse bias, a potential lower than the potential of the wiring V1 is supplied to the wiring V2. The transistor M12 is controlled by a signal supplied to the wiring RES and has a function of resetting the potential of a node connected to the gate of the transistor M13 to a potential supplied to the wiring V2. The transistor M11 is controlled by a signal supplied to the wiring TX and has a function of controlling the timing at which the potential of the node changes, in accordance with current flowing through the light-receiving device PD. The transistor M13 functions as an amplifier transistor for performing output in response to the potential of the node. The transistor M14 is controlled by a signal supplied to the wiring SE and functions as a selection transistor for reading an output corresponding to the potential of the node by an external circuit connected to the wiring OUT1.

A pixel circuit PIX2 shown in FIG. 21F includes a light-emitting device EL, a transistor M15, a transistor M16, a transistor M17, and a capacitor C3. Here, an example where a light-emitting diode is used as the light-emitting device EL is illustrated. In particular, an organic EL element is preferably used as the light-emitting device EL.

A gate of the transistor M15 is electrically connected to a wiring VG, one of a source and a drain thereof is electrically connected to a wiring VS, and the other of the source and the drain thereof is electrically connected to one electrode of the capacitor C3 and a gate of the transistor M16. One of a source and a drain of the transistor M16 is electrically connected to a wiring V4, and the other of the source and the drain thereof is electrically connected to an anode of the light-emitting device EL and one of a source and a drain of the transistor M17. A gate of the transistor M17 is electrically connected to a wiring MS, and the other of the source and the drain thereof is electrically connected to a wiring OUT2. A cathode of the light-emitting device EL is electrically connected to a wiring V5.

A constant potential is supplied to the wiring V4 and the wiring V5. In the light-emitting device EL, the anode side can have a high potential and the cathode side can have a lower potential than the anode side. The transistor M15 is controlled by a signal supplied to the wiring VG and functions as a selection transistor for controlling a selection state of the pixel circuit PIX2. The transistor M16 functions as a driving transistor that controls current flowing through the light-emitting device EL, in accordance with a potential supplied to the gate. When the transistor M15 is in a conduction state, a potential supplied to the wiring VS is supplied to the gate of the transistor M16, and the emission luminance of the light-emitting device EL can be controlled in accordance with the potential. The transistor M17 is controlled by a signal supplied to the wiring MS and has a function of outputting a potential between the transistor M16 and the light-emitting device EL to the outside through the wiring OUT2.

Note that in a display panel of this embodiment, the light-emitting element may be made to emit light in a pulsed manner so as to display an image. A reduction in the driving time of the light-emitting element can reduce power consumption of the display panel and inhibit heat generation of the display panel. An organic EL element is particularly preferable because of its favorable frequency characteristics. The frequency can be higher than or equal to 1 kHz and lower than or equal to 100 MHz, for example.

A transistor using a metal oxide (an oxide semiconductor) in a semiconductor layer where a channel is formed is preferably used as the transistor M11, the transistor M12, the transistor M13, and the transistor M14 included in the pixel circuit PIX1 and the transistor M15, the transistor M16, and the transistor M17 included in the pixel circuit PIX2.

A transistor using a metal oxide having a wider band gap and a lower carrier density than silicon can achieve an extremely low off-state current. Thus, such a low off-state current enables long-term retention of electric charge accumulated in a capacitor that is connected in series with the transistor. Therefore, it is particularly preferable to use a transistor using an oxide semiconductor as the transistor M11, the transistor M12, and the transistor M15 each of which is connected in series with the capacitor C2 or the capacitor C3. Moreover, the use of transistors using an oxide semiconductor as the other transistors can reduce the fabrication cost.

Alternatively, transistors using silicon as a semiconductor where a channel is formed can be used as the transistor M11 to the transistor M17. In particular, the use of silicon with high crystallinity, such as single crystal silicon and polycrystalline silicon, is preferable because high field-effect mobility is achieved and a higher-speed operation is possible.

Alternatively, a transistor using an oxide semiconductor may be used as one or more of the transistor M11 to the transistor M17, and transistors using silicon may be used as the other transistors.

Although n-channel transistors are shown as the transistors in FIG. 21E and FIG. 21F, p-channel transistors can also be used.

The transistors included in the pixel circuit PIX1 and the transistors included in the pixel circuit PIX2 are preferably formed to be arranged over the same substrate. It is particularly preferable that the transistors included in the pixel circuit PIX1 and the transistors included in the pixel circuit PIX2 be periodically arranged in one region.

One or more layers including one or both of the transistor and the capacitor are preferably provided at a position overlapping with the light-receiving device PD or the light-emitting device EL. Thus, the effective area of each pixel circuit can be reduced, and a high-resolution light-receiving portion or display portion can be achieved.

As described above, one pixel includes two kinds of light-receiving devices in the display apparatus of this embodiment, whereby the display apparatus can have two additional functions as well as a display function, enabling a multifunctional display apparatus. For example, a high-resolution image capturing function and a sensing function of a touch sensor, a near touch sensor, or the like can be achieved. Furthermore, when a pixel including two kinds of light-receiving devices and a pixel having another structure are combined, the display apparatus can have more functions. For example, a pixel including a light-emitting device that emits infrared light, any of a variety of sensor devices, or the like can be used.

Embodiment 5

In this embodiment, a metal oxide (also referred to as an oxide semiconductor) that can be used in the OS transistor described in the above embodiment is described.

The metal oxide used in the OS transistor preferably contains at least indium or zinc, and further preferably contains indium and zinc. The metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. Specifically, M is preferably one or more kinds selected from gallium, aluminum, yttrium, and tin, and further preferably M is gallium.

The metal oxide can be formed by a sputtering method, a chemical vapor deposition (CVD) method such as a metal organic chemical vapor deposition (MOCVD) method, an atomic layer deposition (ALD) method, or the like.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structure>

Amorphous (including a completely amorphous structure), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method. The XRD spectrum obtained by GIXD measurement may be hereinafter simply referred to as an XRD spectrum.

For example, the XRD spectrum of the quartz glass substrate shows a peak with a substantially bilaterally symmetrical shape. On the other hand, the peak of the XRD spectrum of the In—Ga—Zn oxide film having a crystal structure has a bilaterally asymmetrical shape. The bilaterally asymmetrical peak of the XRD spectrum clearly shows the existence of crystals in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the In—Ga—Zn oxide film deposited at room temperature. Thus, it is suggested that the In—Ga—Zn oxide deposited at room temperature is in an intermediate state, which is neither a single crystal nor polycrystal nor an amorphous state, and it cannot be concluded that In—Ga—Zn oxide film is in an amorphous state.

<<Structure of Oxide Semiconductor>>

Note that oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductors include the above-described CAAC-OS and nc-OS. Other examples of the non-single-crystal oxide semiconductors include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor having a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In—Ga—Zn oxide, the CAAC-OS tends to have a layered crystal structure (also referred to as a layered structure) in which a layer containing indium (In) and oxygen (hereinafter, an In layer) and a layer containing gallium (Ga), zinc (Zn), and oxygen (hereinafter, a (Ga,Zn) layer) are stacked. Indium and gallium can be replaced with each other. Therefore, indium may be contained in the (Ga,Zn) layer. In addition, gallium may be contained in the In layer. Note that zinc may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor having small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of flexibility of the manufacturing process.

[nc-OS]

In the nc-OS, a microscopic region (e.g., a region with a size greater than or equal to 1 nm and less than or equal to 10 nm, specifically, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter greater than the diameter of a nanocrystal (e.g., greater than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or less than the diameter of a nanocrystal (e.g., greater than or equal to 1 nm and less than or equal to 30 nm).

[A-Like OS]

The a-like OS is an oxide semiconductor having a structure between those of the nc-OS and the amorphous oxide semiconductor. The a-like OS has a void or a low-density region. That is, the a-like OS has low crystallinity as compared with the nc-OS and the CAAC-OS. Moreover, the a-like OS has a higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements included in a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof and these regions are randomly present to form a mosaic pattern. Thus, it is suggested that the CAC-OS has a structure in which metal elements are unevenly distributed.

The CAC-OS can be formed by a sputtering method under a condition where intentional heating is not performed on a substrate, for example. Moreover, in the case of forming the CAC-OS by a sputtering method, any one or more selected from an inert gas (typically, argon), an oxygen gas, and a nitrogen gas are used for a deposition gas. The proportion of the flow rate of an oxygen gas in the total flow rate of the deposition gas during deposition is preferably as low as possible. For example, the proportion of the flow rate of an oxygen gas in the total flow rate of the deposition gas is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

On the other hand, the second region has a higher insulating property than the first region. In other words, when the second regions are distributed in a metal oxide, a leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

A transistor using the CAC-OS has high reliability. Thus, the CAC-OS is the most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{3}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon. Note that impurities in an oxide semiconductor refer to, for example, elements other than the main components of an oxide semiconductor. For example, an element with a concentration lower than 0.1 atomic % can be regarded as an impurity.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is obtained by SIMS, is lower than or equal to $1\times10^{18}$ atoms/$cm^3$, preferably lower than or equal to $2\times10^{16}$ atoms/$cm^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 6

In this embodiment, an electronic device, digital signage, a vehicle, and the like each including a display apparatus of one embodiment of the present invention are described.

The display apparatus of one embodiment of the present invention is a display apparatus capable of display in which an image is superimposed on a background, i.e., see-through display. Furthermore, the display apparatus has high luminance, high definition, and a high contrast, is capable of high-resolution display, consumes low power, and has high reliability.

Examples of the display apparatus of one embodiment of the present invention include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The display apparatus of one embodiment of the present invention can have high resolution, and thus can be suitably used for an electronic device having a relatively small display portion. As such an electronic device, a watch-type or bracelet-type information terminal device (wearable device); and a wearable device worn on a head, such as a device for VR such as a head mounted display and a glasses-type device for AR can be given, for example. Examples of wearable devices include a device for SR (Substitutional Reality) and a device for MR (Mixed Reality).

The display apparatus of this embodiment or an electronic device that is provided with the display apparatus can be incorporated along a curved surface of an inside wall or an outside wall of a house or a building or the interior or the exterior of a car.

In particular, since the display apparatus of one embodiment of the present invention is capable of see-through display, the display apparatus can be provided on a transparent structure such as window glass, a showcase, a glass door, or a window display, or the display apparatus can replace the above-described structures.

Figure 22A:
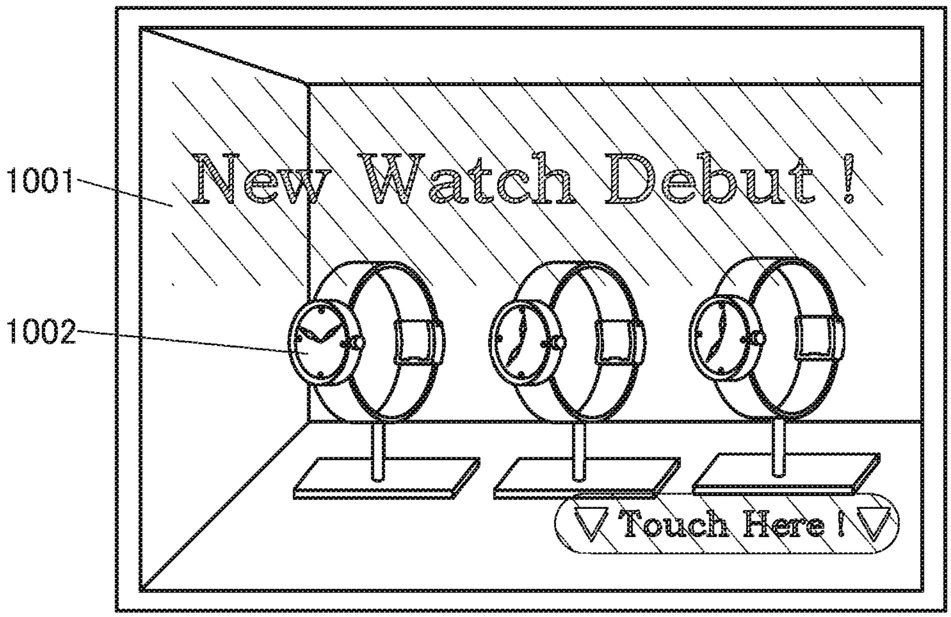
FIG. 22A and FIG. 22B are diagrams illustrating application examples of a display apparatus.

FIG. 22A illustrates an example in which the display apparatus of one embodiment of the present invention is used for a showcase of a product. FIG. 22A illustrates a display portion 1001 that functions as a window display that is capable of displaying an image. The display apparatus of one embodiment of the present invention is used in the display portion 1001. There is a space behind the display portion 1001 and products 1002 (here, wristwatches) are displayed. A customer can see the products 1002 through the display portion 1001.

A still image or a video can be displayed on the display portion 1001. In addition, a speaker that outputs sound may be provided. In FIG. 22A, an image including the letters "New Watch Debut!" is displayed as an advertising slogan for a new product.

It is preferable that the display portion 1001 function as a touch panel or a contactless touch panel. A customer can operate the display portion 1001 so that detailed information of the product 1002, product line-ups, related information, and the like can be displayed on the display portion 1001. By touching the portion displaying "Touch Here!" in FIG. 22A, a product introduction video can be displayed with sound, for example.

Furthermore, a customer can access a website for purchasing a product by reading a two-dimensional code that is displayed on the display portion 1001 with his or her smartphone or the like. In this manner, a customer can purchase a product with simple operation.

Glass that is not easily broken such as tempered glass or bulletproof glass is preferably used for the display portion 1001. Alternatively, the display apparatus may be attached to the glass. This can prevent the products 1002 from being stolen.

Figure 22B:
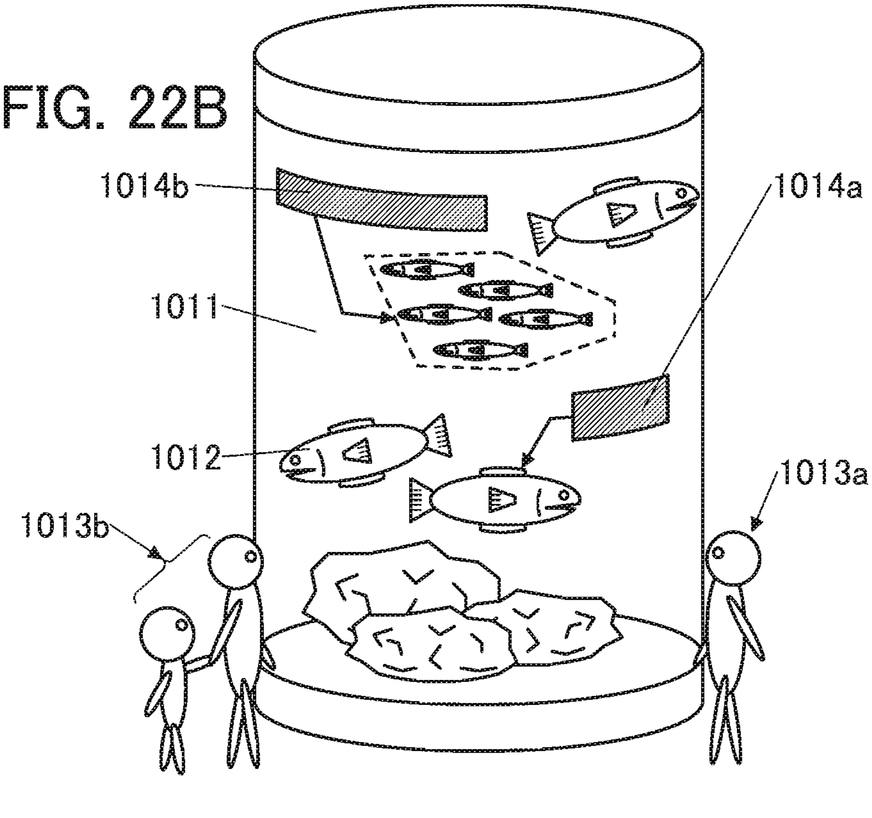

FIG. 22B is an example in which the display apparatus of one embodiment of the present invention is used for an aquarium. The aquarium illustrated in FIG. 22B includes a cylindrical display portion 1011 that is capable of displaying an image. The display apparatus of one embodiment of the present invention is used in the display portion 1011. A space behind the display portion 1011 is the aquarium and a customer 1013*a*, customers 1013*b*, and the like can see a fish 1012 through the display portion 1011.

For example, the display portion 1011 can display information related to a fish a customer is watching. FIG. 22B illustrates an example in which information 1014*a* for the customer 1013*a* and information 1014*b* for the customers 1013*b* are displayed.

The structure illustrated in FIG. 22B detects the standing position, the height of the eyes, the direction of the line of sight, and the like of the customer 1013*a* and the customers 1013*b* and can control the position of the information displayed on the display portion 1011 on the basis of the detected information. Thus, an image can be displayed in an optimal position that suits the positional relationship between the line of sight of the customer and the fish behind the display portion 1011.

It is preferable that the display portion 1011 have a function of a touch panel or a contactless touch panel. Application software for a smartphone can also be used to operate an image displayed on the display portion 1011 of the aquarium. Information displayed on the display portion 1011 can be operated by operating the display portion 1011 by touch operation, operation by a smartphone, or the like. Ordering, reserving, placing on hold, or the like for a product from a souvenir store of a facility can be requested from the display portion 1011. Furthermore, reserving a seat, ordering, ordering take-out products, requesting a gift on back order, or the like for a restaurant of a facility is also possible.

Figure 23:
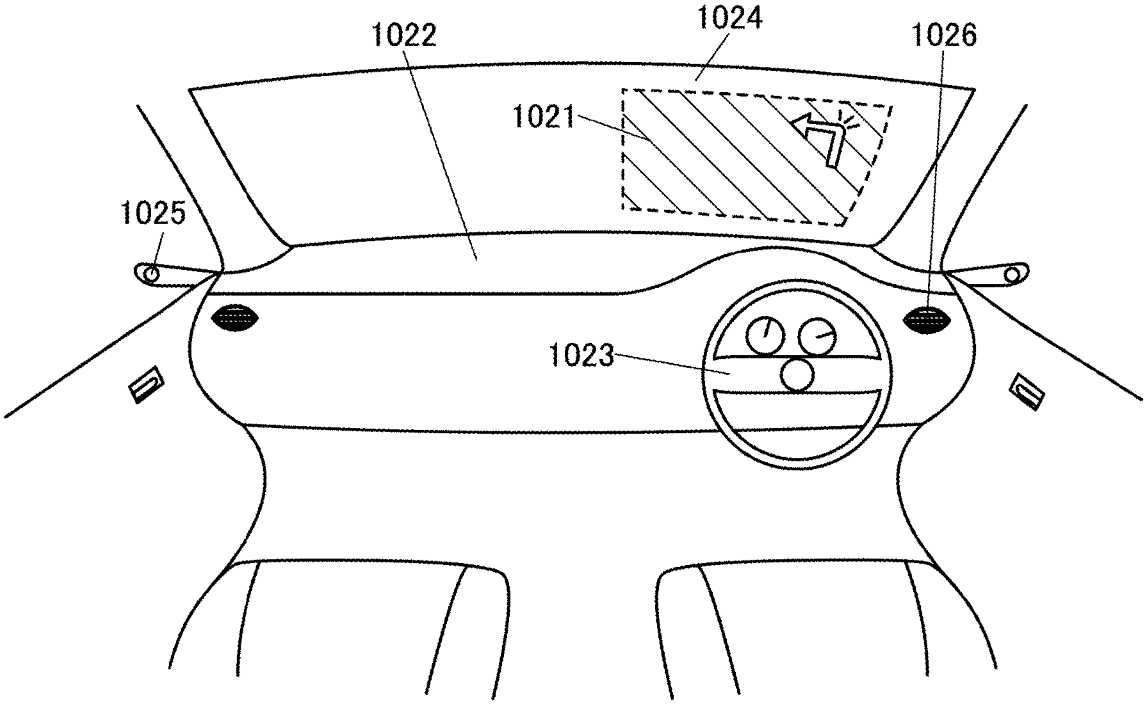
FIG. 23 is a diagram illustrating an application example of a display apparatus.

FIG. 23 illustrates a structure example of a vehicle equipped with a display portion 1021. The display apparatus of one embodiment of the present invention is used in the display portion 1021. Note that although in the example illustrated in FIG. 23, the display portion 1021 is installed in, but not limited to, a right-hand drive vehicle; installation in a left-hand drive vehicle is also possible. In that case, the left and right of the components arranged in FIG. 23 are reversed.

FIG. 23 illustrates a dashboard 1022, a steering wheel 1023, a windshield 1024, and the like that are arranged around a driver's seat and a front passenger seat. An air outlet 1026 is provided in the dashboard 1022.

The display portion 1021 is provided on the side of the windshield 1024 that faces the driver's seat. The driver can drive while seeing the outside view from the window through the display portion 1021.

The display portion 1021 can display a variety of information related to driving. For example, map information, navigation information, the weather, the temperature, the air pressure, and an image of an in-vehicle camera can be given. In the case of an autonomous car, the driver does not necessarily have to drive, and thus a variety of images that are not related to driving such as image contents can also be displayed.

In addition, a plurality of cameras 1025 that take pictures of the situations at the rear side may be provided outside the vehicle. Although the camera 1025 is provided instead of a side mirror in the example in FIG. 23, both the side mirror and the camera may be provided.

As the camera 1025, a CCD camera, a CMOS camera, and the like can be used. In addition, an infrared camera may be used in combination with such a camera. The infrared camera, which has a higher output level with a higher temperature of an object, can detect or extract a living body such as a human or an animal.

An image captured with the camera 1025 can be output to the display portion 1021. This display portion 1021 is mainly used for supporting driving of the vehicle. An image of the situation on the rear side is taken at a wide angle of view by the camera 1025, and the image is displayed on the display portion 1021 so that the driver can see a blind area for avoiding an accident.

The display portion 1021 preferably includes an authentication means. For example, when the driver touches the display portion 1021, the vehicle can perform biometric authentication such as fingerprint authentication or palm print authentication. The vehicle may have a function of setting an environment to meet the driver's preference when the driver is authenticated by biometric authentication. For example, one or more of adjustment of the position of the seat, adjustment of the position of the handle, adjustment of the position of the camera 1025, setting of brightness, setting of an air conditioner, setting of the speed (frequency) of wipers, volume setting of audio, and reading of the playlist of the audio are preferably performed after authentication. Note that the steering wheel 1023 may include an authentication means instead of the display portion 1021.

Alternatively, a car can be brought into a state where the car can be driven, e.g., a state where an engine is started or a state where an electric car can be started after the driver is authenticated by biometric authentication. This is preferable because a key, which is conventionally necessary, is unnecessary.

At least part of this embodiment can be implemented in combination with the other embodiments described in this specification as appropriate.

REFERENCE NUMERALS

10: display apparatus, 11: substrate, 20B: light, 20G: light, 20R: light, 20*t*: light, 21: substrate, 22: display region, 30: pixel, 30*s*: light-blocking region, 30*t*: transmission region, 31: substrate, 40: transmission region, 41*a*: pixel circuit, 41*b*: pixel circuit, 42*a*: pixel circuit, 42*b*: pixel circuit, 43*a*: pixel circuit, 43*b*: pixel circuit, 45: functional layer, 50: subpixel, 50*a*: subpixel, 51: wiring, 51*a*: wiring, 51*b*: wiring, 52: wiring, 52*a*: wiring, 52*b*: wiring, 52*c*: wiring, 52*d*: wiring, 53: wiring, 53*a*: wiring, 53*b*: wiring, 53*c*: wiring, 55: semiconductor layer, 56: conductive layer, 57: conductive layer, 58: conductive layer, 59: wiring, 60: display element, 60BM: PC, 61: transistor, 61*a*: transistor, 61*b*: transistor, 61*c*: transistor, 61*d*: transistor, 62: transistor, 62*a*: transistor, 63: capacitor, 64: pixel electrode, 70: pixel unit, 70*a*: pixel, 70*b*: pixel, 70BM: PC, 71*a*: subpixel, 71*b*: subpixel, 72*a*: subpixel, 72*b*: subpixel, 73*a*: subpixel, 73*b*: subpixel, 81: insulating layer, 84: insulating layer, 89: adhesive layer, 90: light-emitting element, 90B: light-emitting element, 90G: light-emitting element, 90R: light-emitting element, 90W: light-emitting element, 91: conductive layer, 91B1: pixel electrode, 91B2: pixel electrode, 91G1: pixel electrode, 91G2: pixel electrode, 91R1: pixel electrode, 91R2: pixel electrode, 91*t*: conductive layer, 92B: organic layer, 92G: organic layer, 92R: organic layer, 93: conductive layer, 100: display apparatus, 111: pixel electrode, 111C: connection electrode, 112B: organic layer, 112G: organic layer, 112R: organic layer, 113: common electrode, 114: organic layer, 121: protective layer, 122: protective layer, 125: insulating layer, 126: resin layer, 130: connection portion, 131: insulating layer

The invention claimed is:

1. A display apparatus comprising:

a first region comprising a first light-emitting element, a second region comprising a second light-emitting element, and a third region transmitting external light;

a first insulating layer provided continuously across the first region, the second region, and the third region;

a second insulating layer; and a third insulating layer, wherein the first light-emitting element comprises a first pixel electrode, a first organic layer, and a common electrode, wherein the second light-emitting element comprises a second pixel electrode, a second organic layer, and the common electrode, wherein the first pixel electrode and the second pixel electrode are arranged side by side, wherein the first organic layer is over the first pixel electrode, wherein the second organic layer is over the second pixel electrode, wherein in each of the first organic layer and the second organic layer, an angle between a bottom surface and a side surface is greater than or equal to 60° and less than or equal to 120° in a cross sectional view, wherein the first insulating layer comprises a portion overlapping with the first organic layer with the common electrode therebetween, a portion overlapping with the second organic layer with the common electrode therebetween, and a portion in the third region, wherein the first insulating layer has a light-transmitting property, wherein the second insulating layer comprises an organic resin, wherein the second insulating layer comprises a first portion between the first light-emitting element and the second light-emitting element, wherein the first organic layer and the second organic layer face each other with the first portion of the second insulating layer therebetween, wherein the second insulating layer comprises a second portion overlapping with the third region, wherein the third insulating layer comprises an inorganic insulating film, wherein the third insulating layer comprises a third portion between the first light-emitting element and the second light-emitting element, wherein the third insulating layer is along a side surface and a bottom surface of the second insulating layer, and wherein each of a side surface of the first organic layer and a side surface of the second organic layer is in contact with the third insulating layer.

2. The display apparatus according to claim 1, wherein the first organic layer and the second organic layer comprise different light-emitting compounds.

3. The display apparatus according to claim 1,
wherein the first organic layer and the second organic layer comprise a same light-emitting compound, and
wherein a coloring layer or a color conversion layer is at a position overlapping with the first light-emitting element.

4. The display apparatus according to claim 1,
wherein the common electrode has a light-transmitting property, and
wherein the common electrode comprises a portion in the third region.

5. The display apparatus according to claim 1,
wherein the common electrode has a light-transmitting property.

6. The display apparatus according to claim 1,
wherein each of a side surface of the first pixel electrode and a side surface of the second pixel electrode is in contact with the third insulating layer.

7. The display apparatus according to claim 1,
wherein the first portion of the second insulating layer comprises a portion having a convex top surface.

8. The display apparatus according to claim 1,
wherein the first portion of the second insulating layer comprises a portion having a concave top surface.

9. A display apparatus comprising:
a first region comprising a first light-emitting element, a second region comprising a second light-emitting element, and a third region transmitting external light;
a first insulating layer provided continuously across the first region, the second region, and the third region;
a second insulating layer; and
a third insulating layer,
wherein the first light-emitting element comprises a first pixel electrode, a first organic layer, and a common electrode,
wherein the second light-emitting element comprises a second pixel electrode, a second organic layer, and the common electrode,
wherein the first pixel electrode and the second pixel electrode are arranged side by side,
wherein the first organic layer is over the first pixel electrode,
wherein the second organic layer is over the second pixel electrode,
wherein in each of the first organic layer and the second organic layer, an angle between a bottom surface and a side surface is greater than or equal to 60° and less than or equal to 120° in a cross sectional view,
wherein the first insulating layer comprises a portion overlapping with the first organic layer with the common electrode therebetween, a portion overlapping with the second organic layer with the common electrode therebetween, and a portion in the third region,
wherein the first insulating layer has a light-transmitting property,
wherein the second insulating layer comprises an organic resin,
wherein the second insulating layer comprises a first portion between the first light-emitting element and the second light-emitting element,
wherein the first organic layer and the second organic layer face each other with the first portion of the second insulating layer therebetween,
wherein the second insulating layer comprises an opening in a portion overlapping with the third region,
wherein the third insulating layer comprises an inorganic insulating film,
wherein the third insulating layer comprises a second portion between the first light-emitting element and the second light-emitting element,
wherein the third insulating layer is along a side surface and a bottom surface of the second insulating layer, and
wherein each of a side surface of the first organic layer and a side surface of the second organic layer is in contact with the third insulating layer.

10. The display apparatus according to claim 9,
wherein the first organic layer and the second organic layer comprise different light-emitting compounds.

11. The display apparatus according to claim 9,
wherein the first organic layer and the second organic layer comprise a same light-emitting compound, and
wherein a coloring layer or a color conversion layer is at a position overlapping with the first light-emitting element.

12. The display apparatus according to claim 9,
wherein the common electrode has a light-transmitting property, and
wherein the common electrode comprises a portion in the third region.

13. The display apparatus according to claim 9,
wherein the common electrode comprises an opening overlapping with the third region.

14. The display apparatus according to claim 9,
wherein each of a side surface of the first pixel electrode and a side surface of the second pixel electrode is in contact with the third insulating layer.

15. The display apparatus according to claim 9,
wherein the first portion of the second insulating layer comprises a portion having a convex top surface.

16. The display apparatus according to claim 9,
wherein the first portion of the second insulating layer comprises a portion having a concave top surface.

* * * * *